US012155995B2

(12) United States Patent
Ko et al.

(10) Patent No.: US 12,155,995 B2
(45) Date of Patent: *Nov. 26, 2024

(54) VIBRATION DEVICE AND APPARATUS INCLUDING THE SAME

(71) Applicant: LG Display Co., Ltd., Seoul (KR)

(72) Inventors: Sungwook Ko, Paju-si (KR); Minji Kim, Paju-si (KR); SeungRyull Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/381,152

(22) Filed: Oct. 17, 2023

(65) Prior Publication Data

US 2024/0048916 A1 Feb. 8, 2024

Related U.S. Application Data

(63) Continuation of application No. 17/554,712, filed on Dec. 17, 2021, now Pat. No. 11,832,056.

(30) Foreign Application Priority Data

Dec. 22, 2020 (KR) .................. 10-2020-0181106

(51) Int. Cl.
 *H04R 17/00* (2006.01)
 *H10N 30/85* (2023.01)
(52) U.S. Cl.
 CPC .......... *H04R 17/00* (2013.01); *H10N 30/852* (2023.02); *H04R 2499/13* (2013.01); *H04R 2499/15* (2013.01)

(58) Field of Classification Search
 CPC .................. H04R 17/00; H10N 30/852
 See application file for complete search history.

(56) References Cited

U.S. PATENT DOCUMENTS

| | | |
|---|---|---|
| 9,070,898 B2 | 6/2015 | Kim |
| 9,985,195 B2 | 5/2018 | Mori |
| 10,442,960 B2 | 10/2019 | Bae et al. |
| 10,959,025 B2 | 3/2021 | Lee et al. |
| 11,882,398 B2 * | 1/2024 | Ham ................ H04R 3/00 |

(Continued)

FOREIGN PATENT DOCUMENTS

| | | |
|---|---|---|
| CN | 103999480 A | 8/2014 |
| CN | 104751743 A | 7/2015 |

(Continued)

OTHER PUBLICATIONS

Office Action dated Mar. 29, 2024 issued in corresponding Chinese Patent Application No. 202111560824.0. (Note: US 2020/0059733 A1 was previously cited).

(Continued)

*Primary Examiner* — Olisa Anwah
(74) *Attorney, Agent, or Firm* — Morgan, Lewis & Bockius LLP

(57) ABSTRACT

A disclosed vibration device comprises a first vibration generator and a first connection member disposed on a first surface of the first vibration generator. The first vibration generator may comprise a first vibration part including a plurality of inorganic material portions having a piezoelectric characteristic and an organic material portion between the plurality of inorganic material portions.

51 Claims, 22 Drawing Sheets

(56) References Cited

U.S. PATENT DOCUMENTS

| | | |
|---|---|---|
| 12,015,897 B2 * | 6/2024 | Kim .................. H04R 1/028 |
| 2011/0227661 A1 | 9/2011 | Numata et al. |
| 2013/0167881 A1 * | 7/2013 | Korbler .............. H10N 30/092 |
| | | 29/25.35 |
| 2014/0079926 A1 | 3/2014 | Jeon et al. |
| 2014/0140551 A1 | 5/2014 | Ramstein |
| 2014/0182966 A1 | 7/2014 | Fisk et al. |
| 2014/0355792 A1 | 12/2014 | Nabata et al. |
| 2015/0139456 A1 | 5/2015 | Okamura et al. |
| 2015/0185963 A1 | 7/2015 | Lee et al. |
| 2015/0284595 A1 | 10/2015 | Yoo et al. |
| 2016/0305832 A1 | 10/2016 | Kawamura et al. |
| 2019/0141424 A1 | 5/2019 | Kim et al. |
| 2019/0182572 A1 | 6/2019 | Kim |
| 2019/0208299 A1 | 7/2019 | Kim et al. |
| 2019/0255805 A1 * | 8/2019 | Han .................. B32B 27/065 |
| 2019/0324501 A1 | 10/2019 | Kim et al. |
| 2020/0059733 A1 | 2/2020 | Shin et al. |
| 2020/0154214 A1 | 5/2020 | Jang et al. |
| 2020/0233629 A1 * | 7/2020 | Yeon .................. G06F 1/1626 |
| 2020/0314515 A1 | 10/2020 | Jang et al. |
| 2020/0314556 A1 | 10/2020 | Lee et al. |
| 2021/0225961 A1 | 7/2021 | Sun et al. |
| 2021/0400395 A1 | 12/2021 | Miyoshi |
| 2022/0238787 A1 * | 7/2022 | Kagawa .............. H10N 30/883 |

FOREIGN PATENT DOCUMENTS

| | | |
|---|---|---|
| CN | 108859296 A | 11/2018 |
| CN | 109905801 A | 6/2019 |
| JP | 2020-167655 A | 10/2020 |
| JP | 7340001 B2 | 9/2023 |
| KR | 10-2014-0096996 A | 8/2014 |
| TW | 201139315 A | 11/2011 |
| WO | 2014/034250 A1 | 3/2014 |
| WO | 2017/089609 A2 | 6/2017 |
| WO | 2020/179353 A1 | 9/2020 |

OTHER PUBLICATIONS

Office Action from the Taiwan Advance Patent and Trademark Office dated May 9, 2022, in corresponding Taiwan Patent Application No. 110146931 (partial translation submitted in the parent application).

Office Action from the Japanese Patent Office dated Nov. 18, 2022, in counterpart Japanese Patent Application No. 2021-208267.

Office Action dated Sep. 10, 2024, issued in corresponding Japanese Patent Application No. 2023-116065. (Note: US 2020/0059733 A1 cited therein was cited in a prior IDS.).

\* cited by examiner

VIBRATION DEVICE AND APPARATUS INCLUDING THE SAME

CROSS-REFERENCE TO RELATED APPLICATIONS

This application is a continuation of co-pending U.S. patent application Ser. No. 17/554,712, filed on Dec. 17, 2021, which claims the benefit of and the priority to Korean Patent Application No. 10-2020-0181106 filed on Dec. 22, 2020. Each of the above prior U.S. and Korean patent applications is hereby incorporated by reference as if fully set forth herein.

BACKGROUND

1. Technical Field

The present disclosure relates to a vibration device and an apparatus including the same, and more particularly, to a vibration device having an enhanced vibration characteristic and an apparatus including the same.

2. Discussion of the Related Art

In display apparatuses, a display panel is provided to display an image, and a separate speaker is typically installed for providing a sound. In a case where a speaker is disposed in a display apparatus, the speaker occupies a space. Due to this, the design and spatial disposition of the display apparatus are limited.

Because a sound output from a speaker may travel in a rearward direction or a downward direction of a display apparatus, sound quality may be degraded due to interference between sounds reflected from a wall and the ground. For this reason, it may be difficult to transfer an accurate sound, and the immersion experience of a viewer or a user may be reduced.

SUMMARY

Therefore, the inventors have recognized problems described above and have performed various experiments for implementing a vibration device where the quality of a sound and a sound pressure level characteristic can be enhanced. Through the various experiments, the inventors have invented an apparatus having a new structure, which includes a vibration device where the quality of a sound is enhanced and a sound pressure level characteristic is enhanced.

Accordingly, embodiments of the present disclosure are directed to a vibration device and an apparatus including the same that substantially obviate one or more problems due to limitations and disadvantages of the related art.

An aspect of the present disclosure is directed to providing a vibration device having an enhanced sound pressure level characteristic and an apparatus including the same, which may vibrate a display panel to generate a sound.

Additional features and aspects will be set forth in part in the description that follows, and in part will become apparent from the description, or may be learned by practice of the inventive concepts provided herein. Other features and aspects of the inventive concepts may be realized and attained by the structure particularly pointed out in, or derivable from, the written description, the claims hereof, and the appended drawings.

To achieve these and other aspect of the inventive concepts, as embodied and broadly described herein, a vibration device comprises a first vibration generator and a first connection member disposed at a first surface of the first vibration generator, wherein the first vibration generator includes a first vibration part including a plurality of inorganic material portions having a piezoelectric characteristic and an organic material portion between the plurality of inorganic material portions.

In another aspect, a vibration device may comprise: a first vibration generator; and a first connection member disposed on a first surface of the first vibration generator, wherein the first vibration generator may comprise a first vibration part including a plurality of inorganic material portions having a piezoelectric characteristic and an organic material portion between the plurality of inorganic material portions.

In another aspect, an apparatus may comprise an above example vibration device and may further comprise a vibration object configured to be vibrated by the vibration device to generate sound.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION

Figure 1:
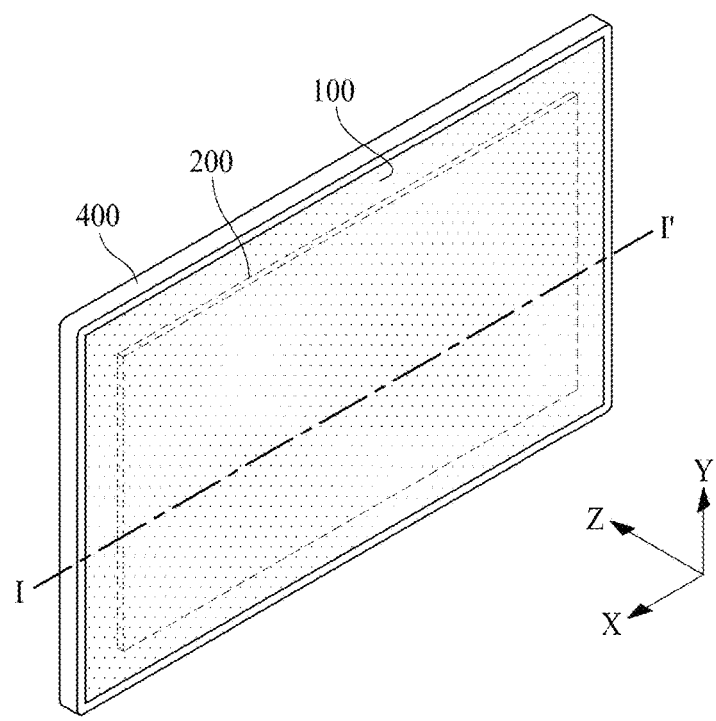
FIG. 1 illustrates a display apparatus according to an example embodiment of the present disclosure.

Reference will now be made in detail to embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

Throughout the drawings and the detailed description, unless otherwise described, the same drawing reference numerals should be understood to refer to the same elements, features, and structures. The relative size and depiction of these elements may be exaggerated for clarity, illustration, and convenience. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. The same or similar elements are designated by the same reference numerals throughout the specification unless otherwise specified.

In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

In describing a temporal relationship, when the temporal order is described as, for example, "after," "subsequent," "next," or "before," a case which is not continuous may be included unless a more limiting term, such as "just," "immediate(ly)," or "direct(ly)," is used.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

Where an element or layer is referred to as being "on" or "connected to" another element or layer, it should be understood to mean that the element or layer may be directly on or directly connected to the other element or layer, or that intervening elements or layers may be present. Also, where one element is referred to as being disposed "on" or "under" another element, it should be understood to mean that the elements may be so disposed to directly contact each other, or may be so disposed without directly contacting each other.

The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto, unless otherwise specified.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

In the present disclosure, examples of a display apparatus may include a narrow-sense display apparatus, such as an organic light emitting display (OLED) module or a liquid crystal module (LCM) including a display panel and a driver for driving the display panel. Also, examples of the display apparatus may include a set device (or a set apparatus) or a set electronic apparatus, such as a notebook, laptop, or portable computer, a television, a computer monitor, an equipment apparatus including an automotive apparatus or another type apparatus for vehicles, or a mobile electronic apparatus, such as a smartphone or an electronic pad, which is a complete product (or a final product) including an LCM or an OLED module.

Therefore, in the present disclosure, examples of the display apparatus may include a narrow-sense display apparatus itself, such as an LCM or an OLED module, and a set apparatus which is a final consumer apparatus or an application product including the LCM or the OLED module.

In some embodiments, an LCM or an OLED module including a display panel and a driver may be referred to as a narrow-sense display apparatus, and an electronic apparatus which is a final product including an LCM or an OLED module may be referred to as a set apparatus. For example, the narrow-sense display apparatus may include a display panel, such as an LCD panel or an OLED panel, and a source printed circuit board (PCB) which is a controller for driving the display panel. The set apparatus may further include a set PCB which is a set controller electrically connected to the source PCB to control overall operation of the set apparatus.

A display panel according to example embodiments of the present disclosure may include all types of display panels, such as a liquid crystal display (LCD) panel, an organic light emitting diode (OLED) display panel, and an electroluminescent display panel, which are configured to be vibrated by a sound generation apparatus to output sound. However, embodiments of the present disclosure are not limited to a specific type of display panel. Also, a display apparatus according to example embodiments of the present disclosure is not limited a particular shape or size of the display panel.

For example, if the display panel is a liquid crystal display panel, the display panel may include a plurality of gate lines, a plurality of data lines, and a plurality of pixels respectively provided in a plurality of pixel areas defined by intersections of the gate lines and the data lines. Also, the display panel may include an array substrate including a thin film transistor (TFT), which is a switching element for adjusting a light transmittance of each of the plurality of pixels, an upper substrate including a color filter and/or a black matrix, and a liquid crystal layer between the array substrate and the upper substrate.

Moreover, if the display panel is an organic light emitting display panel, the display panel may include a plurality of gate lines, a plurality of data lines, and a plurality of pixels respectively provided in a plurality of pixel areas defined by intersections of the gate lines and the data lines. Also, the display panel may include an array substrate including a TFT, which is an element for selectively applying a voltage to each of the pixels, an organic light emitting device layer on the array substrate, and an encapsulation layer or substrate disposed on the array substrate to cover the organic light emitting device layer. The encapsulation layer or substrate may protect the TFT and the organic light emitting device layer from an external impact and may prevent water or oxygen from penetrating into the organic light emitting device layer. Also, a layer provided on the array substrate may include an inorganic light emitting layer (for example, a nano-sized material layer, a quantum dot, or the like). As another example, the layer provided on the array substrate may include a micro light emitting diode.

The display panel may further include a backing such as a metal plate attached on the display panel. However, embodiments of the present disclosure are not limited to the metal plate, and the display panel may include another structure.

In the present disclosure, the display panel may be implemented in vehicles as a user interface module such as a central control panel for automobiles. For example, the display panel may be provided between occupants sitting in two front seats for sound generated by a vibration of the display panel to be transmitted within the cabin of a vehicle. Therefore, an audio experience in a vehicle may be improved in comparison with an arrangement where speakers are disposed on interior walls of the vehicle.

Hereinafter, example embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale in which each of elements is illustrated in the accompanying drawings may differ from an actual scale. Thus, the illustrated elements are not limited to the specific scale in which they are illustrated in the drawings.

Figure 2:
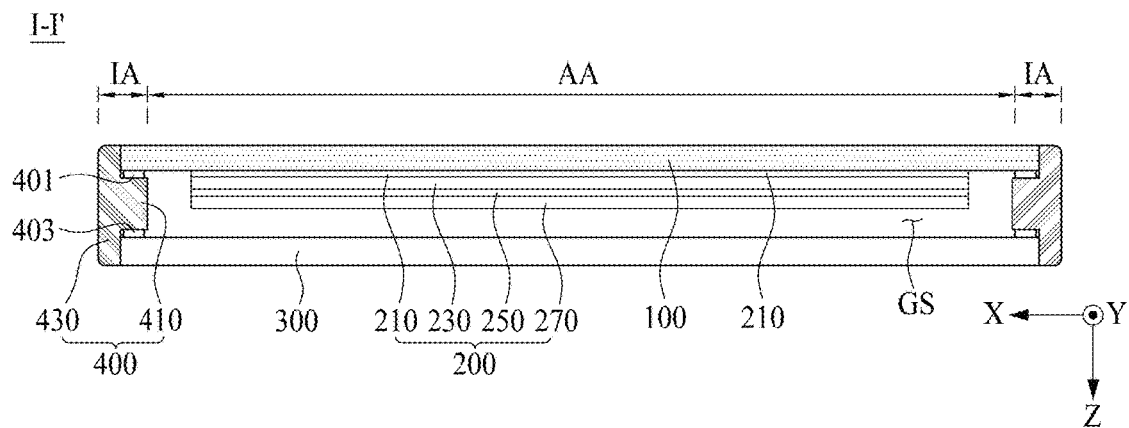
FIG. 2 is a cross-sectional view taken along line I-I' illustrated in FIG. 1.

FIG. 1 illustrates a display apparatus according to an example embodiment of the present disclosure. FIG. 2 is a cross-sectional view taken along line I-I' illustrated in FIG. 1.

As shown in FIGS. 1 and 2, the display apparatus according to an example embodiment of the present disclosure may include a display panel 100 and a vibration device 200 which is configured to vibrate the display panel 100 at a rear surface (or a back surface) of the display panel 100.

The display panel 100 may display an image (for example, an electronic image or a digital image, still image, video image). For example, the display panel 100 may output light to display an image. The display panel 100 may be a curved display panel or one of various types of display panels, such as a liquid crystal display panel, an organic light emitting display panel, a quantum dot light emitting display panel, a micro light emitting diode display panel, and an electrophoretic display panel. The display panel 100 may be a flexible display panel. For example, the display panel 100 may be a flexible light emitting display panel, a flexible electrophoretic display panel, a flexible electro-wetting display panel, a flexible light emitting diode display panel, or a flexible quantum dot light emitting display panel, but embodiments of the present disclosure are not limited thereto.

The display panel 100 according to an example embodiment of the present disclosure may include a display area AA configured to display an image based on driving of a plurality of pixels. The display panel 100 may include a non-display area IA which is at least partly adjacent or surrounds the display area AA, but embodiments of the present disclosure are not limited thereto.

The display panel 100 according to an example embodiment of the present disclosure may display an image in any of various different way and may, for example, be a top emission type, a bottom emission type, or a dual emission type. Thus, the display panel may have a structure of a pixel array layer which includes an anode electrode, a cathode electrode, and a light emitting device and includes a plurality of pixels. In the top emission type, light emitted from the pixel array layer may be irradiated onto a region in front of a base substrate to allow an image to be displayed. In the bottom emission type, the light emitted from the pixel array layer may be irradiated onto a rearward region behind the base substrate to allow an image to be displayed.

The display panel 100 according to an example embodiment of the present disclosure may include a pixel array part disposed on the display area of the substrate. The pixel array part may include a plurality of pixels configured to display an image based on a signal supplied through signal lines. The signal lines may include, without limitation, a gate line, a data line, and a pixel driving power line.

Each of the plurality of pixels may include a pixel circuit layer including a driving thin film transistor (TFT) provided at a pixel area which is configured by a plurality of gate lines and/or a plurality of data lines, an anode electrode electrically connected to the driving TFT, a light emitting device formed on the anode electrode, and a cathode electrode electrically connected to the light emitting device.

The driving TFT may be provided at a transistor region of each pixel area provided on a substrate. The driving TFT may include a gate electrode, a gate insulation layer, a semiconductor layer, a source electrode, and a drain electrode. The semiconductor layer of the driving TFT may include silicon, such as amorphous silicon (a-Si), polysilicon (poly-Si), or low temperature poly-Si, or may include oxide such as indium-gallium-zinc-oxide (IGZO), but embodiments of the present disclosure are not limited thereto.

The light emitting device according to an example embodiment of the present disclosure may include an organic light emitting device layer provided on the anode electrode. The organic light emitting device layer may be implemented so that pixels emit light of the same color (for example, white light) or emit lights of different colors (for example, red light, green light, and blue light). The cathode electrode (or a common electrode) may be connected to the organic light emitting device layer provided in each pixel area in common. For example, the organic light emitting device layer may include a single structure, which includes the same color for each pixel, or a stack structure which includes two or more structures. As another example, the organic light emitting device layer may include a stack structure which includes two or more structures including one or more different colors for each pixel. The two or more structures including one or more different colors may be configured with one or more of blue, red, yellow-green, and green or a combination thereof, but embodiments of the present disclosure are not limited thereto. For example, the combination may be blue and red, red and yellow-green, red and green, or red/yellow/green, but embodiments of the present disclosure are not limited thereto. Also, embodiments of the present disclosure may be applied regardless of a stack order of the stack structure. A stack structure including two or more structures having the same color or one or more different colors may further include a charge generating layer between two or more structures. The charge generating layer may have a PN junction structure and may include an N-type charge generating layer and a P-type charge generating layer.

According to another example embodiment of the present disclosure, the light emitting device may include a micro light emitting diode device which is electrically connected to each of the anode electrode and the cathode electrode. The micro light emitting diode device may be a light emitting diode implemented as an integrated circuit (IC) type or a chip type. The micro light emitting diode device may include a first terminal electrically connected to the anode electrode and a second terminal electrically connected to the cathode electrode. The cathode electrode may be connected to a second terminal of the micro light emitting diode device provided in each pixel area in common.

An encapsulation part may be formed on the substrate to surround the pixel array part and thus may prevent oxygen or water (or moisture) from penetrating into the light emitting device of the pixel array part. The encapsulation part according to an example embodiment of the present disclosure may be formed in a multi-layer structure where an organic material layer and an inorganic material layer are alternately stacked, but embodiments of the present disclosure are not limited thereto. The inorganic material layer may prevent oxygen or water (or moisture) from penetrating into the light emitting device of the pixel array part. The organic material layer may be formed to be relatively thicker than the inorganic material layer, so as to cover particles occurring in a manufacturing process, but embodiments of the present disclosure are not limited thereto. For example, the encapsulation part may include a first inorganic layer, an organic layer on the first inorganic layer, and a second inorganic layer on the organic layer. The organic layer may be a particle covering layer, but embodiments of the present disclosure are not limited thereto. A touch panel may be disposed on the encapsulation part, on a rear surface of the pixel array part, or in the pixel array part.

The display panel 100 according to an example embodiment of the present disclosure may include a first substrate, a second substrate, and a liquid crystal layer. The first substrate may be an upper substrate or a TFT (thin film transistor) array substrate. For example, the first substrate may include a pixel array (or a display part or a display area) including a plurality of pixels which are respectively provided at a plurality of pixel areas defined by intersections between a plurality of gate lines and/or a plurality of data lines. Each of the plurality of pixels may include a TFT connected to a gate line and/or a data line, a pixel electrode connected to the TFT, and a common electrode which is provided adjacent to the pixel electrode and is supplied with a common voltage.

The first substrate may further include a pad part provided at a first periphery (or a first non-display part) thereof and a gate driving circuit provided at a second periphery (or a second non-display part) thereof.

The pad part may transfer a signal, supplied from the outside, to the pixel array and/or the gate driving circuit. For example, the pad part may include a plurality of data pads connected to a plurality of data lines through a plurality of data link lines and a plurality of gate input pads connected to the gate driving circuit through a gate control signal line. For example, a size of the first substrate may be greater than that of the second substrate, but embodiments of the present disclosure are not limited thereto.

The gate driving circuit may be embedded (or integrated) into the second periphery of the first substrate and may be connected to the plurality of gate lines. For example, the gate driving circuit may be implemented with a shift register including a transistor, which may be formed through the same process as the TFT provided at the pixel area. According to another example embodiment, the gate driving circuit may be implemented as an IC and may be provided in a panel driving circuit, without being embedded into the upper substrate.

The second substrate may be a lower substrate or a color filter array substrate. For example, the second substrate may include a pixel, including an opening area overlapping the pixel area formed at the first substrate, and a color filter layer formed at the opening area. The second substrate may have a size which is smaller than that of the first substrate, but embodiments of the present disclosure are not limited thereto. For example, the second substrate may overlap a portion of the first substrate other than the first periphery. The second substrate may be bonded to a portion, other than the first periphery, of the first substrate with a liquid crystal layer therebetween using a sealant.

The liquid crystal layer may be disposed between the first substrate and the second substrate. The liquid crystal layer may include liquid crystal molecules whose alignment direction may be changed based on an electric field generated by the common voltage and a data voltage applied to a pixel electrode for each pixel.

A second polarization member may be attached on a lower surface of the second substrate and may polarize light which is incident from a backlight and travels to the liquid crystal layer. A first polarization member may be attached on a top surface (or an upper surface) of the first substrate and may polarize light which passes through the first substrate and is output to the outside.

The display panel 100 according to an example embodiment of the present disclosure may drive the liquid crystal layer based on the electric field which is generated in each pixel by the data voltage and the common voltage applied to each pixel. Thus, the display panel 100 may display an image based on light passing through the liquid crystal layer.

According to another example embodiment of the present disclosure, in the display panel 100, the first substrate may be implemented as the color filter array substrate, and the second substrate may be implemented as the TFT array substrate. For example, the display panel 100 according to another example embodiment of the present disclosure may have a type where the display panel 100 according to an embodiment of the present disclosure is reversed. In this case, a pad part of the display panel 100 according to another example embodiment of the present disclosure may be covered by a separate mechanism.

The display panel 100 according to another example embodiment may include a bending portion which is bent or curved to have a curved shape or a certain curvature radius.

The bending portion of the display panel 100 may be provided at at least one of two peripheries of the display panel 100 which are parallel to each other. One periphery and/or the other periphery, where the bending portion is provided, of the display panel 100 may include only the non-display area IA, or may include a periphery of the display area AA and the non-display area IA. Here, the display panel 100 including the bending portion provided by bending of the non-display area IA may have a one-side bezel bending structure or a both-side bezel bending structure. Also, the display panel 100 including the periphery of the display area AA and the bending portion provided by bending of the non-display area IA may have a one-side active bending structure or a both-side active bending structure.

The vibration device 200 may vibrate the display panel 100 at a rear surface of the display panel 100 to provide a user with a sound and/or a haptic feedback on the basis of a vibration of the display panel 100. The vibration device 200 may be implemented at the rear surface of the display panel 100 to directly vibrate the display panel 100. Rear surface may be the surface of the display panel opposite to the surface which displays the image. The vibration device 200 might be invisible to the user.

The vibration device 200 may vibrate based on a voice signal applied to the vibration device 200. The voice signal may be synchronized with an image displayed by the display panel 100 to vibrate the display panel 100. As another example, the vibration device 200 may vibrate based on a haptic feedback signal (or a tactile feedback signal) or any other signal of the display device to inform the user. The haptic feedback signal may be synchronized with a user touch applied to a touch panel (or a touch sensor layer) disposed in or embedded into the display panel 100 to vibrate the display panel 100. Accordingly, the display panel 100 may vibrate based on a vibration of the vibration device 200 to provide a user (or a viewer) with at least one of a sound and a haptic feedback.

The vibration device 200 according to an example embodiment of the present disclosure may be implemented to have a size corresponding to the display area AA of the display panel 100. A size of the vibration device 200 may be 0.9 to 1.1 times a size of the display area AA, but embodiments of the present disclosure are not limited thereto. For example, a size of the vibration device 200 may be less than or equal to that of the display area AA of the display panel 100. For example, a size of the vibration device 200 may be the same as or approximately equal to that of the display area AA of the display panel 100, and thus, the vibration device 200 may cover a most region of the display panel 100. Also, a vibration generated by the vibration device 200 may vibrate a whole area of the display panel 100. Thus, localization of a sound may be high, and satisfaction of a user may be improved. Also, a contact area (or panel coverage) between the display panel 100 and the vibration device 200 may increase. Thus, a vibration region of the display panel 100 may increase, thereby improving a sound of a middle-low-pitched sound band generated based on a vibration of the display panel 100. In addition, the vibration device 200 applied to a large-sized display apparatus may vibrate a whole area of the display panel 100 having a large size (or a large area). Thus, localization of a sound based on a vibration of the display panel 100 may be even more enhanced, thereby realizing a stereophonic sound effect. Accordingly, the vibration device 200 according to an example embodiment of the present disclosure may be disposed at the rear surface of the display panel 100 to sufficiently vibrate the display panel 100 in a vertical (or horizontal) direction, thereby outputting a desired sound in a forward direction of the apparatus or the display apparatus.

The vibration device 200 may have a thickness smaller than the display panel 100. The vibration device 200 may be implemented as a film type. Because the vibration device 200 may be implemented as a film type, the vibration device 200 may have a smaller thickness than the display panel 100. Thus, an increase in thickness of the display apparatus caused by the arrangement of the vibration device 200 may be minimized. For example, the vibration device 200 may be referred to as a sound generating module, a sound generating device, a film actuator, a film type piezoelectric composite actuator, a film speaker, a film type piezoelectric speaker, or a film type piezoelectric composite speaker, which uses the display panel 100 as a sound vibration plate, but the terms are not limited thereto.

As another example, the vibration device 200 may be applied to a vibration object instead of the display panel 100. For example, the vibration object may be a non-display panel, wood, plastic, glass, cloth, an interior material of a vehicle, a glass window of a vehicle, an inner ceiling of a building, a glass window of a building, an interior material of an aircraft, and a glass window of an aircraft, but embodiments of the present disclosure are not limited thereto. For example, the non-display panel may be a light emitting diode lighting panel (or apparatus), an organic light emitting lighting panel (or apparatus), or an inorganic light emitting lighting panel (or apparatus), but embodiments of the present disclosure are not limited thereto. In this case, the vibration object may be applied as a vibration plate, and the vibration device 200 may vibrate the vibration object to output a sound.

According to another example embodiment of the present disclosure, the vibration object may include a plate. The plate may include a metal material and/or may include one or more single nonmetal or composite nonmetal materials of wood, plastic, glass, cloth, and leather. However, embodiments of the present disclosure are not limited thereto.

The vibration device 200 according to an example embodiment of the present disclosure may include one vibration generator 230 or more or a plurality of vibration generators 230 and 270 which overlap each other. The vibration device 200 may include the plurality of vibration generators 230 and 270 which are overlapped or stacked to be displaced in the same direction. For example, the vibration device 200 may include the plurality of vibration generators 230 and 270 which are overlapped or stacked to have the same driving direction.

According to another example embodiment of the present disclosure, the vibration device 200 may include a single vibration generator 230. A display apparatus including the vibration device 200 including the single vibration generator 230 will be described below with reference to FIG. 12.

The plurality of vibration generators 230 and 270 may be overlapped or stacked to be displaced (or driven or vibrated) in the same direction. For example, each of the plurality of vibration generators 230 and 270 may contract or expand in the same driving direction (or displacement direction or vibration direction) based on a vibration driving signal in an overlapped or stacked state. Thus, a displacement amount (or a bending force or a flexural force) or an amplitude displacement may be increased or maximized. Therefore, the plurality of vibration generators 230 and 270 may increase (or maximize) a displacement amount (or a bending force or a flexural force) or an amplitude displacement of the display panel 100, thereby enhancing a sound pressure level characteristic of a sound and a sound characteristic of a middle-pitched sound band generated based on a vibration of the display panel 100. For example, the plurality of vibration generators 230 and 270 may be implemented to be overlapped or stacked in the same driving direction so that a driving force of each of the plurality of vibration generators 230 and 270 may be increased or maximized, thereby enhancing a sound pressure level characteristic generated by the display panel 100 based on a vibration of each of the plurality of vibration generators 230 and 270.

Each of the plurality of vibration generators 230 and 270 may include a piezoelectric structure (a vibration part or a piezoelectric vibration part) including piezoelectric ceramic having a piezoelectric characteristic, but embodiments of the present disclosure are not limited thereto. For example, each of the plurality of vibration generators 230 and 270 may include piezoelectric ceramic having a perovskite crystalline structure and thus may vibrate (or mechanical displacement) in response to an electrical signal applied from the outside. For example, when a vibration driving signal (or a voice signal) is applied, each of the plurality of vibration generators 230 and 270 may alternately contract and expand based on an inverse piezoelectric effect of the piezoelectric structure (the vibration part or the piezoelectric vibration part). Thus, the vibration generators 230 and 270 may be displaced (or vibrated or driven) in the same direction based on a bending phenomenon where a bending direction is alternately changed, thereby increasing or maximizing a displacement amount (or a bending force or a flexural force) or an amplitude displacement of the vibration device 200 or/and the display panel 100.

A first vibration generator 230 disposed in/on/at the display panel 100 among the plurality of vibration generators 230 and 270 may be a main vibration generator. For example, a second vibration generator 270 of the plurality of vibration generators 230 and 270 may be at least one auxiliary vibration generator which is stacked on the first vibration generator 230. The second vibration generator 270 may have the same structure as that of the first vibration generator 230, but embodiments of the present disclosure are not limited thereto.

The vibration device 200 according to an example embodiment of the present disclosure may further include a first connection member 210, disposed between the first vibration generator 230 and the display panel 100. In case of multiple vibration generator 230 there may be a second connection member 250 disposed between the first vibration generator 230 and the second vibration generator 270.

According to an example embodiment of the present disclosure, each of the first connection member 210 and the second connection member 250 may include at least one base material and may also include an adhesive layer attached on one surface or both surfaces of the base material.

According to an example embodiment of the present disclosure, the first connection member 210 and the second connection member 250 may include a material including an adhesive layer which is good in adhesive force or attaching force with respect to the plurality of vibration generators 230 and 270. For example, the first connection member 210 and the second connection member 250 may include a foam pad, a double-sided tape, or an adhesive, but embodiments of the present disclosure are not limited thereto. For example, the adhesive layer of each of the first connection member 210 and the second connection member 250 may include epoxy, acryl, silicone, or urethane, but embodiments of the present disclosure are not limited thereto. For example, the adhesive layer of each of the first connection member 210 and the second connection member 250 may include a urethane-based material with a relatively ductile characteristic compared to acryl among acryl and urethane. Accordingly, the vibration loss of the vibration device 200 caused by displacement interference between the plurality of vibration generators 230 and 270 may be minimized, or each of the plurality of vibration generators 230 and 270 may be freely displaced.

The adhesive layer of each of the first connection member 210 and the second connection member 250 may further include an additive, such as a tackifier, a wax component, or an anti-oxidation agent. The additive may prevent the first connection member 210 and the second connection member 250 from being detached (stripped) from the display panel 100 by a vibration of the vibration device 200. For example, the tackifier may be a rosin derivative or the like, and the wax component may be a paraffin wax or the like, but embodiments of the present disclosure are not limited thereto. For example, the anti-oxidation agent may be a phenol-based anti-oxidation agent, for example, may be a thioester, but embodiments of the present disclosure are not limited thereto.

According to another example embodiment of the present disclosure, the second connection member 250 may include one or more of a thermocurable adhesive, a photocurable adhesive, and a thermal bonding adhesive. For example, the second connection member 250 may include a thermal bonding adhesive. The thermal bonding adhesive may be a heat-active type or a thermocurable type. For example, the second connection member 250 including a thermal bonding adhesive may attach or couple two adjacent vibration generators 230 and 270 by using heat and pressure.

The first connection member 210 may be disposed between the display panel 100 and the vibration device 200, and thus may connect or couple the vibration device 200 to the rear surface of the display panel 100. For example, the vibration device 200 may be connected or coupled to the rear surface of the display panel 100 by the first connection member 210, and thus may be supported by or disposed at the rear surface of the display panel 100.

The first connection member 210 according to an example embodiment of the present disclosure may include a material including an adhesive layer which is good in adhesive force or attaching force with respect to each of the rear surface of the display panel 100 and the vibration device 200. For example, the first connection member 210 may include a foam pad, a double-sided tape, or an adhesive, but embodiments of the present disclosure are not limited thereto. For example, the adhesive layer of the first connection member 210 may include epoxy, acryl, silicone, or urethane, but embodiments of the present disclosure are not limited thereto. For example, the adhesive layer of the first connection member 210 may differ from the adhesive layer of the second connection member 250. For example, the adhesive layer of the first connection member 210 may include an acrylic material which is relatively better in adhesive force and hardness than urethane. Accordingly, a vibration of the vibration device 200 may be transferred to the display panel 100 well.

According to another example embodiment of the present disclosure, the first connection member 210 may further include a hollow portion provided between the display panel 100 and the vibration device 200. The hollow portion of the first connection member 210 may provide an air gap between the display panel 100 and the vibration device 200. Due to the air gap, a sound wave (or a sound pressure level) based on a vibration of the vibration device 200 may not be dispersed by the first connection member 210 and may concentrate on the display panel 100. Thus, the loss of a vibration caused by the first connection member 210 may be minimized, thereby increasing a sound pressure level characteristic of a sound generated based on a vibration of the display panel 100.

The apparatus according to an example embodiment of the present disclosure may further include a supporting member 300.

The supporting member 300 according to an embodiment may cover the rear surface of the display panel 100. For example, the supporting member 300 may cover the whole rear surface of the display panel 100 with a gap space GS therebetween. For example, the supporting member 300 may include at least one of a glass material, a metal material, and a plastic material or a combination thereof. For example, the supporting member 300 may be a rear structure or a set structure. For example, the supporting member 300 may be referred to with another term such as a cover bottom, a plate bottom, a back cover, a base frame, a metal frame, a metal chassis, a chassis base, or an m-chassis. Therefore, the supporting member 300 may be implemented as any of various types of frames or a plate structure disposed at the rear surface of the display panel 100.

The apparatus according to an example embodiment of the present disclosure may further include a middle frame 400.

The middle frame 400 may be disposed between a rear periphery of the display panel 100 and a front periphery of the supporting member 300. The middle frame 400 may support one or more of a periphery portion of the display panel 100 and a periphery portion of the supporting member 300. The middle frame 400 may surround one or more side surfaces of each of the display panel 100 and the supporting member 300. The middle frame 400 may provide for a gap space GS between the display panel 100 and the supporting member 300. The middle frame 400 may be referred to as a middle cabinet, a middle cover, or a middle chassis, but the terms are not limited thereto.

The middle frame 400 according to an example embodiment of the present disclosure may include a first supporting portion 410 and a second supporting portion 430.

The first supporting portion 410 may be disposed between a rear periphery of the display panel 100 and a front periphery of the supporting member 300, and thus may provide for the gap space GS between the display panel 100 and the supporting member 300. A front surface of the first supporting portion 410 may be coupled or connected to the rear periphery of the supporting member 300 by a first frame connection member 401. A rear surface of the first supporting portion 410 may be coupled or connected to the front periphery of the supporting member 300 by a second frame connection member 403. For example, the first supporting portion 410 may have a single picture frame structure having a tetragonal shape or may include a picture frame structure having a plurality of division bar shapes.

The second supporting portion 430 may be vertically coupled or connected to an outer surface of the first supporting portion 410 in parallel with a thickness direction Z of the apparatus. The second supporting portion 430 may surround one or more of an outer surface of the display panel 100 and an outer surface of the supporting member 300, and thus may protect the outer surface of each of the display panel 100 and the supporting member 300. The first supporting portion 410 may protrude from an inner surface of the second supporting portion 430 toward the vibration device 200 or toward the gap space GS between the display panel 100 and the supporting member 300.

Figure 3:
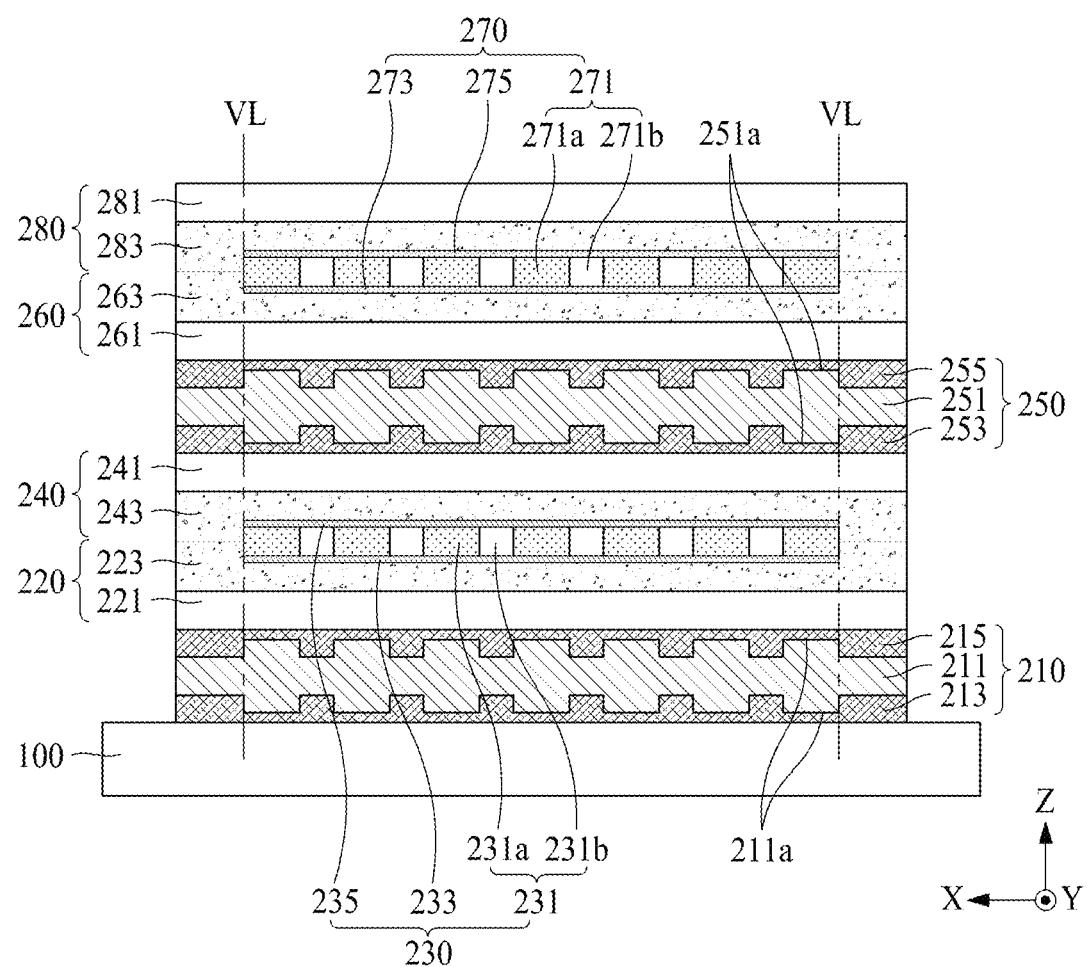
FIG. 3 is a cross-sectional view illustrating a vibration device connected to a display panel according to an example embodiment of the present disclosure.
Figure 4:
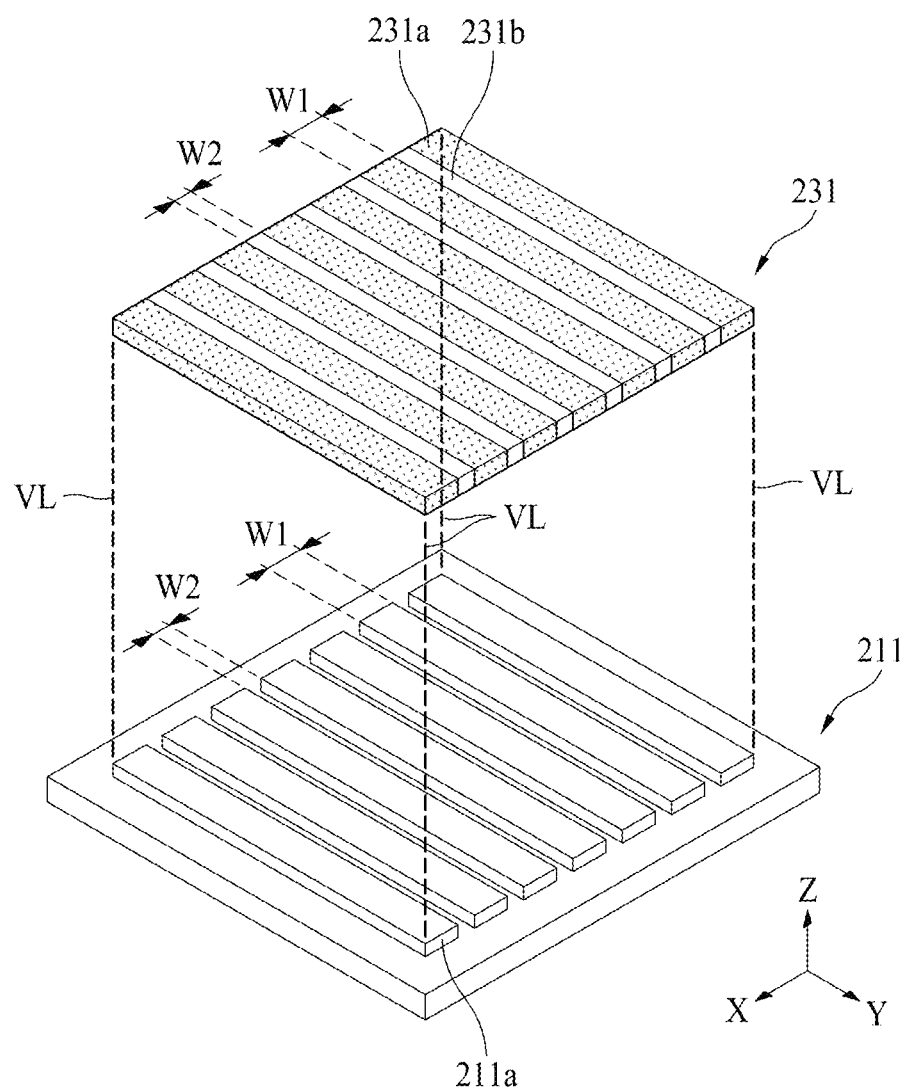
FIG. 4 is a perspective view illustrating a connection relationship between a base material of a first connection member and a vibration part of FIG. 3.

FIG. 3 is a cross-sectional view illustrating in detail an example vibration device connected to a display panel according to an example embodiment of the present disclosure. FIG. 4 is a perspective view illustrating a connection relationship between a base material of a first connection member and a vibration part of FIG. 3.

As shown in FIG. 3, a display apparatus according to an example embodiment of the present disclosure may include a vibration device 200 disposed at or under a display panel 100. The vibration device 200 may include a first connection member 210, a first vibration generator 230, a second connection member 250, and a second vibration generator 270.

The first vibration generator 230 according to an example embodiment of the present disclosure may include a first vibration part 231 including a piezoelectric material, a first electrode part 233 disposed at a first surface of the first vibration part 231, and a second electrode part 235 disposed at a second surface of the first vibration part 231, which is opposite to the first surface.

The first vibration part 231 may include an electroactive material, a composite piezoelectric material, or a piezoelectric material, which includes a piezoelectric effect. The first vibration part 231 may include an inorganic material and an organic material. For example, the first vibration part 231 may include a plurality of inorganic material portions including a piezoelectric material and at least one organic material portion including a ductile material. For example, the first vibration part 231 may be referred to as a piezoelectric vibration part, a piezoelectric composite layer, a piezoelectric composite, or a piezoelectric ceramic composite, but embodiments of the present disclosure are not limited thereto. The first vibration part 231 may include a transparent piezoelectric material, a semitransparent piezoelectric material, or an opaque piezoelectric material, and thus may be transparent, semitransparent, or opaque. The first vibration part 231 or each of the first and second vibration generators 230 and 270 may be referred to as a flexible vibration generator, a flexible actuator, a flexible speaker, a flexible piezoelectric speaker, a film actuator, a film type piezoelectric composite actuator, a film speaker, a film type piezoelectric speaker, or a film type composite speaker, but embodiments of the present disclosure are not limited thereto.

The first vibration part 231 according to an example embodiment of the present disclosure may include a plurality of first portions 231a and a plurality of second portions 231b. For example, the plurality of first portions 231a and the plurality of second portions 231b may be alternately and repeatedly arranged in a first direction X (or a second direction Y). For example, the first direction X may be a widthwise direction of the first vibration part 231 and the second direction Y may be a lengthwise direction of the first vibration part 231 intersecting with the first direction X, but embodiments of the present disclosure are not limited thereto. For example, the first direction X may be the lengthwise direction of the first vibration part 231, and the second direction Y may be the widthwise direction of the first vibration part 231.

Each of the plurality of first portions 231a may include an inorganic material portion. The inorganic material portion may include a material described above. For example, each of the plurality of first portions 231a may be formed of a ceramic-based material for generating a relatively high vibration or may be formed of piezoelectric ceramic having a perovskite-based crystalline structure. The perovskite crystalline structure may have a piezoelectric effect and an inverse piezoelectric effect and may be a plate-shaped structure having orientation. The perovskite crystalline structure may be represented by a chemical formula "$ABO_3$". Here, A may include a divalent metal element, and B may include a tetravalent metal element. For example, in the chemical formula "$ABO_3$", A and B may be cations, and O may be anions. For example, the chemical formula "$ABO_3$" may include one of $PbTiO_3$, $PbZrO_3$, $BaTiO_3$, and $SrTiO_3$, but embodiments of the present disclosure are not limited thereto.

For example, each of the plurality of first portions 231a according to an example embodiment of the present disclosure may include one or more of lead (Pb), zirconium (Zr), titanium (Ti), zinc (Zn), nickel (Ni), and niobium (Nb), but embodiments of the present disclosure are not limited thereto.

As another example, each of the plurality of first portions 231a may include a lead zirconate titanate (PZT)-based material including lead (Pb), zirconium (Zr), and titanium (Ti) or may include a lead zirconate nickel niobate (PZNN)-based material including lead (Pb), zinc (Zn), nickel (Ni), and niobium (Nb), but embodiments of the present disclosure are not limited thereto. Also, each of the plurality of first portions 231a may include at least one of $CaTiO_3$, $BaTiO_3$, and $SrTiO_3$ without Pb, but embodiments of the present disclosure are not limited thereto.

As another example, the first portion 231a may have a piezoelectric deformation modulus $d_{33}$ of 1,000 pC/N or more based on a thickness direction Z thereof. The first portion 231a may have a high piezoelectric deformation modulus $d_{33}$ and thus may be applied to a large-size display panel, thereby providing the vibration device 200 having a sufficient vibration characteristic or a sufficient piezoelectric characteristic. For example, the first portion 231a may include a PZT-based material ($PbZrTiO_3$) as a main component and, for example, may include a softener dopant material doped in A site (Pb) and a relaxor ferroelectric material doped into B site (ZrTi).

The softener dopant material may enhance a piezoelectric characteristic and a dielectric characteristic of the first portion 231a, for example, may increase the piezoelectric deformation modulus $d_{33}$ of the first portion 231a. If the softener dopant material includes a monovalent element, a piezoelectric characteristic and a dielectric characteristic may be reduced. For example, if the softener dopant material includes kalium (K) and rubidium (Rb), a piezoelectric characteristic and a dielectric characteristic may be reduced. Therefore, through various experiments, the inventors have discovered that the softener dopant material could include a divalent element and a triad element to enhance a piezoelectric characteristic and a dielectric characteristic. The softener dopant material according to an example embodiment of the present disclosure may include a divalent element and a triad element. A morphotropic phase boundary (MPB) may be formed by adding the softener dopant material to the PZT-based material ($PbZrTiO_3$). Thus, a piezoelectric characteristic and a dielectric characteristic may be enhanced. For example, the softener dopant material may include strontium (Sr), barium (Ba), lanthanum (La), neodymium (Nd), calcium (Ca), yttrium (Y), erbium (Er), or ytterbium (Yb). For example, an ion ($Sr^{2+}$, $Ba^{2+}$, $La^{2+}$, $Nd^{3+}$, $Ca^{2+}$, $Y^{3+}$, $Er^{3+}$, or $Yb^{3+}$) of the softener dopant material doped into the PZT-based material ($PbZrTiO_3$) may substitute a portion of lead (Pb) in the PZT-based material ($PbZrTiO_3$), and a substitution amount thereof may be about 2 mol % to about 20 mol %. For example, if the substitution amount is less than 2 mol % or more than 20 mol %, the perovskite crystalline structure may be broken. Thus, an electric-bond coefficient kP and the piezoelectric deformation modulus $d_{33}$ may be reduced. If the softener dopant material is substituted, an MPB may be formed, and a high piezoelectric characteristic and a high dielectric characteristic may be realized in the MPB, thereby implementing a vibration device having a high piezoelectric characteristic and a high dielectric characteristic.

According to an example embodiment of the present disclosure, a relaxor ferroelectric material doped into the PZT-based material ($PbZrTiO_3$) may enhance an electric deformation characteristic of the first portion 231a. The relaxor ferroelectric material according to an example embodiment of the present disclosure may include a lead magnesium niobate (PMN)-based material or a lead nickel niobate (PNN)-based material, but embodiments of the present disclosure are not limited thereto. The PMN-based material may include Pb, magnesium (Mg), and Nb, for example, may be $Pb(Mg, Nb)O_3$. For example, the relaxor ferroelectric material doped into the PZT-based material ($PbZrTiO_3$) may substitute a portion of each of zirconium (Zr) and titanium (Ti) in the PZT-based material ($PbZrTiO_3$), and a substitution amount thereof may be about 5 mol % to about 25 mol %. For example, if the substitution amount is less than 5 mol % or more than 25 mol %, the perovskite crystalline structure may be broken. Thus, the electric-bond coefficient kP and the piezoelectric deformation modulus $d_{33}$ may be reduced.

According to an example embodiment of the present disclosure, the first portion 231a may further include a donor material doped into B site (ZrTi) of the PZT-based material (PbZrTiO$_3$), in order to additionally enhance a piezoelectric coefficient. For example, a donor material doped into the B site (ZrTi) may include quadrivalent to hexad elements. For example, the donor material doped into B site (ZrTi) may include tellurium (Te), germanium (Ge), uranium (U), bismuth (Bi), niobium (Nb), tantalum (Ta), antimony (Sb), or tungsten (W).

The first portion 231a may be represented by the following Formula 1:

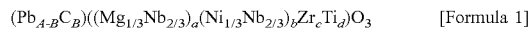

$$(Pb_{A-B}C_B)((Mg_{1/3}Nb_{2/3})_a(Ni_{1/3}Nb_{2/3})_bZr_cTi_d)O_3 \quad \text{[Formula 1]}$$

In Formula 1, C may be one of Ca, Sr, and Ba. Also, a+b+c+d=1, 0.02≤B≤0.20, 0.80≤A-B≤0.98, 0.05≤a≤0.25, 0.05≤b≤0.25, 0.10≤c≤0.50, and 0.10≤d≤0.50.

The first portion 231a according to an example embodiment of the present disclosure may have the piezoelectric deformation modulus $d_{33}$ of 1,000 pC/N or more based on the thickness direction Z thereof, thereby implementing a vibration device with an enhanced vibration characteristic. For example, a vibration device with an enhanced vibration characteristic may be implemented in a large-area apparatus.

Each of the plurality of first portions 231a according to an example embodiment of the present disclosure may be disposed between two adjacent second portions 231b of the plurality of second portions 231b. The plurality of second portions 231b may be disposed (or arranged) in parallel with the plurality of first portions 231a therebetween. Each of the plurality of first portions 231a may have a first width W1 in the first direction X (or the second direction Y) and may have a length in the second direction Y (or the first direction X). Each of the plurality of second portions 231b may have a second width W2 in the first direction X (or the second direction Y) and may have a length in the second direction Y (or the first direction X). The first width W1 may be equal to or different from the second width W2. Each of the plurality of second portions 231b may have the same size (for example, the same area or volume). For example, each of the plurality of second portions 231b may have the same size (for example, the same area or volume) within a process error (or an allowable error) occurring in a manufacturing process. For example, the first width W1 may be greater than the second width W2. For example, the first portion 231a and the second portion 231b may include a line shape or a stripe shape having the same size or different sizes. Accordingly, the first vibration part 231 may include a 2-2 composite having the first portion 231a and the second portion 231b, and thus may have a resonance frequency of 20 kHz or less, but embodiments of the present disclosure are not limited thereto. For example, a resonance frequency of the first vibration part 231 may vary based on one or more of a shape, a length, and a thickness.

In the first vibration part 231, the plurality of first portions 231a and the plurality of second portions 231b may be disposed (or arranged) in parallel on the same plane (or the same layer). Each of the plurality of second portions 231b may be configured to fill a gap between two adjacent first portions 231a. Each of the plurality of second portions 231b may be connected or adhered to an adjacent first portion 231a. Each of the plurality of second portions 231b may be configured to fill a gap between two adjacent first portions 231a and thus may be connected or adhered to an adjacent first portion 231a. Accordingly, the first vibration part 231 may be enlarged to have a desired size or length based on the side coupling (or connection) between the first portion 231a and the second portion 231b.

In the first vibration part 231, the width W2 of each of the plurality of second portions 231b may decrease progressively in a direction from a center portion of the first vibration part 231 to both periphery portions (or both ends) of the first vibration part 231.

According to an example embodiment of the present disclosure, when the first vibration part 231 vibrates in a vertical direction Z (or a thickness direction), a second portion 231b having a largest width W2 among the plurality of second portions 231b may be disposed at a portion on which a largest stress concentrates. When the first vibration part 231 vibrates in the vertical direction Z, a second portion 231b having a smallest width W2 among the plurality of second portions 231b may be disposed at a portion on which a smallest stress concentrates. For example, the second portion 231b having the largest width W2 among the plurality of second portions 231b may be disposed at a center portion of the first vibration part 231, and the second portion 231b having the smallest width W2 among the plurality of second portions 231b may be disposed at one or more of both periphery portions of the first vibration part 231. Therefore, when the first vibration part 231 vibrates in the vertical direction Z, an overlap of a resonance frequency or interference of a sound wave occurring in the portion on which the largest stress concentrates may be minimized. Accordingly, a dip phenomenon of a sound pressure level occurring in a low-pitched sound band may be reduced, and the flatness of a sound characteristic in the low-pitched sound band may be mitigated. For example, the flatness of a sound characteristic may be an amount of difference a deviation of a sound pressure level between a highest sound pressure level and a lowest sound pressure level.

In the first vibration part 231, the plurality of first portions 231a may have different sizes (or widths). For example, a size (or a width) of each of the plurality of first portions 231a may decrease or increase progressively in a direction from the center portion of the first vibration part 231 to both periphery portions (or both ends) of the first vibration part 231. The first vibration part 231 may have a sound pressure level characteristic of a sound which is enhanced by various unique vibration frequencies based on a vibration of each of the plurality of first portions 231a having different sizes. Thus, a reproduction band of a sound may expand or increase.

Each of the plurality of second portions 231b may be disposed between two adjacent first portions 231a of the plurality of first portions 231a. Therefore, in the first vibration part 231, a vibration energy based on a link in a unit lattice of each first portion 231a may be increased by a corresponding second portion 231b. Thus, a vibration characteristic may increase, and a piezoelectric characteristic and flexibility may be secured.

For example, the second portion 231b may include one or more of an epoxy-based polymer, an acryl-based polymer, and a silicone-based polymer, but embodiments of the present disclosure are not limited thereto.

Each of the plurality of second portions 231b according to an example embodiment of the present disclosure may include an organic material portion. For example, the organic material portion may be disposed between inorganic material portions and may absorb an impact applied to the inorganic material portion (or the first portion 231a). Thus, the organic material portion may release a stress concentrating on the inorganic material portion to enhance the durability of the first vibration part 231 and to provide flexibility to the first vibration part 231.

Each of the plurality of second portions 231b according to an example embodiment of the present disclosure may have a modulus and viscoelasticity which are lower than those of each first portion 231a. Accordingly, the reliability of the first portion 231a, which may be vulnerable to an impact due to its fragile characteristic, may be enhanced.

For example, the vibration device 200 for vibrating the display panel 100 may have a maximum vibration characteristic if the vibration device 200 has an impact resistance and high stiffness. For the vibration device 200 to have an impact resistance and high stiffness, the plurality of second portions 231b may each include a material having a relatively high damping factor (tan δ) and relatively high stiffness. For example, the plurality of second portions 231b may each include a material having a damping factor (tan δ) of about 0.1 Gpa to about 1 Gpa and relatively high stiffness of about 0 Gpa to about 10 Gpa. Also, a damping factor (tan δ) and a stiff characteristic may be described based on a correlation between a loss coefficient and modulus. For example, the plurality of second portions 231b may each include a material having a loss coefficient of about 0.01 to about 1 and a modulus of about 0.1 Gpa to about 10 Gpa.

The organic material portion included in the second portion 231b may include an organic material, an organic polymer, an organic piezoelectric material, or an organic non-piezoelectric material, which has a flexible characteristic compared to the inorganic material portion which may be the first portion 231a. For example, the second portion 231b may be referred to as an adhesive portion, an elastic portion, a bending portion, a damping portion, or a flexible portion having flexibility, but embodiments of the present disclosure are not limited thereto.

The organic material portion including the organic piezoelectric material may absorb an impact applied to the inorganic material portion (or the first portion 231a), and thus, may enhance the total durability of the vibration device 200 and may provide a piezoelectric characteristic corresponding to a certain level or more. The organic piezoelectric material according to an example embodiment of the present disclosure may be an organic material having an electroactive material. For example, the organic piezoelectric material may include one or more of polyvinylidene fluoride (PVDF), β-Polyvinylidene fluoride (β-PVDF), and polyvinylidene-trifluoroethylene (PVDF-TrFE), but embodiments of the present disclosure are not limited thereto.

The organic material portion including the organic non-piezoelectric material may include a curable resin composition and an adhesive including the curable resin composition. Thus, the organic material portion including the organic non-piezoelectric material may absorb an impact applied to the inorganic material portion (or the first portion 231a), thereby enhancing the total durability of the vibration device 200. The organic non-piezoelectric material according to an example embodiment of the present disclosure may include at least one or more of an epoxy-based polymer, an acryl-based polymer, and a silicone-based polymer, but embodiments of the present disclosure are not limited thereto.

For example, the organic material portion including the organic non-piezoelectric material may include an adhesion promoter or an adhesion enhancing agent for adhesiveness between epoxy resin and an inorganic material portion for a high stiffness characteristic useful for the vibration device 200. For example, the adhesion promoter may be phosphate or the like, but embodiments of the present disclosure are not limited thereto. The organic material portion may be cured by at least one of a thermal curing process and a photo-curing process. In a process of curing the organic material portion, a solvent free type epoxy resin may be used for preventing the thickness uniformity of the vibration device 200 from being reduced by contraction of the organic material portion caused by volatilization of a solvent, but embodiments of the present disclosure are not limited thereto.

The organic material portion including the organic non-piezoelectric material may further include a reinforcing agent for a damping characteristic in addition to high stiffness of the vibration device 200. For example, the reinforcing agent may be methylmethacrylate-butadiene-styrene (MBS) having a core shell type, and a content thereof may be about 5 wt % to about 40 wt %. The reinforcing agent may be an elastic body having the core shell type and may have a high coupling force to epoxy resin such as an acryl-based polymer. Thus, the reinforcing agent may enhance an impact resistance or a damping characteristic of the vibration device 200.

The plurality of first portions 231a and the plurality of second portions 231b may be disposed (or connected) on the same plane. Thus, the first vibration part 231 according to an example embodiment of the present disclosure may have a single thin film type. For example, the plurality of first portions 231a of the first vibration part 231 may have a structure in which they are connected to one another along one side. For example, the plurality of first portions 231a may have a structure in which they are connected to one another in the entire the first vibration part 231. For example, the first vibration part 231 may be vibrated upward and downward by the first portions 231a having a vibration characteristic and may be bent in a curve shape by the second portions 231b having flexibility. Also, in the first vibration part 231 according to an embodiment of the present disclosure, a size of each first portion 231a and a size of each second portion 231b may be adjusted based on a piezoelectric characteristic and flexibility needed or desired for the first vibration part 231. In an example embodiment of the present disclosure, in the first vibration part 231 for which a piezoelectric characteristic is required or desired over than flexibility, a size of each first portion 231a may be adjusted to be greater than that of each second portion 231b. In another example embodiment of the present disclosure, in the first vibration part 231 for which flexibility is required or desired over a piezoelectric characteristic, a size of each second portion 231b may be adjusted to be greater than that of each first portion 231a. Accordingly, a size of the first vibration part 231 may be adjusted based on a desired characteristic. Thus, it may be easy to design the first vibration part 231.

The first electrode part 233 may be disposed on a first surface (or a bottom surface or a lower surface) of the first vibration part 231. The first electrode part 233 may be commonly disposed at or coupled to a first surface of each of the plurality of first portions 231a and a first surface of each of the plurality of second portions 231b. The first electrode part 233 may be electrically connected to the first surface of each of the plurality of first portions 231a. For example, the first electrode part 233 may be disposed on the entire the first surface of the first vibration part 231. The first electrode part 233 may have a form of a common electrode. For example, the first electrode part 233 may have substantially the same shape as the first vibration part 231 but embodiments of the present disclosure are not limited thereto. The first electrode part 233 according to an example embodiment of the present disclosure may include a transparent conductive material, a semitransparent conductive material, or an opaque conductive material, but embodiments of the present disclosure are not limited thereto.

The second electrode part 235 may be disposed at a second surface (or a top surface or an upper surface), which is opposite to the first surface, of the first vibration part 231. The second electrode part 235 may be commonly disposed at or coupled to a second surface of each of the plurality of first portions 231a and a second surface of each of the plurality of second portions 231b. The second electrode part 235 may be electrically connected to the second surface of each of the plurality of first portions 231a. For example, the second electrode part 235 may be disposed on the entire second surface of the first vibration part 231. The second electrode part 235 may have a form of a common electrode. For example, the second electrode part 235 may have substantially the same shape as the first vibration part 231 but embodiments of the present disclosure are not limited thereto. The second electrode part 235 according to an example embodiment of the present disclosure may include a transparent conductive material, a semitransparent conductive material, or an opaque conductive material, but embodiments of the present disclosure are not limited thereto.

The first electrode part 233 may be covered by a first protection member 220 described below. The second electrode part 235 may be covered by a second protection member 240 described below.

The first vibration part 231 of the first vibration generator 230 may be polarized (or poling) by a certain voltage applied to the first electrode part 233 and the second electrode part 235 in a certain temperature atmosphere or a temperature atmosphere which is changed from a high temperature to a room temperature. Likewise, the second vibration part 271 of the second vibration generator 270 (described below in more detail) may be polarized by a certain voltage applied to the first electrode part 273 and the second electrode part 275 in a certain temperature atmosphere or a temperature atmosphere which is changed from a high temperature to a room temperature. For example, the first vibration part 231 of the first vibration generator 230 and the second vibration part 271 of the second vibration generator 270 may alternately contract and expand based on an inverse piezoelectric effect based on a vibration driving signal applied from the outside to their respective first electrode parts 233, 273 and their respective second electrode parts 235, 275. For example, the first vibration part 231 of the first vibration generator 230 and the second vibration part 271 of the second vibration generator 270 may vibrate based on a vibration $d_{33}$ generated in a vertical direction and a vibration $d_{31}$ generated in a planar direction (or a horizontal direction) by using their respective first electrode parts 233, 273 and their respective second electrode parts 235, 275. A displacement of the vibration device 200 or a displacement of the display panel may increase based on the contraction and expansion of the first vibration part 231 in the planar direction, and thus, a vibration of the vibration device 200 or the display panel may be more enhanced.

The second vibration generator 270 according to an example embodiment of the present disclosure may include a second vibration part 271 including a piezoelectric material, a first electrode part 273 disposed at a first surface (or the bottom surface) of the second vibration part 271, and a second electrode part 275 disposed at a second surface (or the top surface), which is opposite to the first surface, of the second vibration part 271. Also, the second vibration part 271 according to an example embodiment of the present disclosure may include a plurality of first portions 271a and a plurality of second portions 271b.

Here, configurations of the second vibration part 271, the first electrode part 273, and the second electrode part 275 of the second vibration generator 270 may respectively be the same as or similar to those of the first vibration part 231, the first electrode part 233, and the second electrode part 235 of the first vibration generator 230. Thus, repeated descriptions are omitted here as detailed descriptions provided above may be referenced.

A first connection member 210 may include a first base material 211 disposed at a center portion thereof in a vertical direction and a plurality of first adhesive layers 213 and 215 disposed respectively on a first surface (or a bottom surface or a lower surface) and a second surface (or a top surface or an upper surface) of the first base material 211. The first base material 211 may be a base material of the first connection member 210.

For example, a first base material 211 of the first connection member 210 may be formed of a polymer film including polyethylene terephthalate (PET) and polyimide (PI), but embodiments of the present disclosure are not limited thereto. An elastic modulus of PET may have a range of 3.5 GPa to 11 GPa, and an elastic modulus of polyimide may have a range of 3.7 GPa to 20 GPa.

For example, the first adhesive layers 213 and 215 of the first connection member 210 may include epoxy, acryl, silicone, or urethane, but embodiments of the present disclosure are not limited thereto. For example, the first adhesive layers 213 and 215 of the first connection member 210 may include a urethane-based material having a relatively lower elastic modulus than acryl among acryl and urethane. Also, the first adhesive layers 213 and 215 may have an elastic modulus of 1 MPa to 1,000 MPa.

According to an example embodiment of the present disclosure, the first connection member 210 may include the first base material 211 disposed at the center portion thereof in the vertical direction and first protrusion portions 211a provided to protrude, respectively, from the first surface (or the bottom surface or the lower surface) and the second surface (or the top surface or the upper surface) of the first base material 211.

As illustrated in FIG. 4, a first protrusion portion (an end portion, an end, an outer surface, or each corner portion) 211a of the first connection member 210 may be aligned with a first portion (an end portion, an end, an outer surface, or each corner portion) 231a of the first vibration part 231 along a virtual extension line VL.

The display apparatus according to an example embodiment of the present disclosure may further include a first protection member 220 and a second protection member 240, which respectively cover a lower portion and an upper portion of the first vibration generator 230.

The first protection member 220 may be disposed under the first electrode part 233. The first protection member 220 may protect the first electrode part 233. The second protection member 240 may be disposed on the second electrode part 235. The second protection member 240 may protect the second electrode part 235. For example, the first protection member 220 and the second protection member 240 of the first vibration generator 230 may each include a plastic material or a fiber material, but embodiments of the present disclosure are not limited thereto. For example, in the first vibration generator 230, the first protection member 220 may include a material which is the same as or different from that of the second protection member 240. One or both of the first protection member 220 and the second protection member 240 of the first vibration generator 230 may be connected or coupled to a rear surface of the display panel 100 via the first connection member 210. For example, the first protection member 220 of the first vibration generator 230 may be connected or coupled to the rear surface of the display panel 100 via the first connection member 210.

The first protection member 220 may include a first base material 221 and a first adhesive layer 223. The first adhesive layer 223 may be provided to be closer to the first vibration generator 230 than the first base material 221. The first adhesive layer 223 of the first protection member 220 may be disposed between the first electrode part 233 of the first vibration generator 230 and the base material 221 of the first protection member 220.

The second protection member 240 may include a second base material 241 and a second adhesive layer 243. The second adhesive layer 243 may be provided to be closer to the first vibration generator 230 than the second base material 241. The second adhesive layer 243 of the second protection member 240 may be disposed between the second electrode part 235 of the first vibration generator 230 and the second base material 241 of the second protection member 240.

Each of the respective first and second base materials 221 and 241 of the first and second protection members 220 and 240 may be formed of a polyimide film or a PET film, but embodiments of the present disclosure are not limited thereto.

Each of the first and second adhesive layers 223 and 243 of the first and second protection members 220 and 240 may include epoxy resin, acryl resin, silicone resin, or urethane resin, but embodiments of the present disclosure are not limited thereto.

The first adhesive layer 223 of the first protection member 220 and the second adhesive layer 243 of the second protection member 240 may be connected or coupled to each other between the first protection member 220 and the second protection member 240. For example, the first adhesive layer 223 of the first protection member 220 and the second adhesive layer 243 of the second protection member 240 may be connected or coupled to each other at a periphery portion between the first protection member 220 and the second protection member 240. Therefore, the first vibration part 231 of the first vibration generator 230 may be surrounded by the first adhesive layer 223 of the first protection member 220 and the second adhesive layer 243 of the second protection member 240. For example, the first adhesive layer 223 of the first protection member 220 and the second adhesive layer 243 of the second protection member 240 may fully surround the entire first vibration part 231 of the first vibration generator 230. For example, the first adhesive layer 223 of the first protection member 220 and the second adhesive layer 243 of the second protection member 240 may collectively or individually be referred to as a cover member, but embodiments of the present disclosure are not limited thereto. If the first adhesive layer 223 of the first protection member 220 and the second adhesive layer 243 of the second protection member 240 is collectively a cover member, the base material 221 of the first protection member 220 may be disposed at a first surface (or a bottom surface or a lower surface) of the cover member, and the base material 241 of the second protection member 240 may be disposed at a second surface (or a top surface or an upper surface) of the cover member.

A second connection member 250 may include a second base material 251 disposed at a center portion thereof in a vertical direction and a plurality of second adhesive layers 253 and 255 disposed respectively on a first surface (or a bottom surface or a lower surface) and a second surface (or a top surface or an upper surface) of the second base material 251.

A second base material 251 of the second connection member 250 may be a polymer film including PET (polyethylene terephthalate) and polyimide, but embodiments of the present disclosure are not limited thereto. An elastic modulus of PET may have a range of 3.5 GPa to 11 GPa, and an elastic modulus of polyimide may have a range of 3.7 GPa to 20 GPa.

For example, the adhesive layers 253 and 255 of the second connection member 250 may include epoxy, acryl, silicone, or urethane, but are not limited thereto. For example, the adhesive layers 253 and 255 of the second connection member 250 may include a urethane-based material having a relatively lower elastic modulus than acryl among acryl and urethane. Also, the adhesive layers 253 and 255 of the second connection member 250 may have an elastic modulus of 1 MPa to 1,000 MPa.

According to an example embodiment of the present disclosure, the second connection member 250 may include the base material 251 disposed at the center portion thereof in the vertical direction and second protrusion portions 251a provided to protrude, respectively, from the first surface (or the bottom surface or the lower surface) and the second surface (or the top surface or the upper surface) of the base material 251.

As illustrated in FIGS. 3 and 4, a protrusion portion (an end portion, an end, an outer surface, or each corner portion) 251a of the second connection member 250 may be aligned with a first portion (an end portion, an end, an outer surface, or each corner portion) 231a of the first vibration part 231 of the first vibration generator 230 and a first portion (an end portion, an end, an outer surface, or each corner portion) 271a of the second vibration part 271 of the second vibration generator 270 along the virtual extension line VL.

The display apparatus according to an example embodiment of the present disclosure may further include a third protection member 260 and a fourth protection member 280, which respectively cover a lower portion and an upper portion of the second vibration generator 270.

The third protection member 260 may be disposed under the first electrode part 273 of the second vibration part 271. The third protection member 260 may protect the first electrode part 273 of the second vibration part 271. The fourth protection member 280 may be disposed on the second electrode part 275 of the second vibration part 271. The fourth protection member 280 may protect the second electrode part 275 of the second vibration part 271. For example, the third protection member 260 and the fourth protection member 280 may each include a plastic material or a fiber material, but are not limited thereto. For example, the third protection member 260 may include a material which is the same as or different from that of the fourth protection member 280.

The third protection member 260 may include a third base material 261 and a third adhesive layer 263. Third adhesive layer 263 may be provided to be closer to the second vibration generator 270 than the third base material 261. The adhesive layer 263 of the third protection member 260 may be disposed between the first electrode part 273 of the second vibration generator 270 and the base material 261 of the third protection member 260.

The fourth protection member 280 may include a fourth base material 281 and a fourth adhesive layer 283. The fourth adhesive layer 283 may be provided to be closer to the second vibration generator 270 than the fourth base material 281. The adhesive layer 283 of the fourth protection member 280 may be disposed between the second electrode part 275 of the second vibration generator 270 and the base material 281 of the fourth protection member 280.

Each of the respective base materials 261 and 281 of the third and fourth protection members 260 and 280 may be a polyimide film or a PET film, but embodiments of the present disclosure are not limited thereto.

Each of the adhesive layer 263 of the third protection member 260 and the adhesive layer 283 of the fourth protection member 280 may include epoxy resin, acryl resin, silicone resin, or urethane resin, but embodiments of the present disclosure are not limited thereto.

The adhesive layer 263 of the third protection member 260 and the adhesive layer 283 of the fourth protection member 280 may be connected or coupled to each other between the third protection member 260 and the fourth protection member 280. For example, the adhesive layer 263 of the third protection member 260 and the adhesive layer 283 of the fourth protection member 280 may be connected or coupled to each other at a periphery portion between the third protection member 260 and the fourth protection member 280. Therefore, the second vibration part 271 of the second vibration generator 270 may be surrounded by the adhesive layer 263 of the third protection member 260 and the adhesive layer 283 of the fourth protection member 280. For example, the adhesive layer 263 of the third protection member 260 and the adhesive layer 283 of the fourth protection member 280 may fully surround the entire second vibration part 271 of the second vibration generator 270. For example, the adhesive layer 263 of the third protection member 260 and the adhesive layer 283 of the fourth protection member 280 may collectively or individually be referred to as a cover member, but are not limited thereto. If the adhesive layer 263 of the third protection member 260 and the adhesive layer 283 of the fourth protection member 280 is collectively a cover member, the base material 261 of the third protection member 260 may be disposed at a first surface (or a bottom surface or a lower surface) of the cover member, and the base material 281 of the fourth protection member 280 may be disposed at a second surface (or a top surface or an upper surface) of the cover member.

The first vibration part 231 of the first vibration generator 230 and the second vibration part 271 of the second vibration generator 270 may have the same size and may overlap each other to maximize or increase a displacement amount or an amplitude displacement of the vibration device 200. More specifically, the first and second portions 231a and 231b of the first vibration part 231 of the first vibration generator 230 may substantially overlap the first and second portions 271a and 271b of the second vibration part 271 of the second vibration generator 270, respectively, without being staggered.

For example, a first portion (an end portion, an end, an outer surface, or each corner portion) 271a of the second vibration part 271 of the second vibration generator 270 may be substantially aligned with or may overlap a first portion (an end portion, an end, an outer surface, or each corner portion) 231a of the first vibration part 231 of the first vibration generator 230 without being staggered. For example, each first portion (an end portion, an end, an outer surface, or each corner portion) 271a of the second vibration part 271 of the second vibration generator 270 may be substantially aligned with or may overlap each first portion (an end portion, an end, an outer surface, or each corner portion) 231a of the first vibration part 231 of the first vibration generator 230 within an error range of a manufacturing process without being staggered.

Moreover, the first portion 231a of the first vibration part 231 and the first protrusion portion 211a of the first connection member 210 may have the same size and may overlap to maximize or increase a displacement amount or an amplitude displacement.

For example, as illustrated in FIG. 4, the first portion (an end portion, an end, an outer surface, or each corner portion) 231a of the first vibration part 231 of the first vibration generator 230 may be aligned the first protrusion portion 211a of the first connection member 210 along with the virtual extension line VL.

Moreover, the first portion 231a of the first vibration generator 230 and a first portion (an end portion, an end, an outer surface, or each corner portion) 271a of the second vibration part 271 of the second vibration generator 270 may be aligned the second protrusion portion (an end portion, an end, an outer surface, or each corner portion) 251a of the second connection member 250 along with the virtual extension line VL.

According to an example embodiment of the present disclosure, a plurality of second portions 231b of the first vibration generator 230 and a plurality of second portions 271b of the second vibration generator 270 may have the same size and may be substantially overlap each other without being staggered. Also, the first protrusion portions 211a of the first connection member 210 and the second protrusion portions 251a of the second connection member 250 may have the same size and may substantially overlap each other without being staggered. Also, the plurality of first portions 231a of the first vibration generator 230, the plurality of first portions 271a of the second vibration generator 270, the first protrusion portions 211a of the first connection member 210, and the second protrusion portions 251a of the second connection member 250 may have the same size and may substantially overlap one another without being staggered.

Therefore, in the vibration device 200 according to an example embodiment of the present disclosure, the first portions 231a of the first vibration part 231 of the first vibration generator 230 and the first portions 271a of the second vibration part 271 of the second vibration generator 270 may overlap the first protrusion portions 211a of the first connection member 210 and the second protrusion portions 251a of the second connection member 250. Thus, an overall volume of the vibration device 200 or a region which overlaps the respective adhesive layers 223, 243, 263, and 283 of the first to fourth protection members 220, 240, 260, and 280 having a relatively low elastic modulus may be minimized, thereby minimizing vibration loss occurring in the first vibration generator 230 and the second vibration generator 270.

In FIGS. 1 to 4 and related descriptions, the vibration device 200 according to another example embodiment of the present disclosure has been described as including the first and second vibration generators 230 and 270, but embodiments of the present disclosure are not limited thereto. For example, the vibration device 200 according to another example embodiment of the present disclosure may include a plurality of (for example, three or more) vibration generators. Even in this case, the plurality of vibration generators may have the same size as one another and may overlap one another to maximize or increase a displacement amount or an amplitude displacement of the vibration device 200. Also, the respective first portions (e.g., 231a, 271a) of the vibration parts (e.g., 231, 271) of the vibration generators may also overlap and have the same size as a protrusion portion (e.g., 211a, 251a) of one or more connection members (e.g., 210, 250).

Therefore, the display apparatus according to an example embodiment of the present disclosure may minimize the loss of the vibration of the first vibration generator 230 caused by vibration damping of the adhesive layers 213 and 215 of the first connection member 210, thus minimizing the loss of the vibration of the first vibration generator 230 and thereby enhancing a sound pressure level.

Moreover, the first protrusion portions 211a having a higher elastic modulus than each of the first adhesive layers 213 and 215 may be provided to overlap with the first portions 231a of the first vibration part 231. Thus, a vibration generated by the first vibration part 231 may be effectively transferred to the display panel 100, thereby enhancing vibration performance or a vibration characteristic.

Therefore, vibration loss occurring in the first vibration generator 230 may be minimized. Thus, a sound pressure level may be enhanced.

Moreover, the base material 211 of the first connection member 210 and the base material 251 of the second connection member 250 may respectively include the first protrusion portions 211a and the second protrusion portions 251a protruding respectively from a top surface and a bottom surface of the base materials 211 and 251, thus having a relatively greater volume than a connection member structure including no protrusion portion. In this case, the base material 211 of the first connection member 210 and the base material 251 of the second connection member 250 may have a relatively lower coefficient of thermal expansion than the adhesive layers 213 and 215 of the first connection member 210 and the adhesive layers 253 and 255 of the second connection member 250, respectively, thereby enhancing reliability such as a thermal impact.

Figure 5:
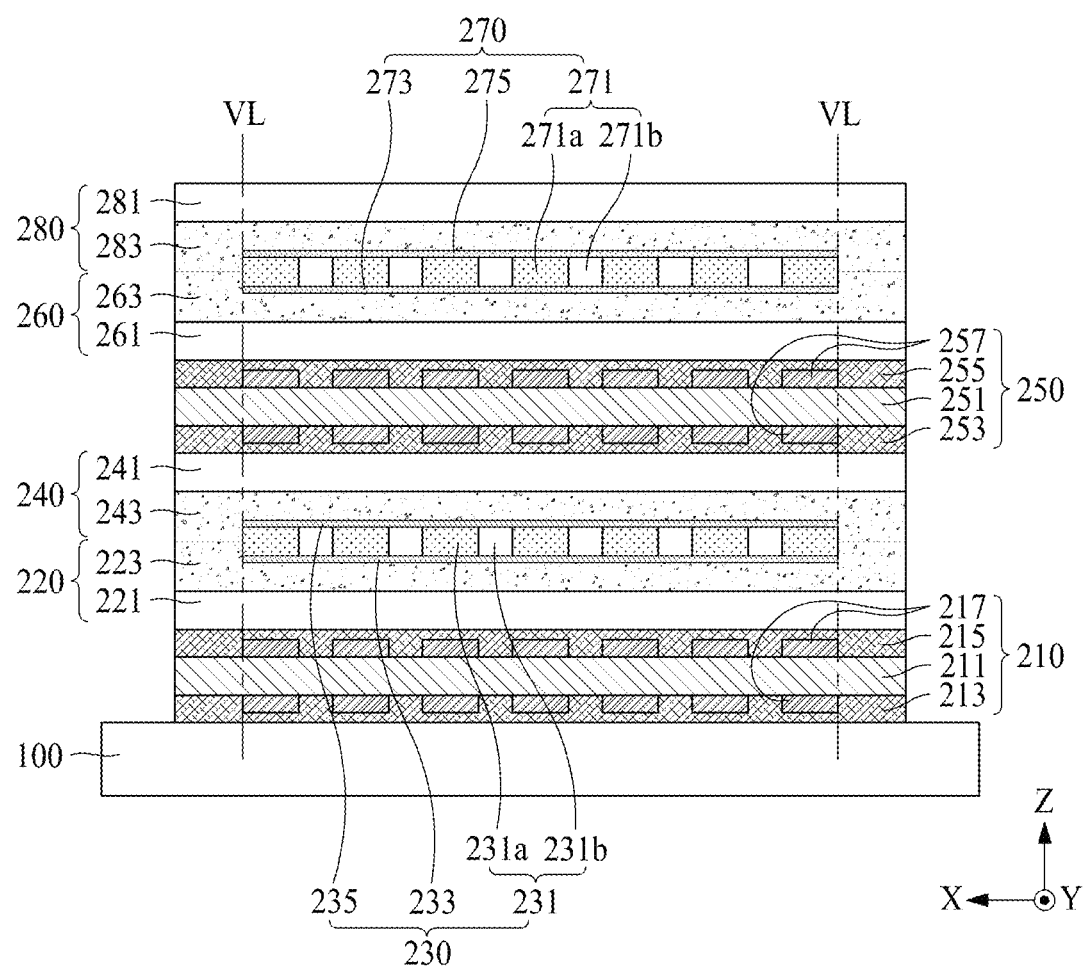
FIGS. 5 to 7 are cross-sectional views illustrating a display apparatus according to example embodiments of the present disclosure.

FIG. 5 is a cross-sectional view illustrating a display apparatus according to another example embodiment of the present disclosure.

As shown in FIG. 5, the display apparatus according to another example embodiment of the present disclosure may include a vibration device 200 disposed at or under a display panel 100. The vibration device 200 may include a first connection member 210, a first vibration generator 230, a second connection member 250, and a second vibration generator 270. In FIG. 5, except for the first and second high modulus members 217 and 257 respectively of the first connection member 210 and the second connection member 250 being added, a structure of the display apparatus according to this example embodiment may be the same as or similar to a structure of FIG. 3. Thus, repeated descriptions are omitted here as detailed descriptions provided above may be referenced.

The first connection member 210 may further include a first high modulus member 217 which is provided to vertically overlap a first portion 231a of a first vibration part 231 and a first portion 271a of a second vibration part 271. The first high modulus member 217 may be the high modulus member of the first connection member 210. The second connection member 250 may further include a second high modulus member 257 which is provided to vertically overlap the first portion 231a of the first vibration part 231 and the first portion 271a of the second vibration part 271. The second high modulus member 257 may be the high modulus member of the second connection member 250.

The high modulus member 217 of the first connection member 210 may be provided to have a dimension corresponding to the first portion 231a of the first vibration part 231 and may be provided to contact a top surface and a bottom surface of a base material 211 of the first connection member 210.

The high modulus member 217 of the first connection member 210 may include the same material as that of the base material 211 of the first connection member 210 or may include ceramic having a higher elastic modulus than the first base material 211. For example, the high modulus member 217 of the first connection member 210 may include one or more of polystyrene (PS), PET, and polyimide, and/or may include one or more of silicon oxide ($SiO_2$) and aluminum oxide ($Al_2O_3$). However, embodiments of the present disclosure are not limited thereto.

In this case, polystyrene may have an elastic modulus of about 3 GPa, $SiO_2$ may have an elastic modulus of about 94 GPa, and $Al_2O_3$ may have an elastic modulus of about 390 GPa.

The high modulus member 257 of the second connection member 250 may be provided to have a dimension corresponding to the first portion 231a of the first vibration part 231 and the first portion 271a of the second vibration part 271 and may be provided to contact a top surface and a bottom surface of a base material 251 of the second connection member 250.

The high modulus member 257 of the second connection member 250 may include the same material as that of the base material 251 of the second connection member 250. Alternatively, the high modulus member 257 of the second connection member 250 may include ceramic having a higher elastic modulus than the base material 251 of the second connection member 250. For example, the high modulus member 257 of the second connection member 250 may include one or more of polystyrene, PET, and polyimide, and/or one or more of $SiO_2$ and $Al_2O_3$. However, embodiments of the present disclosure are not limited thereto.

In this case, polystyrene may have an elastic modulus of about 3 GPa, $SiO_2$ may have an elastic modulus of about 94 GPa, and $Al_2O_3$ may have an elastic modulus of about 390 GPa.

Figure 6:
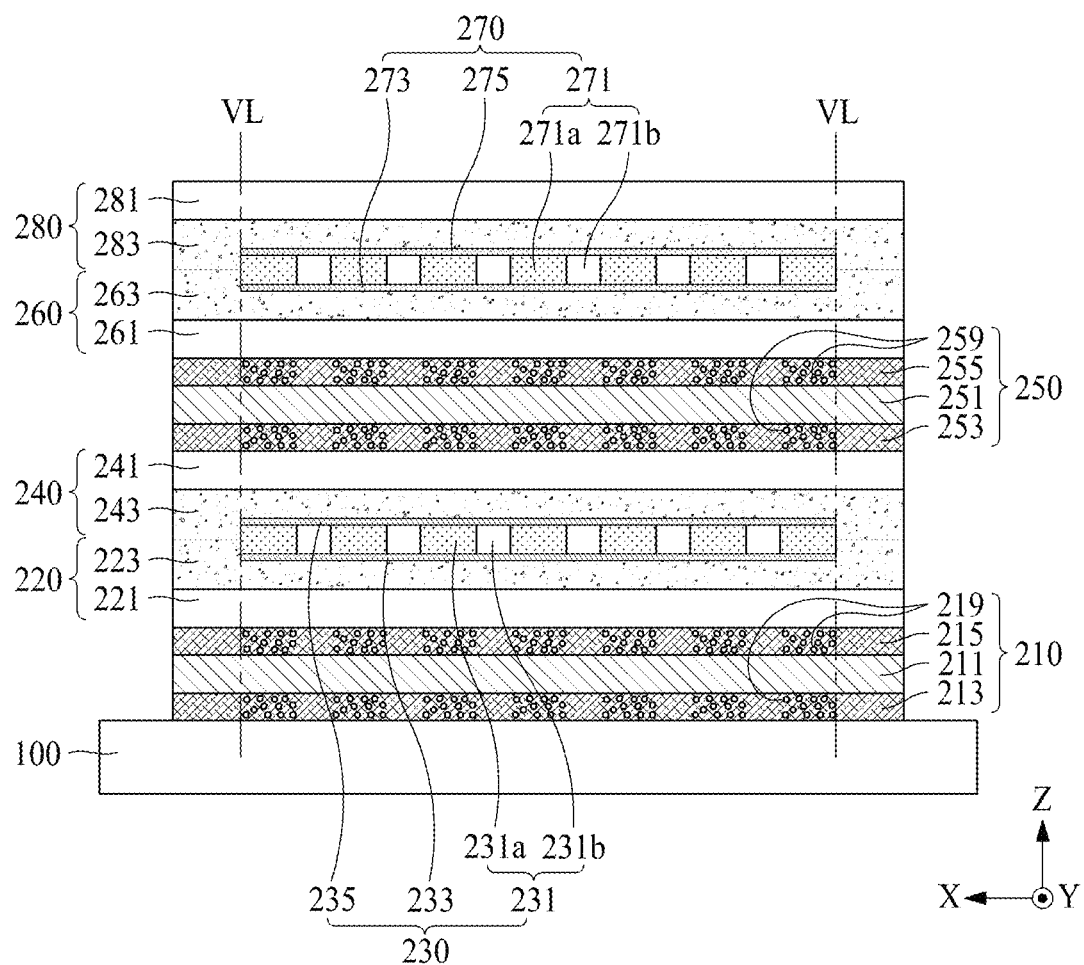

FIG. 6 is a cross-sectional view illustrating a display apparatus according to another example embodiment of the present disclosure.

As shown in FIG. 6, the display apparatus according to another example embodiment of the present disclosure may include a vibration device 200 disposed at or under a display panel 100. The vibration device 200 may include a first connection member 210, a first vibration generator 230, a second connection member 250, and a second vibration generator 270. In FIG. 6, except for the first and second high modulus fillers 219 and 259 respectively of the first connection member 210 and the second connection member 250 being added, a structure of the display apparatus according to this example embodiment of the present disclosure may be the same as or similar to the structure of FIG. 3. Thus, repeated descriptions are omitted here as detailed descriptions provided above may be referenced.

The first connection member 210 may further include a first high modulus filler 219 which is provided to vertically overlap a first portion 231a of a first vibration part 231 and a first portion 271a of a second vibration part 271. The second connection member 250 may further include a second high modulus filler 259 which is provided to vertically overlap the first portion 231a of the first vibration part 231 and the first portion 271a of the second vibration part 271.

The first high modulus filler 219 of the first connection member 210 may be provided to have a dimension corresponding to the first portion 231a of the first vibration part 231 and may be provided to contact a top surface (or an upper surface) and a bottom surface (or the lower surface) of a first base material 211 of the first connection member 210.

The first high modulus filler 219 of the first connection member 210 may include the same material as that of the first base material 211 of the first connection member 210 or may include ceramic having a higher elastic modulus than the first base material 211. For example, the first high modulus filler 219 of the first connection member 210 may include one or more of polystyrene, PET, and polyimide, and/or one or more of $SiO_2$ and $Al_2O_3$. However, embodiments of the present disclosure are not limited thereto.

Figure 7:
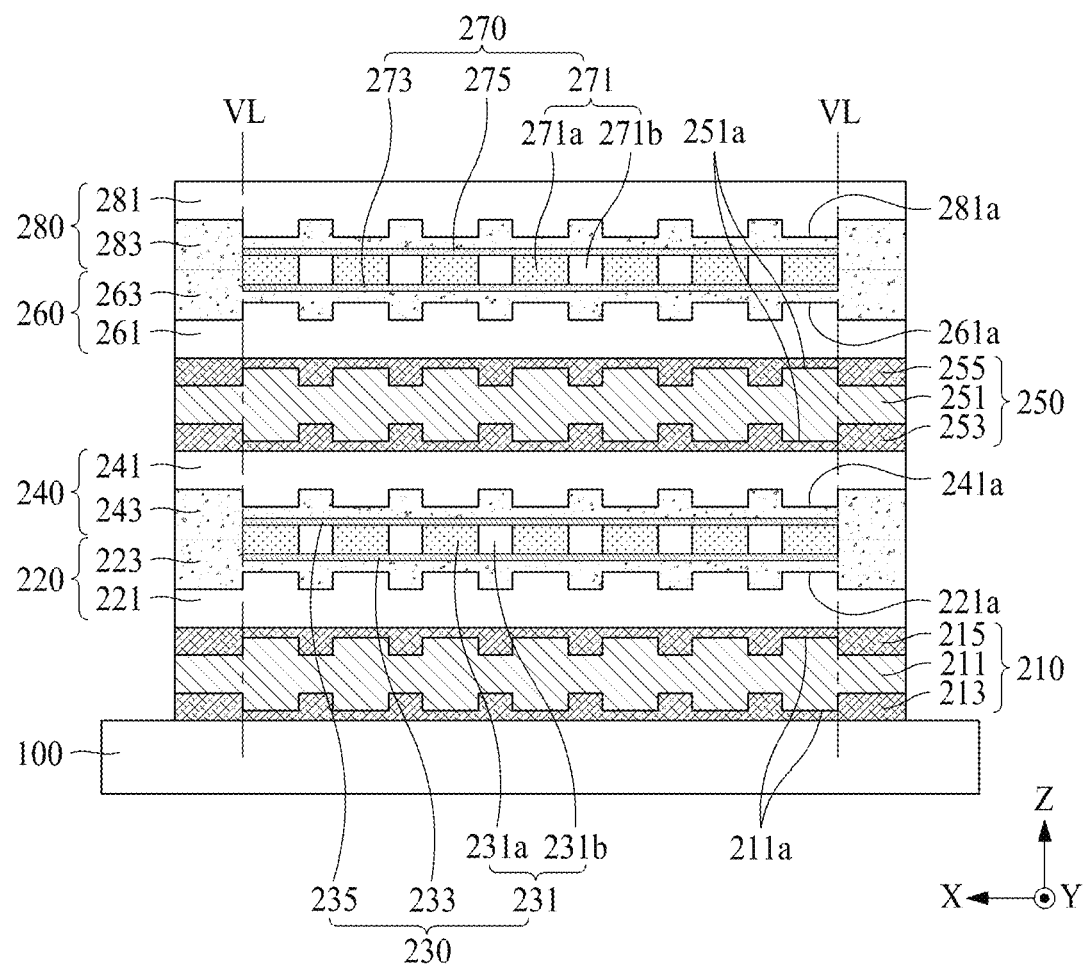
Figure 8:
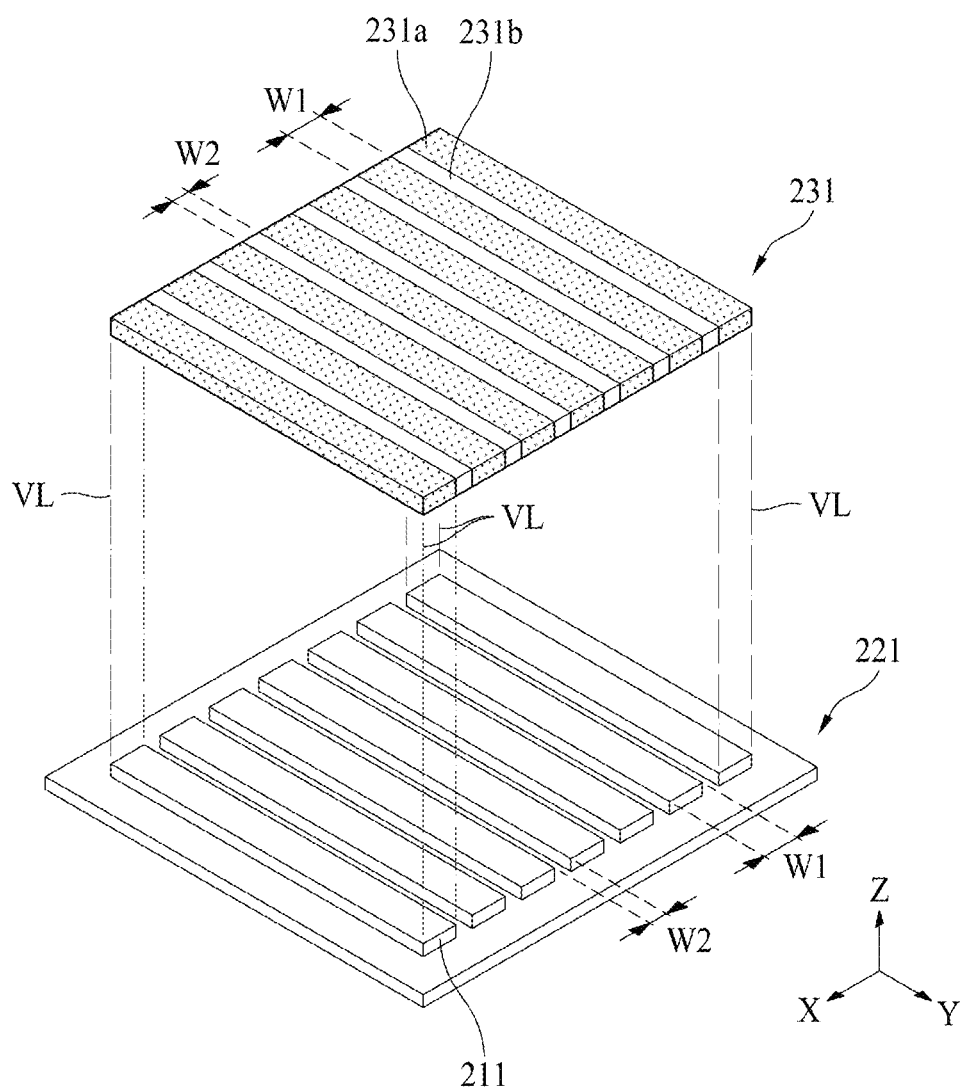
FIG. 8 is a perspective view illustrating a connection relationship between a base material of a first protection member and a vibration part of FIG. 7.

FIG. 7 is a cross-sectional view illustrating a display apparatus according to another example embodiment of the present disclosure. FIG. 8 is a perspective view illustrating a connection relationship between a base material of a first protection member and a vibration part of FIG. 7.

As shown in FIGS. 7 and 8, the display apparatus according to another example embodiment of the present disclosure may include a vibration device 200 disposed at or under a display panel 100. The vibration device 200 may include a first connection member 210, a first vibration generator 230, a second connection member 250, and a second vibration generator 270. Also, the vibration device 200 may further include a first protection member 220 and a second protection member 240 which respectively cover a bottom surface (or the lower surface) and a top surface (or an upper surface) of the first vibration generator 230, and a third protection member 260 and a fourth protection member 280 which respectively cover a bottom surface (or the lower surface) and a top surface (or an upper surface) of the second vibration generator 270. In FIG. 7, except for each of first to fourth base materials 221, 241, 261, and 281 respectively of the first protection member 220, the second protection member 240, the third protection member 260, and the fourth protection member 280 further including a protrusion portion, the display apparatus according to this example embodiment of the present disclosure may be the same as or similar to the structure of FIG. 3. Thus, repeated descriptions are omitted here as detailed descriptions provided above may be referenced.

As shown in FIG. 7, in the display apparatus according to another example embodiment of the present disclosure, a base material 221 of the first protection member 220 may further include a first protrusion portion 221a, a second base material 241 of the second protection member 240 may further include a second protrusion portion 241a, a third base material 261 of the third protection member 260 may further include a third protrusion portion 261a, and a fourth base material 281 of the fourth protection member 280 may further include a fourth protrusion portion 281a.

The protrusion portions 221a, 241a, 261a, and 281a respectively provided in the first to the fourth protection members 220, 240, 260, and 280 may include the same material as that of the first to the fourth base materials 221, 241, 261, and 281, respectively.

The protrusion portion 221a of the first protection member 220 and the protrusion portion 241a of the second protection member 240 may be provided at portions opposite to each other with respect to the first vibration generator 230.

Therefore, as illustrated in FIG. 7, the first protrusion portion 221a of the first protection member 220 may be provided to protrude upward from the first base material 221 of the first protection member 220 toward the first vibration generator 230. On the other hand, the second protrusion portion 241a of the second protection member 240 may be provided to protrude downward from the second base material 241 of the second protection member 240 toward the first vibration generator 230.

The third protrusion portion 261a of the third protection member 260 and the fourth protrusion portion 281a of the fourth protection member 280 may be provided at portions opposite to each other with respect to the second vibration generator 270.

Therefore, as illustrated in FIG. 7, the third protrusion portion 261a of the third protection member 260 may be provided to protrude upward from the third base material 261 of the third protection member 260 toward the second vibration generator 270. On the other hand, the fourth protrusion portion 281a of the fourth protection member 280 may be provided to protrude downward from the fourth base material 281 of the fourth protection member 280 toward the second vibration generator 270.

Figure 9:
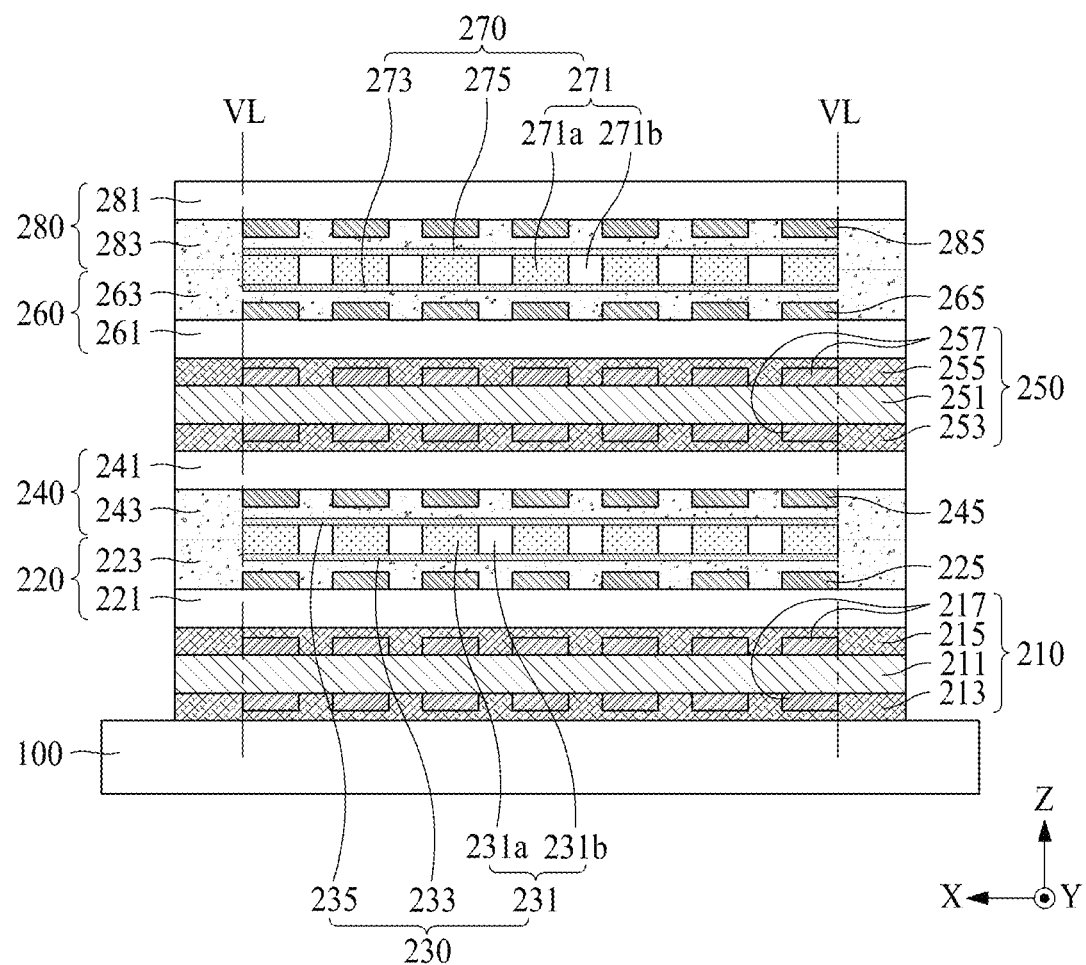
FIGS. 9 to 12 are cross-sectional views illustrating a display apparatus according to example embodiments of the present disclosure.

FIG. 9 is a cross-sectional view illustrating a display apparatus according to another example embodiment of the present disclosure. In FIG. 9, except for each of first to fourth protection members 220, 240, 260, 280 being provided to include a respective high modulus member 225, 245, 265 or 285, a structure of the display apparatus according to this example embodiment of the present disclosure may be the same as or similar to a structure of FIG. 5. Thus, repeated descriptions are omitted here as detailed descriptions provided above may be referenced.

As shown in FIG. 9, in the display apparatus according to another example embodiment of the present disclosure, a first protection member 220 may further include a first protection member high modulus member 225, a second protection member 240 may further include a second protection member high modulus member 245, a third protection member 260 may further include a third protection member high modulus member 265, and a fourth protection member 280 may further include a fourth protection member high modulus member 285.

The high modulus members 225, 245, 265, and 285 respectively provided in the first to the fourth protection members 220, 240, 260, and 280 may include the same material as that of the first to the fourth base materials 221, 241, 261, and 281, respectively, or may include a material having a higher elastic modulus than that of the base materials.

For example, the high modulus members 225, 245, 265, and 285 may include one or more of polystyrene, PET, and polyimide, or may include one or more of $SiO_2$ and $Al_2O_3$. However, embodiments of the present disclosure are not limited thereto.

The high modulus member 225 of the first protection member 220 and the high modulus member 245 of the second protection member 240 may be provided at portions opposite to each other with respect to the first vibration generator 230.

Therefore, as illustrated in FIG. 9, the high modulus member 225 of the first protection member 220 may be provided to protrude upward from the base material 221 of the first protection member 220 toward the first vibration generator 230. On the other hand, the high modulus member 245 of the second protection member 240 may be provided to protrude downward from the base material 241 of the second protection member 240 toward the first vibration generator 230.

The high modulus member 265 of the third protection member 260 and the high modulus member 285 of the fourth protection member 280 may be provided at portions opposite to each other with respect to the second vibration generator 270.

Therefore, as illustrated in FIG. 9, the high modulus member 265 of the third protection member 260 may be provided to protrude upward from the base material 261 of the third protection member 260 toward the second vibration generator 270. On the other hand, the high modulus member 285 of the fourth protection member 280 may be provided to protrude downward from the base material 281 of the fourth protection member 280 toward the second vibration generator 270.

Figure 10:
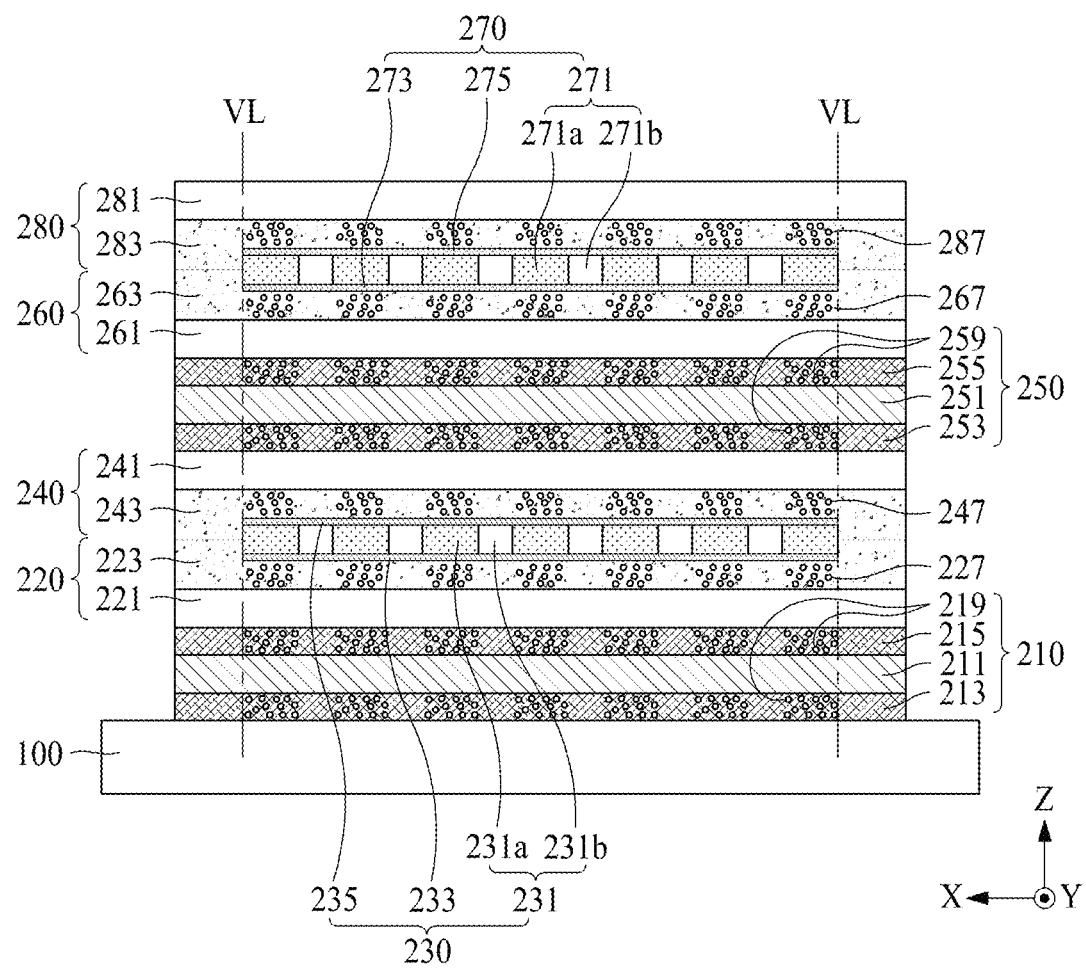

FIG. 10 is a cross-sectional view illustrating a display apparatus according to another example embodiment of the present disclosure. Except for each of the first to the fourth protection members 220, 240, 260, 280 being provided to include a respective high modulus filler 227, 247, 267, or 287, a structure of the example display apparatus of FIG. 10 may be the same as or similar to a structure of FIG. 6. Thus, repeated descriptions are omitted here as detailed descriptions provided above may be referenced.

As shown in FIG. 10, in the display apparatus according to another example embodiment of the present disclosure, a first protection member 220 may further include a first protection member high modulus filler 227, a second protection member 240 may further include a second protection member high modulus filler 247, a third protection member 260 may further include a third protection member high modulus filler 267, and a fourth protection member 280 may further include a fourth protection member high modulus filler 287.

The high modulus fillers 227, 247, 267, and 287 respectively provided in the first to the fourth protection members 220, 240, 260, and 280 may include the same material as that of the first to the fourth base materials 221, 241, 261, and 281, respectively, or may include a material having a higher elastic modulus than that of the base materials.

For example, the high modulus fillers 227, 247, 267, and 287 may include one or more of polystyrene, PET, and polyimide, or may include one or more of $SiO_2$ and $Al_2O_3$. However, embodiments of the present disclosure are not limited thereto.

Figure 11:
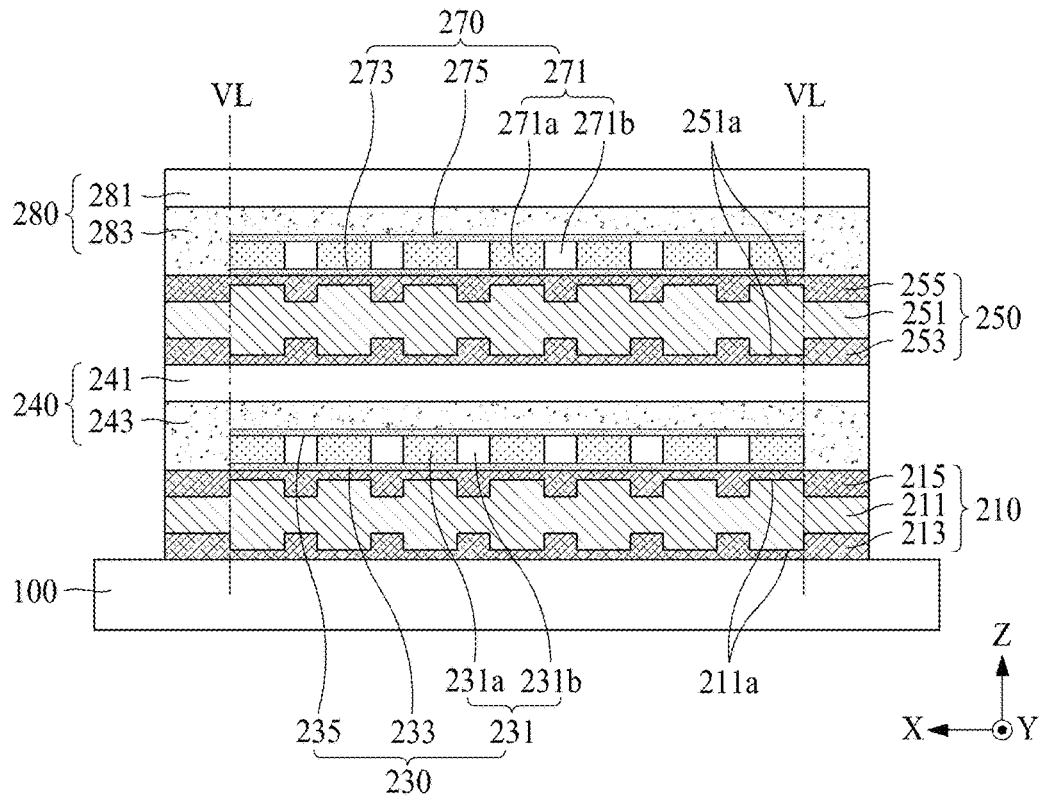

FIG. 11 is a cross-sectional view illustrating a display apparatus according to another example embodiment of the present disclosure. Except for a first protection member 220 and a third protection member 260 (shown, e.g., in FIG. 3) not being provided, a structure of the example display apparatus of FIG. 11 may be the same as or similar to the structure of FIG. 3. Thus, repeated descriptions are omitted here as detailed descriptions provided above may be referenced.

As shown in FIG. 11, in the display apparatus according to another example embodiment of the present disclosure, a first protection member 220 (shown, e.g., in FIG. 3) disposed under a first vibration generator 230 may not be provided, and a first connection member 210 and a first vibration generator 230 may be provided to directly contact each other. Also, a third protection member 260 (shown, e.g., in FIG. 3) disposed under a second vibration generator 270 may not be provided, and a second connection member 250 and a second vibration generator 270 may be provided to directly contact each other.

In the example display apparatus of FIG. 11, a function and a structure of the first protection member 220 may be replaced with the first connection member 210, and a function and a structure of the third protection member 260 may be replaced with the second connection member 250, thereby decreasing a total thickness of a vibration device 200.

Therefore, in the display apparatus according to another example embodiment of the present disclosure, the vibration device 200 having a smaller thickness may be provided. Thus, an increased gap space GS may be provided between the vibration device 200 and a supporting member 300 (shown, e.g., in FIG. 2), thereby enhancing a sound pressure level of the vibration device 200. A variation of a sound pressure level characteristic based on the gap space GS between the vibration device 200 and the supporting member 300 will be described below in more detail with reference to FIGS. 25 and 26.

Figure 12:
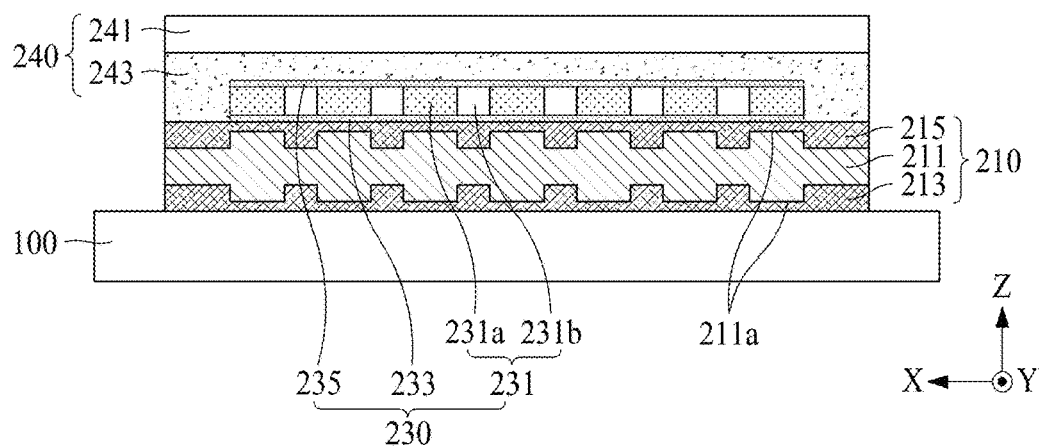

FIG. 12 is a cross-sectional view illustrating a display apparatus according to another example embodiment of the present disclosure. The example display apparatus of FIG. 12 may have a structure where a vibration device 200 is configured with only a single vibration generator, for example, a first vibration generator 230 without a second vibration generator 270 (shown, e.g., in the structure of the example display apparatus of FIG. 11). Therefore, except for the second connection member 250 and a second vibration generator 270 (shown, e.g., in FIG. 11) not being provided, a structure of the example display apparatus of FIG. 12 may be the same as or similar to the structure of FIG. 11. Thus, repeated descriptions are omitted here as detailed descriptions provided above may be referenced.

As shown in FIG. 12, the display apparatus according to another example embodiment of the present disclosure may include a display panel 100, a first vibration generator 230 disposed at or under the display panel 100, a first connection member 210 disposed between the first vibration generator 230 and the display panel 100, and a second protection member 240 disposed to cover an upper portion of the first vibration generator 230.

In the example display apparatus of FIG. 12, a first protection member 220 disposed under a first vibration generator 230 (shown, e.g., in FIG. 3) may not be provided, and a first connection member 210 and a first vibration generator 230 may be provided to directly contact each other. Also, in the example display apparatus of FIG. 12, a function and a structure of the first protection member 220 may be replaced with the first connection member 210, thereby decreasing a total thickness of a vibration device 200.

Therefore, in the display apparatus according to another example embodiment of the present disclosure, the vibration device 200 having a smaller thickness may be provided. Thus, an increased gap space GS may be provided between the vibration device 200 and a supporting member 300 (shown, e.g., in FIG. 2), thereby enhancing a sound pressure level of the vibration device 200. A variation of a sound pressure level characteristic based on the gap space GS between the vibration device 200 and the supporting member 300 will be described below in more detail with reference to FIGS. 25 and 26.

Figure 13:
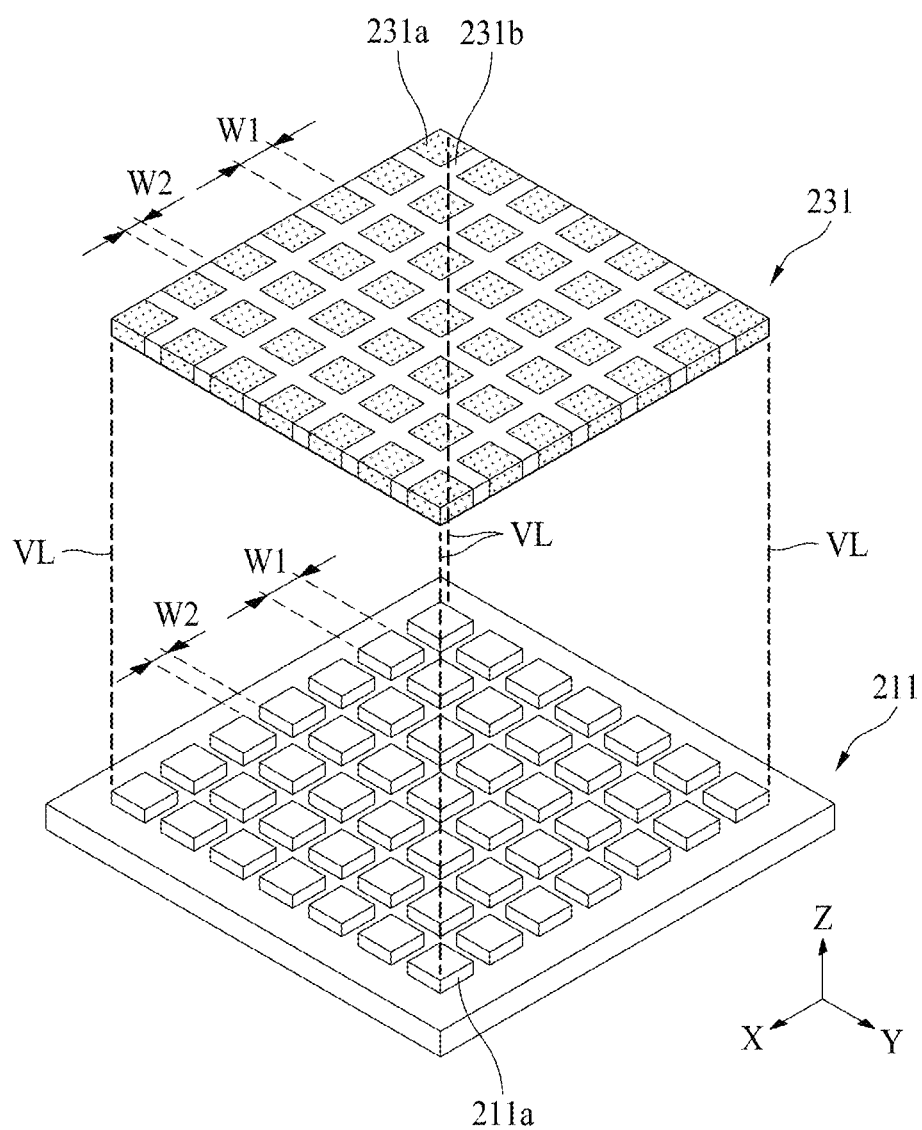
FIGS. 13 and 14 are perspective views illustrating a connection relationship between a base material of a first protection member and a vibration part according to example embodiments of the present disclosure.
Figure 14:
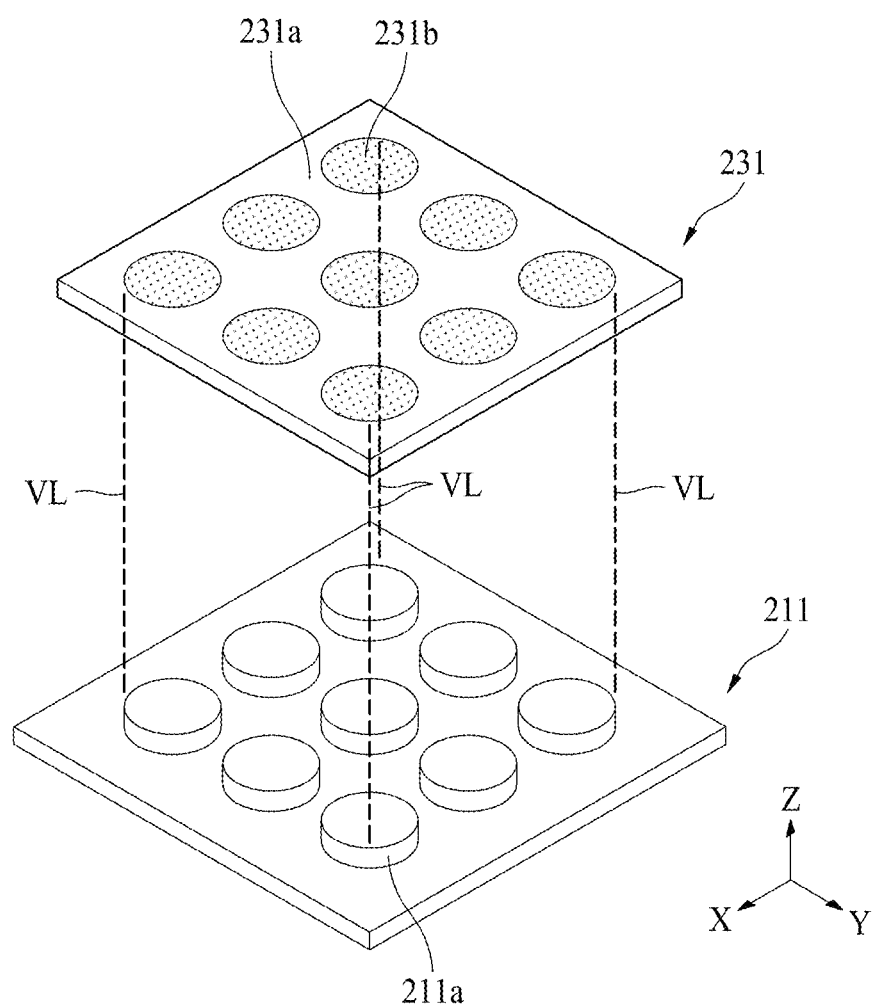

FIGS. 13 and 14 are perspective views illustrating a connection relationship between a first base material 211 of a first protection member 210 and a first vibration part 231 according to another example embodiment of the present disclosure.

As shown in FIGS. 13 and 14, a first vibration part 231 according to another example embodiment of the present disclosure may include a plurality of first portions 231a disposed apart from one another in a first direction X and in a second direction Y and may include a plurality of second portions 231b each provided between two adjacent first portions 231a of the plurality of first portions 231a. In this case, the first portion 231a may be provided in various shapes, such as a square shape, a rectangular shape, an oval shape, and a circular shape.

For example, each of the plurality of first portions 231a according to an example embodiment of the present disclosure may have a pillar structure including a cross-sectional surface having a square shape, a rectangular shape, an oval shape, or a circular shape, but embodiments of the present disclosure are not limited thereto. Each of the plurality of first portions 231a may include a piezoelectric material which is substantially the same as that of the first portion 231a described above with reference to FIGS. 1 to 12. Thus, like reference numerals refer to like elements, and their repeated descriptions are omitted.

The plurality of second portions 231b according to an example embodiment of the present disclosure may be disposed between the plurality of first portions 231a in each of the first direction X and the second direction Y. The second portions 231b may be configured to surround each of the plurality of first portions 231a and thus may be connected to or contact a side surface of each of the plurality of first portions 231a. The plurality of first portions 231a and second portions 231b may be disposed (or arranged) in parallel on the same plane (or the same layer). The second portion 231b may include an organic material which is substantially the same as that of the second portion 231b described above with reference to FIGS. 1 to 12. Thus, like reference numerals refer to like elements, and their repeated descriptions are omitted.

Therefore, the first vibration part 231 of the first vibration generator 230 according to an example embodiment of the present disclosure may be implemented as a vibration source (or a vibrator) having a pillar structure, which includes a 1-3 composite and includes a cross-sectional surface having any of a square shape, a rectangular shape, an oval shape, a circular shape, and other similar shapes. Thus, a vibration characteristic or a sound output characteristic may be enhanced.

Moreover, the description of the first vibration part 231 of the first vibration generator 230 above with reference to FIGS. 13 and 14 may be identically applied to the second vibration part 271 of the second vibration generator 270. Likewise, the above description of the first base material 211 of the first connection member 210 may be identically applied to the second base material 251 of the second connection member 250, as well as to the first to the fourth base materials 221, 241, 261, and 281 respectively of the first to the fourth protection members 220, 240, 260, and 280.

Figure 15:
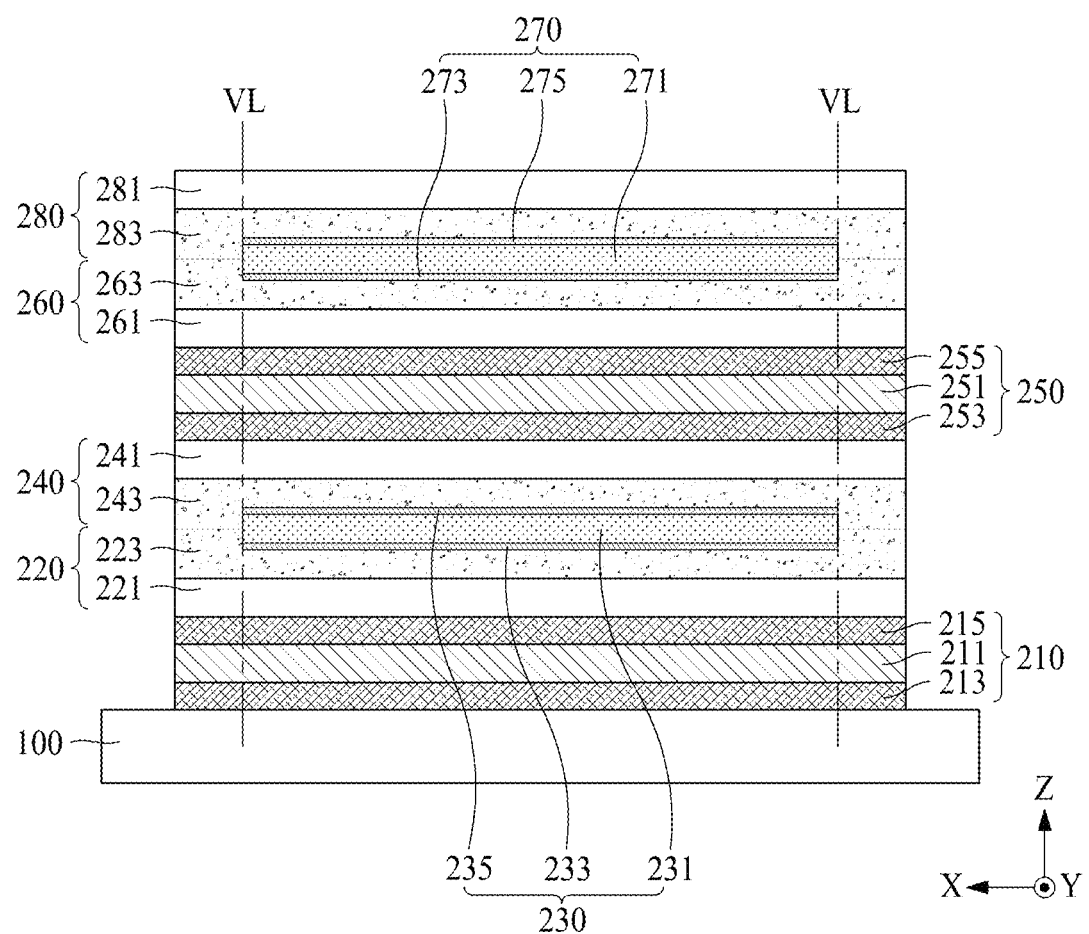
FIGS. 15 to 22 are cross-sectional views illustrating a display apparatus according to example embodiments of the present disclosure.

FIG. 15 is a cross-sectional view illustrating a display apparatus according to another example embodiment of the present disclosure.

As shown in FIG. 15, the display apparatus according to another example embodiment of the present disclosure may include a vibration device 200 disposed at or under a display panel 100. The vibration device 200 may include a first connection member 210, a first vibration generator 230, a second connection member 250, and a second vibration generator 270.

The first vibration generator 230 according to an example embodiment of the present disclosure may include a first vibration part 231 including a piezoelectric material, a first electrode part 233 disposed on a first surface (a bottom surface) of the first vibration part 231, and a second electrode part 235 disposed on a second surface (a top surface), which is opposite to the first surface, of the first vibration part 231.

The first vibration part 231 may include a piezoelectric material. The first vibration part 231 may be referred to with such a term as a vibration layer, a piezoelectric layer, a piezoelectric material layer, an electroactive material, a piezoelectric vibration part, a piezoelectric material portion, an electroactive portion, an inorganic material layer, or an inorganic material portion, but embodiments of the present disclosure are not limited thereto.

The first vibration part 231 may include a transparent piezoelectric material, a semitransparent piezoelectric material, or an opaque piezoelectric material. Thus, the first vibration part 231 may be transparent, semitransparent, or opaque.

The first vibration part 231 may include a material which is substantially the same as that of the first portion 231a of the first vibration part 231 described above with reference to FIGS. 3 and 4. Thus, repeated descriptions are omitted here as detailed descriptions provided above may be referenced.

The second vibration generator 270 according to an example embodiment of the present disclosure may include a second vibration part 271 including a piezoelectric material, a first electrode part 273 disposed on a first surface (a bottom surface) of the second vibration part 271, and a second electrode part 275 disposed on a second surface (a top surface), which is opposite to the first surface, of the second vibration part 271.

Here, configurations of the second vibration part 271, the first electrode part 273, and the second electrode part 275 of the second vibration generator 270 may be the same as or similar to those of the first vibration part 231, the first electrode part 233, and the second electrode part 235 of the first vibration generator 230. Thus, repeated descriptions are omitted here as detailed descriptions provided above may be referenced.

A first connection member 210 may include a first base material 211 and a plurality of first adhesive layers 213 and 215 attached respectively to a bottom surface (or the lower surface) and a top surface (or an upper surface) of the first base material 211. A second connection member 250 may include a second base material 251 and a plurality of second adhesive layers 253 and 255 attached respectively to a bottom surface (or the lower surface) and a top surface (or an upper surface) of the second base material 251.

For example, a first base material 211 of the first connection member 210 and a second base material 251 of the second connection member 250 may each be formed of a polymer film including PET and polyimide, but embodiments of the present disclosure are not limited thereto. An elastic modulus of PET may have a range of 3.5 GPa to 11 GPa, and an elastic modulus of polyimide may have a range of 3.7 GPa to 20 GPa.

For example, the adhesive layers 213 and 215 of the first connection member 210 and the adhesive layers 253 and 255 of the second connection member 250 may include epoxy, acryl, silicone, or urethane, but embodiments of the present disclosure are not limited thereto. For example, the adhesive layers 213 and 215 of the first connection member 210 and the adhesive layers 253 and 255 of the second connection member 250 may include a urethane-based material having a relative lower elastic modulus than acryl among acryl and urethane.

The display apparatus according to another example embodiment of the present disclosure may further include a first protection member 220 and a second protection member 240 which cover a lower portion and an upper portion of the first vibration generator 230, respectively.

The first protection member 220 may be disposed under the first electrode part 233. The first protection member 220 may protect the first electrode part 233. The second protection member 240 may be disposed on the second electrode part 235. The second protection member 240 may protect the second electrode part 235. For example, the first protection member 220 and the second protection member 240 of the first vibration generator 230 may each include a plastic material or a fiber material, but embodiments of the present disclosure not limited thereto. For example, in the first vibration generator 230, the first protection member 220 may include a material which is the same as or different from that of the second protection member 240. One or both of the first protection member 220 and the second protection member 240 of the first vibration generator 230 may be connected or coupled to a rear surface of the display panel 100 via the first connection member 210. For example, the first protection member 220 of the first vibration generator 230 may be connected or coupled to the rear surface of the display panel 100 via the first connection member 210.

The first protection member 220 may include a first base material 221 and a first adhesive layer 223. The first adhesive layer 223 may be provided to be closer to the first vibration generator 230 than the first base material 221. The first adhesive layer 223 of the first protection member 220 may be disposed between the first electrode part 233 of the first vibration generator 230 and the first base material 221 of the first protection member 220.

The second protection member 240 may include a second base material 241 and a second adhesive layer 243. The second adhesive layer 243 may be provided to be closer to the first vibration generator 230 than the second base material 241. The second adhesive layer 243 of the second protection member 240 may be disposed between the second electrode part 235 of the first vibration generator 230 and the base material 241 of the second protection member 240.

Each of the first and second base materials 221 and 241 respectively of the first and second protection members 220 and 240 may be a polyimide film or a PET film, but embodiments of the present disclosure are not limited thereto.

Each of the first and second adhesive layers 223 and 243 respectively of the first and second protection members 220 and 240 may include epoxy resin, acryl resin, silicone resin, or urethane resin, but embodiments of the present disclosure are not limited thereto.

The first adhesive layer 223 of the first protection member 220 and the second adhesive layer 243 of the second protection member 240 may be connected or coupled to each other between the first protection member 220 and the second protection member 240. For example, the first adhesive layer 223 of the first protection member 220 and the second adhesive layer 243 of the second protection member 240 may be connected or coupled to each other at a periphery portion between the first protection member 220 and the second protection member 240. Therefore, the first vibration part 231 of the first vibration generator 230 may be surrounded by the first adhesive layer 223 of the first protection member 220 and the second adhesive layer 243 of the second protection member 240. For example, the first adhesive layer 223 of the first protection member 220 and the second adhesive layer 243 of the second protection member 240 may fully surround the entire first vibration part 231 of the first vibration generator 230. For example, the first adhesive layer 223 of the first protection member 220 and the second adhesive layer 243 of the second protection member 240 may collectively or individually be referred to as a cover member, but embodiments of the present disclosure are not limited thereto. If the first adhesive layer 223 of the first protection member 220 and the second adhesive layer 243 of the second protection member 240 collectively is a cover member, the first protection member 220 may be disposed on a first surface (a bottom surface) of the cover member, and the second protection member 240 may be disposed on a second surface (a top surface) of the cover member.

The display apparatus according to an example embodiment of the present disclosure may further include a third protection member 260 and a fourth protection member 280, which respectively cover a lower portion and an upper portion of the second vibration generator 270.

The third protection member 260 may be disposed under the first electrode part 273 of the second vibration part 271. The third protection member 260 may protect the first electrode part 273 of the second vibration part 271. The fourth protection member 280 may be disposed on the second electrode part 275 of the second vibration part 271. The fourth protection member 280 may protect the second electrode part 275 of the second vibration part 271. For example, the third protection member 260 and the fourth protection member 280 may each include a plastic material or a fiber material, but embodiments of the present disclosure are not limited thereto. For example, the third protection member 260 may include a material which is the same as or different from that of the fourth protection member 280.

The third protection member 260 may include a third base material 261 and a third adhesive layer 263. The third adhesive layer 263 may be provided to be closer to the second vibration generator 270 than the third base material 261. The adhesive layer 263 of the third protection member 260 may be disposed between the first electrode part 273 of the second vibration generator 270 and the base material 261 of the third protection member 260.

The fourth protection member 280 may include a fourth base material 281 and a fourth adhesive layer 283. The fourth adhesive layer 283 may be provided to be closer to the second vibration generator 270 than the fourth base material 281. The adhesive layer 283 of the fourth protection member 280 may be disposed between the second electrode part 275 of the second vibration generator 270 and the base material 281 of the fourth protection member 280.

Each of the base materials 261 and 281 respectively of the third and fourth protection members 260 and 280 may be a polyimide film or a PET film, but embodiments of the present disclosure are not limited thereto.

Each of the adhesive layer 263 of the third protection member 260 and the adhesive layer 283 of the fourth protection member 280 may include epoxy resin, acryl resin, silicone resin, or urethane resin, but embodiments of the present disclosure are not limited thereto.

The adhesive layer 263 of the third protection member 260 and the adhesive layer 283 of the fourth protection member 280 may be connected or coupled to each other between the third protection member 260 and the fourth protection member 280. For example, the adhesive layer 263 of the third protection member 260 and the adhesive layer 283 of the fourth protection member 280 may be connected or coupled to each other at a periphery portion between the third protection member 260 and the fourth protection member 280. Therefore, the second vibration part 271 of the second vibration generator 270 may be surrounded by the adhesive layer 263 of the third protection member 260 and the adhesive layer 283 of the fourth protection member 280. For example, the adhesive layer 263 of the third protection member 260 and the adhesive layer 283 of the fourth protection member 280 may fully surround the entire the second vibration part 271 of the second vibration generator 270. For example, the adhesive layer 263 of the third protection member 260 and the adhesive layer 283 of the fourth protection member 280 may collectively or individually be referred to as a cover member, but embodiments of the present disclosure are not limited thereto. If the adhesive layer 263 of the third protection member 260 and the adhesive layer 283 of the fourth protection member 280 collectively is a cover member, the third protection member 260 may be disposed on a first surface (a bottom surface) of the cover member, and the fourth protection member 280 may be disposed on a second surface (a top surface) of the cover member.

Figure 16:
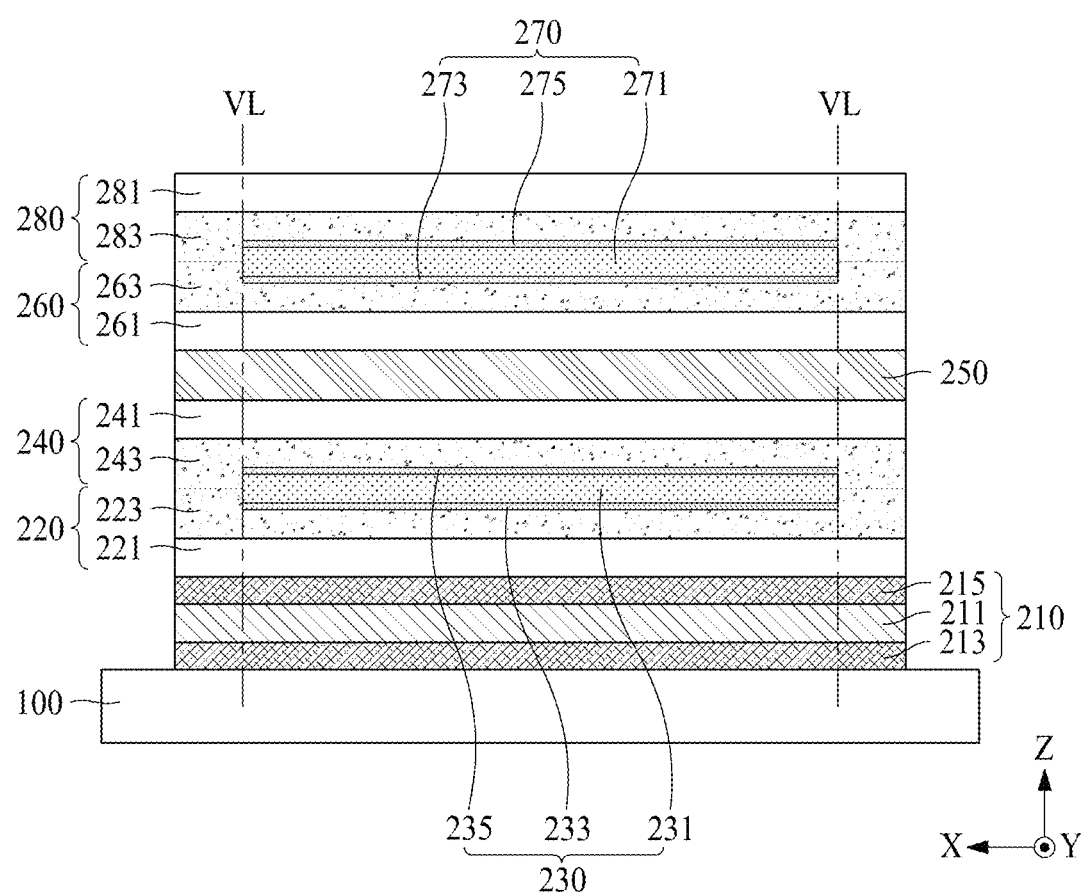

FIG. 16 is a cross-sectional view illustrating a display apparatus according to another example embodiment of the present disclosure. Except for a second connection member 250 being configured as only a single adhesive layer, a structure of the example display apparatus of FIG. 16 may be the same as or similar to the structure of FIG. 15. Thus, repeated descriptions are omitted here as detailed descriptions provided above may be referenced.

As shown in FIG. 16, a second connection member 250 may be implemented in a single layer structure which is configured only as an adhesive layer, instead of being configured with a separate base material and an adhesive layer. In this case, the second connection member 250 may include an adhesive layer having a higher elastic modulus than an adhesive layer 213 or 215 of the first connection member 210 that also includes a separate first base material 211. Also, the single adhesive layer of the second connection member 250 may have a higher elastic modulus than an adhesive layer provided in any of the first to the fourth protection members 220, 240, 260, and 280 that also includes a corresponding one of separate first to fourth base materials 221, 241, 261, and 281.

For example, the second connection member 250 may include epoxy, acryl, silicone, or urethane, but embodiments of the present disclosure are not limited thereto. For example, the second connection member 250 may include epoxy-based resin or polyester-based resin having a relatively high elastic modulus. Here, the epoxy-based resin may have an elastic modulus of about 5.0 GPa, and the polyester-based resin may have an elastic modulus of about 3.3 GPa.

The second connection member 250 in this example embodiment may not be provided with a separate base material and an adhesive layer attached on the base material. Instead, the second connection member 250 here may be configured as a single-layer adhesive layer. Thus, the example display apparatus of FIG. 16 may include a vibration device 200 having a smaller thickness compared to the example display apparatus of FIG. 15.

Figure 17:
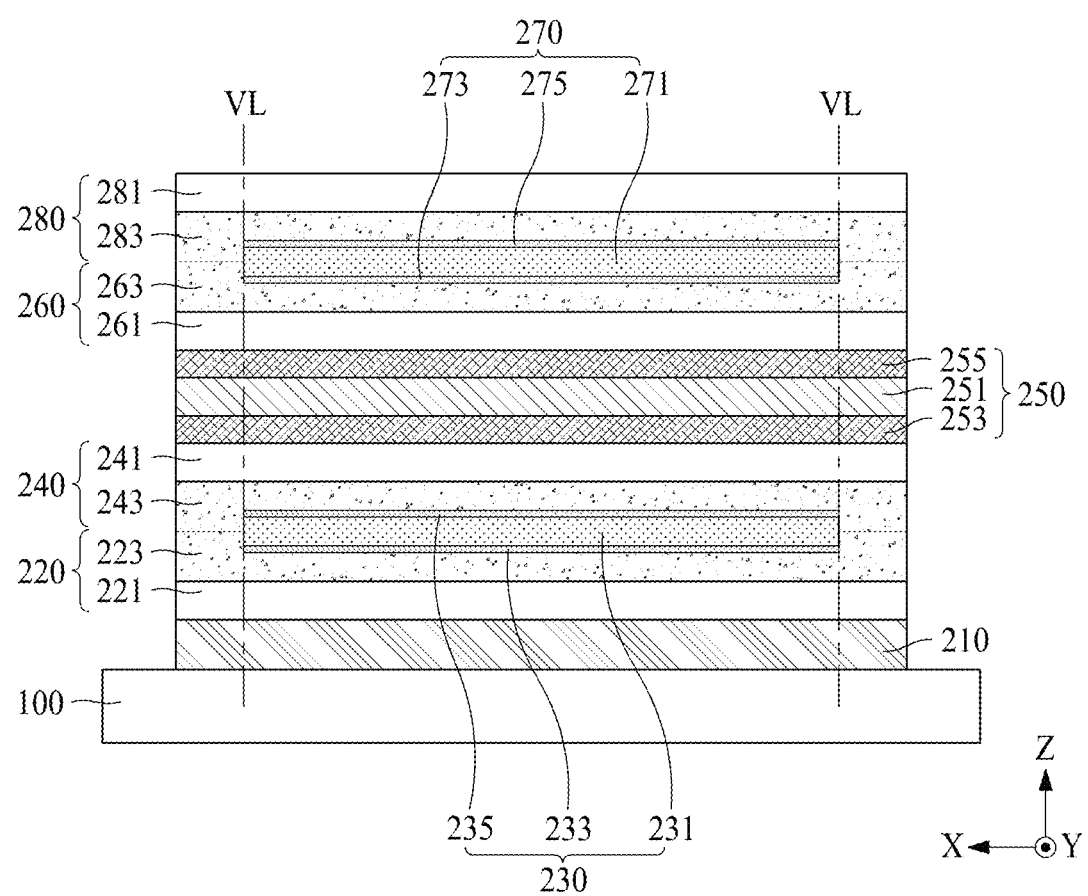

FIG. 17 is a cross-sectional view illustrating a display apparatus according to another example embodiment of the present disclosure. Except for a first connection member 210 being configured as only a single adhesive layer, a structure of the display apparatus of FIG. 17 may be the same as or similar to the structure of FIG. 15. Thus, repeated descriptions are omitted here as detailed descriptions provided above may be referenced.

As shown in FIG. 17, a first connection member 210 may be implemented in a single layer structure which is configured as only an adhesive layer, instead of being configured with a separate base material and an adhesive layer. In this case, the first connection member 210 may include an adhesive layer having a higher elastic modulus than an adhesive layer 253 or 255 of the second connection member 250 that also includes a separate second base material 251. Also, the single adhesive layer of the first connection member 210 may have a higher elastic modulus than an adhesive layer provided in any of the first to the fourth protection members 220, 240, 260, and 280 that also includes a corresponding one of separate first to fourth base materials 221, 241, 261, and 281.

For example, the first connection member 210 may include epoxy, acryl, silicone, or urethane, but embodiments of the present disclosure are not limited thereto. For example, the first connection member 210 may include epoxy-based resin or polyester-based resin having a relatively high elastic modulus. Here, the epoxy-based resin may have an elastic modulus of about 5.0 GPa, and the polyester-based resin may have an elastic modulus of about 3.3 GPa.

The first connection member 210 in this example embodiment may not be provided with a separate base material and an adhesive layer attached on the base material. Instead, the first connection member 210 here may be configured as a single-layer adhesive layer. Thus, the example display apparatus of FIG. 17 may include a vibration device 200 having a smaller thickness compared to the example display apparatus of FIG. 15.

Figure 18:
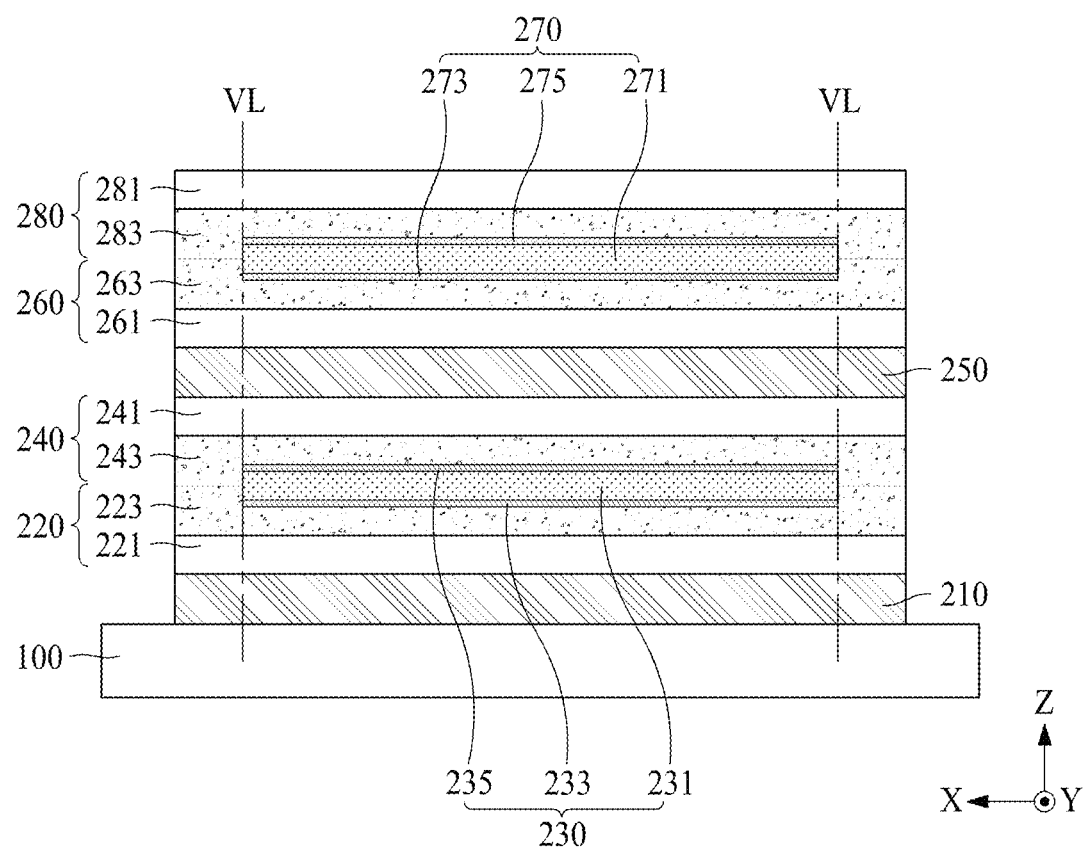

FIG. 18 is a cross-sectional view illustrating a display apparatus according to another example embodiment of the present disclosure. Except for a first connection member 210 and a second connection member 250 each being configured as only a single adhesive layer, a structure of the display apparatus of FIG. 18 may be the same as or similar to the structure of FIG. 15. Thus, repeated descriptions are omitted here as detailed descriptions provided above may be referenced.

As shown in FIG. 18, a first connection member 210 and a second connection member 250 each may be implemented in a single layer structure which is configured as only an adhesive layer, instead of being configured with a separate base material and an adhesive layer. In this case, the first connection member 210 and a second connection member 250 each may include an adhesive layer having a higher elastic modulus than an adhesive layer of any of the first and second connection members 210 and 250 that also includes a separate base material (shown, e.g., in FIG. 15). Also, the single adhesive layer of each of the first and second connection members 210 and 250 may have a higher elastic modulus than an adhesive layer provided in any of the first to the fourth protection members 220, 240, 260, and 280 that also includes a corresponding one of separate first to fourth base materials 221, 241, 261, and 281.

For example, the first connection member 210 and the second connection member 250 each may include epoxy, acryl, silicone, or urethane, but embodiments of the present disclosure are not limited thereto. For example, the first connection member 210 and the second connection member 250 each may include epoxy-based resin or polyester-based resin having a relatively high elastic modulus. Here, the epoxy-based resin may have an elastic modulus of about 5.0 GPa, and the polyester-based resin may have an elastic modulus of about 3.3 GPa.

The first connection member 210 and the second connection member 250 in this example embodiment each may not be provided with a separate base material and an adhesive layer attached on the base material. Instead, the first connection member 210 and the second connection member 250 here may each be configured as a single-layer adhesive layer. Thus, the example display apparatus of FIG. 18 may include a vibration device 200 having a smaller thickness compared to the example display apparatus of FIG. 15.

Figure 19:
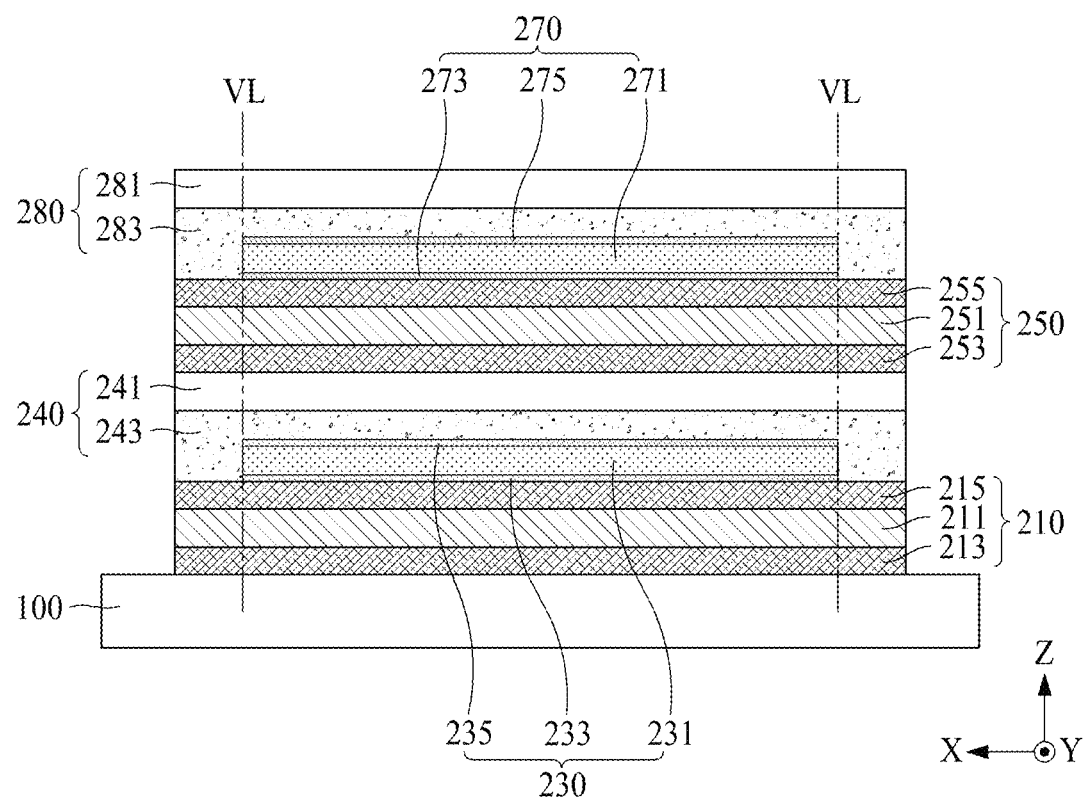

FIG. 19 is a cross-sectional view illustrating a display apparatus according to another example embodiment of the present disclosure. Except for a first protection member 220 and a third protection member 260 (shown, e.g., in FIG. 15) not being provided, a structure of the example display apparatus of FIG. 19 may be the same as or similar to the structure of FIG. 15. Thus, repeated descriptions are omitted here as detailed descriptions provided above may be referenced.

As shown in FIG. 19, in the display apparatus according to another example embodiment of the present disclosure, a first protection member 220 (shown, e.g., in FIG. 15) may not be disposed under a first vibration generator 230, and a first connection member 210 and a first vibration generator 230 may be provided to directly contact each other. Also, a third protection member 260 (shown, e.g., in FIG. 15) may not be disposed under a second vibration generator 270, and a second connection member 250 and a second vibration generator 270 may be provided to directly contact each other.

In the example display apparatus of FIG. 19, a function and a structure of the first protection member 220 may be replaced with the first connection member 210, and a function and a structure of the third protection member 260 may be replaced with the second connection member 250, thereby decreasing a total thickness of a vibration device 200.

Therefore, in the display apparatus according to another example embodiment of the present disclosure, the vibration device 200 having a smaller thickness may be provided. Thus, an increased gap space GS may be provided between the vibration device 200 and a supporting member 300 (shown, e.g., in FIG. 2), thereby enhancing a sound pressure level of the vibration device 200. A variation of a sound pressure level characteristic based on the gap space GS between the vibration device 200 and the supporting member 300 will be described below in more detail with reference to FIGS. 25 and 26.

Figure 20:
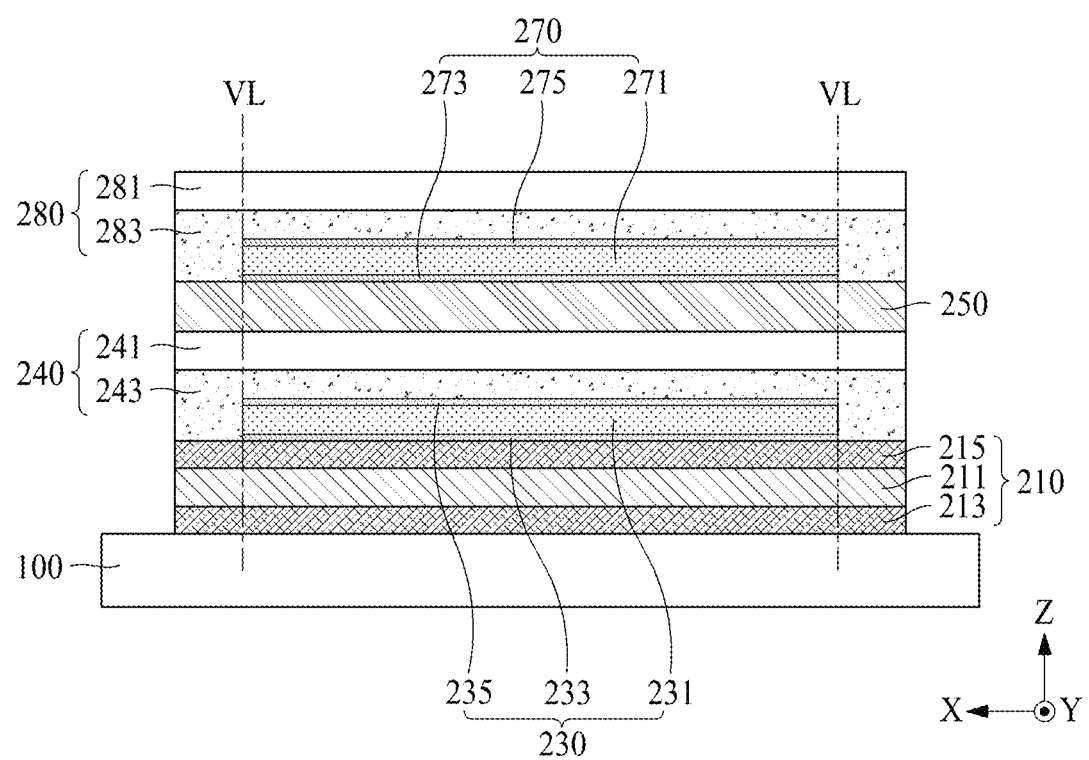

FIG. 20 is a cross-sectional view illustrating a display apparatus according to another example embodiment of the present disclosure. Except for a second connection member 250 being configured as a single adhesive layer without a base material, a structure of the display apparatus of FIG. 20 may be the same as or similar to the structure of FIG. 19. Thus, repeated descriptions are omitted here as detailed descriptions provided above may be referenced.

In the example display apparatus of FIG. 20, a second connection member 250 may be implemented in a single layer structure which is configured only as an adhesive layer, instead of being configured with a separate base material and an adhesive layer. In this case, the second connection member 250 may include an adhesive layer having a higher elastic modulus than an adhesive layer 213 or 215 of the first connection member 210 that also includes a separate first base material 211. Also, the single adhesive layer of the second connection member 250 may have a higher elastic modulus than an adhesive layer provided in any of the first to the fourth protection members 220, 240, 260, and 280 that also includes a corresponding one of separate first to fourth base materials 221, 241, 261, and 281.

For example, the second connection member 250 may include epoxy, acryl, silicone, or urethane, but embodiments of the present disclosure are not limited thereto. For example, the second connection member 250 may include epoxy-based resin or polyester-based resin having a relatively high elastic modulus. Here, the epoxy-based resin may have an elastic modulus of about 5.0 GPa, and the polyester-based resin may have an elastic modulus of about 3.3 GPa.

Figure 21:
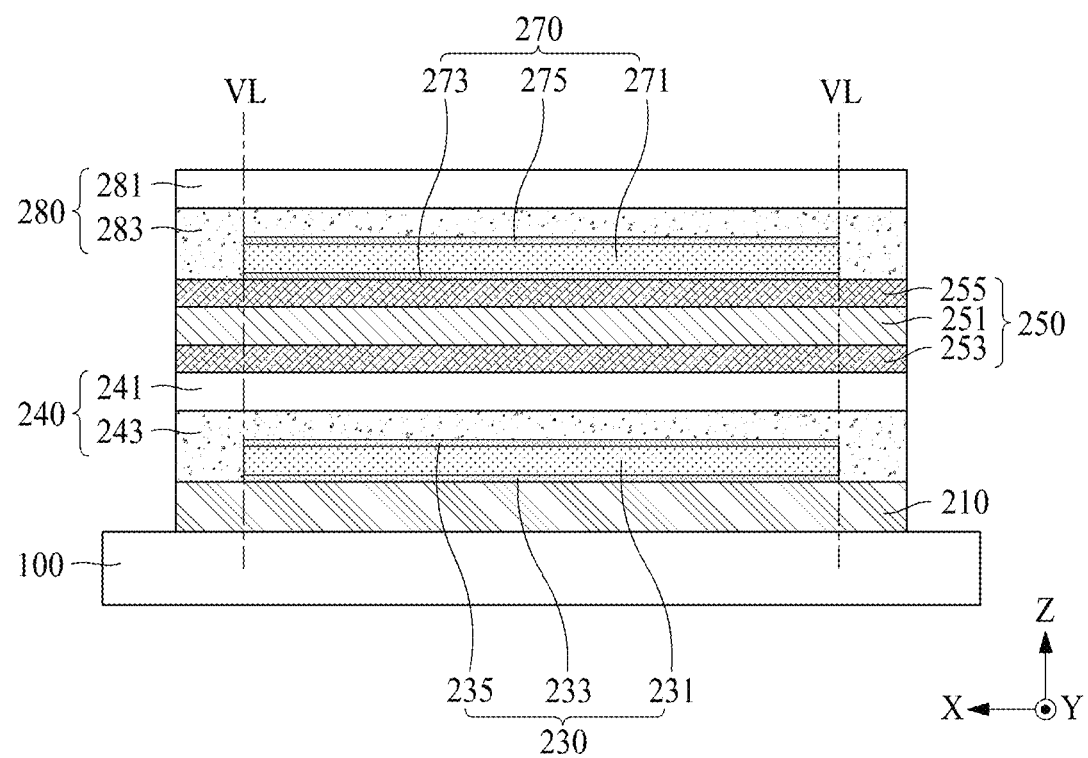

FIG. 21 is a cross-sectional view illustrating a display apparatus according to another example embodiment of the present disclosure. Except for a first connection member 210 being configured as a single adhesive layer without a base material, a structure of the display apparatus of FIG. 21 may be the same as or similar to the structure of FIG. 19. Thus, repeated descriptions are omitted here as detailed descriptions provided above may be referenced.

As shown in FIG. 21, the display apparatus according to another example embodiment of the present disclosure may include a display panel 100, a first vibration generator 230 disposed at or under the display panel 100, a second vibration generator 270 disposed to overlap the first vibration generator 230, a first connection member 210 disposed between the first vibration generator 230 and the display panel 100, and a second connection member 250 disposed between the first vibration generator 230 and the second vibration generator 270.

According to an example embodiment of the present disclosure, the first connection member 210 may be configured as a single-layer adhesive layer including no base material and may be provided to directly contact with the display panel.

As shown in FIG. 21, a first connection member 210 may be implemented in a single layer structure which is configured as only an adhesive layer, instead of being configured with a separate base material and an adhesive layer. In this case, the first connection member 210 may include an adhesive layer having a higher elastic modulus than an adhesive layer 253 or 255 of the second connection member 250 that also includes a separate second base material 251. Also, the single adhesive layer of the first connection member 210 may have a higher elastic modulus than an adhesive layer provided in any of the first to the fourth protection members 220, 240, 260, and 280 that also includes a corresponding one of separate first to fourth base materials 221, 241, 261, and 281.

For example, the first connection member 210 may include epoxy, acryl, silicone, or urethane, but embodiments of the present disclosure are not limited thereto. For example, the first connection member 210 may include epoxy-based resin or polyester-based resin having a relatively high elastic modulus. Here, the epoxy-based resin may have an elastic modulus of about 5.0 GPa, and the polyester-based resin may have an elastic modulus of about 3.3 GPa.

Figure 22:
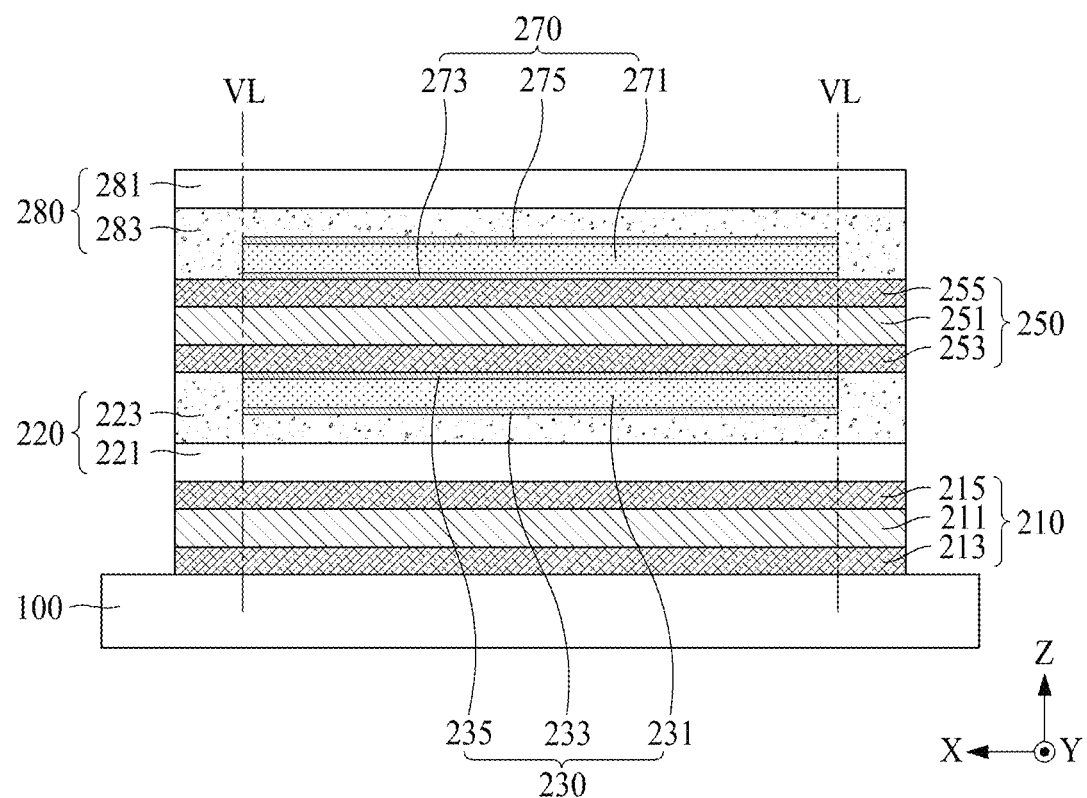

FIG. 22 is a cross-sectional view illustrating a display apparatus according to another example embodiment of the present disclosure. Except for a second protection member 240 and a third protection member 260 (shown, e.g., in FIG. 15) not being provided, a structure of the example display apparatus of FIG. 22 may be the same as or similar to the structure of FIG. 15. Thus, repeated descriptions are omitted here as detailed descriptions provided above may be referenced.

As shown in FIG. 22, the display apparatus according to another example embodiment of the present disclosure may include a display panel 100, a first vibration generator 230 disposed at or under the display panel 100, a second vibration generator 270 disposed to overlap the first vibration generator 230, a first connection member 210 disposed between the first vibration generator 230 and the display panel 100, and a second connection member 250 disposed between the first vibration generator 230 and the second vibration generator 270.

In the example display apparatus of FIG. 22, a second protection member 240 (shown, e.g., in FIG. 15) may not be disposed on the first vibration generator 230, and the second connection member 250 and the first vibration generator 230 may be provided to directly contact each other. Also, a third protection member 260 (shown, e.g., in FIG. 15) may not be disposed under a second vibration generator 270, and a second connection member 250 and a second vibration generator 270 may be provided to directly contact each other.

In the example display apparatus of FIG. 22, a function and a structure of each of the second protection member 240 and the third protection member 260 (shown, e.g., in FIG. 15) may be replaced with the second connection member 250. Since the second protection member 240 and the third protection member 260 are not included in this example structure, a total thickness of a vibration device 200 may be decreased.

Therefore, in the display apparatus according to another example embodiment of the present disclosure shown in FIG. 22, the vibration device 200 having a smaller thickness may be provided. Thus, an increased gap space GS may be provided between the vibration device 200 and a supporting member 300 (shown, e.g., in FIG. 2), thereby enhancing a sound pressure level of the vibration device 200. A variation of a sound pressure level characteristic based on the gap space GS between the vibration device 200 and the supporting member 300 will be described below in more detail with reference to FIGS. 25 and 26.

Figure 23:
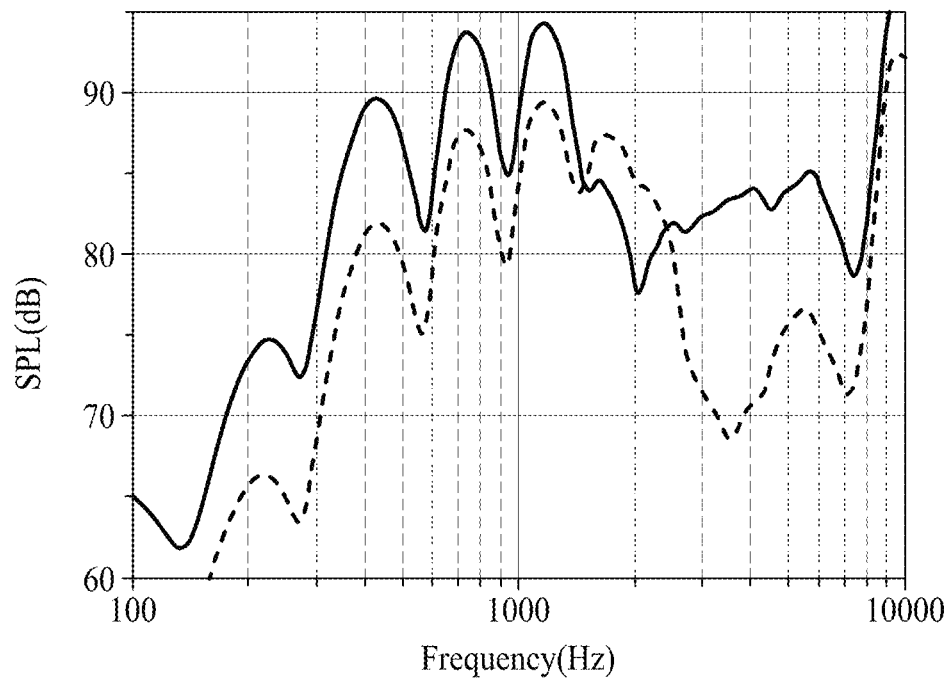
FIG. 23 illustrates a sound output characteristic of an apparatus according to the example embodiments of FIGS. 3 and 15.

FIG. 23 illustrates a sound output characteristic of a display apparatus according to the example embodiments of FIGS. 3 and 15.

A sound output characteristic may be measured by a sound analysis apparatus. The sound analysis apparatus may include a sound card configured to transmit or receive a sound to or from a control personal computer (PC), an amplifier configured to amplify a signal generated from the sound card and to transfer the amplified signal to a vibration device, and a microphone configured to collect a sound generated from a display panel based on driving of the vibration device. The sound collected through the microphone may be input to the control PC through the sound card, and a control program may check the input sound to analyze a sound output characteristic of the vibration device.

To measure a sound output characteristic, a configuration of each example vibration device illustrated in FIGS. 3 and 15 has been applied as-is, and an aluminum substrate was used as a vibration plate in place of a display panel 100. Also, a vibration device 200 with the first vibration generator 230 and the second vibration generator 270 each having a dimension of 6 cm in width and 6 cm in length with respect to a rear surface of the vibration plate was employed. In this case, an input voltage of 5 Vrms was applied to each of the first and second vibration generators 230 and 270, and a sound pressure level SPL was measured within a range of 100 Hz to 10 kHz.

A solid line of FIG. 23 represents a sound output characteristic of an example vibration device including the first connection member 210, the first vibration generator 230, the second connection member 250, and the second vibration generator 270 illustrated in FIG. 3. A dotted line of FIG. 23 represents a sound output characteristic of an example vibration device including the first connection member 210, the first vibration generator 230, the second connection member 250, and the second vibration generator 270 illustrated in FIG. 15. In FIG. 23, the abscissa axis represents a frequency (Hz), and the ordinate axis represents a sound pressure level SPL (dB).

As shown in FIG. 23, compared to the example vibration device illustrated in FIG. 15, the example vibration device illustrated in FIG. 3 may be seen as having a higher sound pressure level in most frequency bands, with the exception of a frequency band around 2,000 Hz. In a range of 150 Hz to 8 kHz, an average sound pressure level of the example vibration device of FIG. 3 was measured to be about 77 dB, and an average sound pressure level of the example vibration device of FIG. 15 was measured to be about 68 dB. With reference to a measurement result of FIG. 23, the first vibration generator 230 may be configured in a 1-3 composite structure including the first portion 231*a* of the first vibration part 231, the second vibration generator 270 may be configured in a 1-3 composite structure including the first portion 271*a* of the second vibration part 271, and the first protrusion portion 211*a* of the first connection member 210 or the second protrusion portion 251*a* of the second connection member 250 may be provided to overlap the first portion 231*a* of the first vibration part 231 and the first portion 271*a* of the second vibration part 271, whereby a sound pressure level characteristic may be enhanced.

Figure 24:
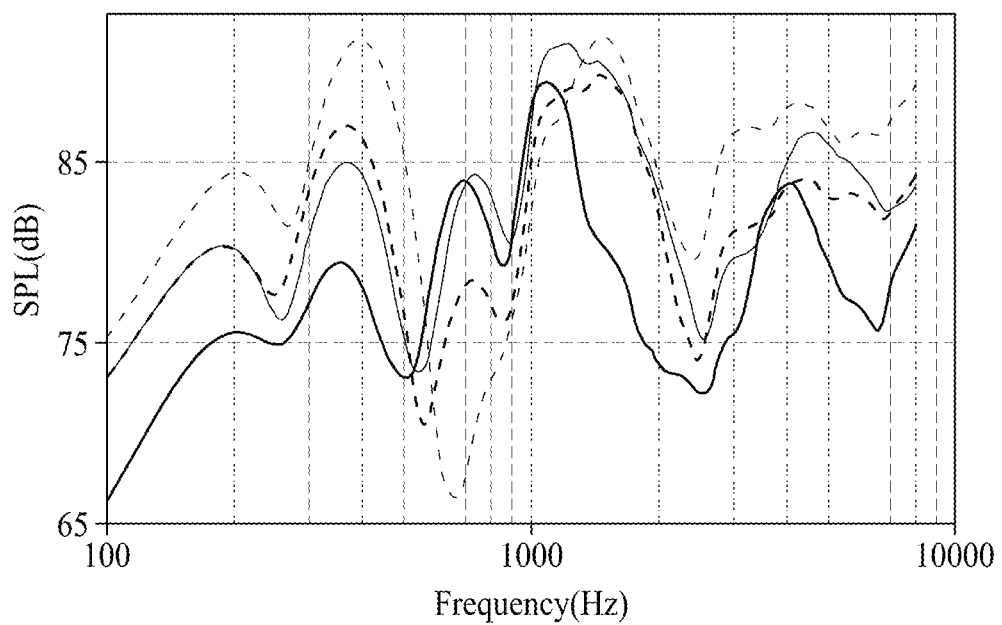
FIG. 24 illustrates a sound output characteristic of an apparatus according to the example embodiments of FIGS. 16 to 19.

FIG. 24 illustrates a sound output characteristic of a display apparatus according to the example embodiments of FIGS. 16 to 19.

A sound output characteristic may be measured by a sound analysis apparatus. The sound analysis apparatus may include a sound card configured to transmit or receive a sound to or from a control personal computer (PC), an amplifier configured to amplify a signal generated from the sound card and to transfer the amplified signal to a vibration device, and a microphone configured to collect a sound generated from a display panel based on driving of the vibration device. The sound collected through the microphone may be input to the control PC through the sound card, and a control program may check the input sound to analyze a sound output characteristic of the vibration device.

To measure a sound output characteristic, a configuration of each example vibration device illustrated in FIGS. 16 to 19 has been applied as-is, and an aluminum substrate was used as a vibration plate in place of a display panel 100. Also, a vibration device 200 with the first vibration generator 230 and the second vibration generator 270 each having a dimension of 6 cm in width and 6 cm in length with respect to a rear surface of the vibration plate was employed. In this case, an input voltage of 5 Vrms was applied to each of the first and second vibration generators 230 and 270, and a sound pressure level SPL was measured within a range of 100 Hz to 10 kHz.

In FIG. 24, a thick solid line represents a sound output characteristic of an example vibration device including the first connection member 210, the first vibration generator 230, the second connection member 250, and the second vibration generator 270 illustrated in FIG. 16. A thin solid line represents a sound output characteristic of an example vibration device including the first connection member 210, the first vibration generator 230, the second connection member 250, and the second vibration generator 270 illustrated in FIG. 17. A thin dotted line represents a sound output characteristic of an example vibration device including the first connection member 210, the first vibration generator 230, the second connection member 250, and the second vibration generator 270 illustrated in FIG. 18. A thick dotted line represents a sound output characteristic of an example vibration device including the first connection member 210, the first vibration generator 230, the second connection member 250, and the second vibration generator 270 illustrated in FIG. 19.

As shown in FIG. 24, in a range of 150 Hz to 8 kHz, an average sound pressure level of the example vibration device of FIG. 16 was measured to be about 78.56 dB, an average sound pressure level of the example vibration device of FIG. 17 was measured to be about 81.57 dB, an average sound pressure level of the example vibration device of FIG. 18 was measured to be about 82.57 dB, and an average sound pressure level of the example vibration device of FIG. 19 was measured to be about 84.28 dB. With reference to a measurement result of FIG. 24, it may be seen that a sound pressure level can be enhanced by using a single adhesive layer having a high elastic modulus for the first connection member 210 or the second connection member 250 in place of a structure having a separate base material and an adhesive layer. It may also be seen that a sound pressure level can be enhanced by removing some of the first to the third protection members 220 to 260 as shown in FIG. 19.

Figure 25:
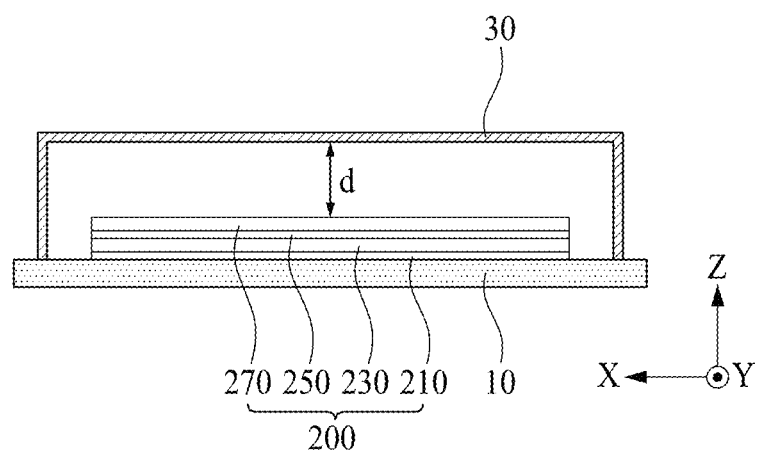
FIG. 25 illustrates a sound pressure level characteristic based on the presence of a supporting member and a distance between the supporting member and a vibration device.
Figure 26:
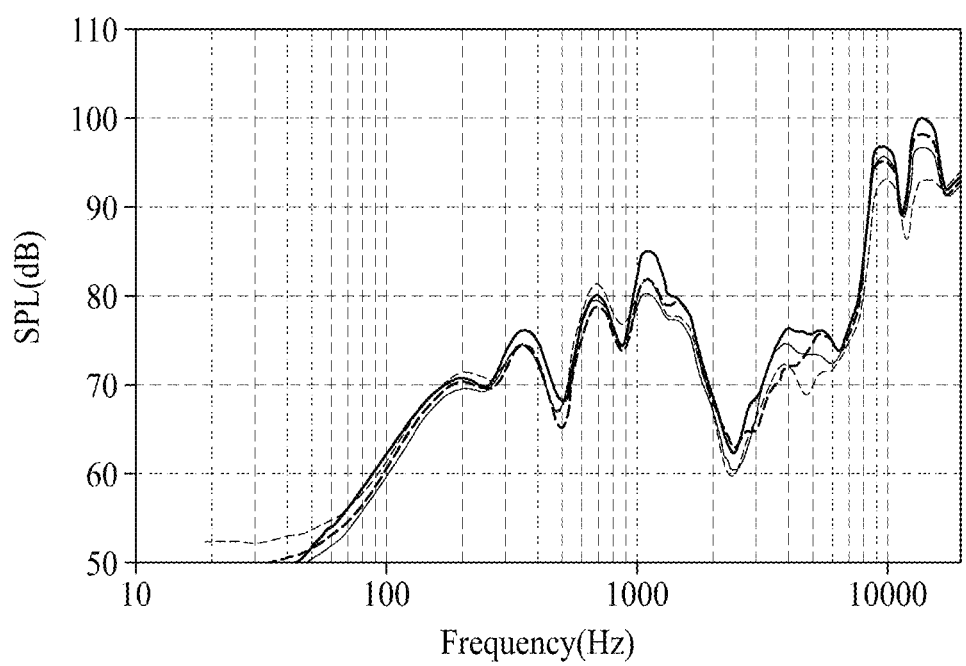
FIG. 26 is a frequency-sound pressure level graph showing a result obtained through measurements performed in an experiment environment of FIG. 25.

FIG. 25 is a diagram for checking a sound pressure level characteristic based on the presence of a supporting member and a distance d between the supporting member and a vibration device. FIG. 26 is a frequency-sound pressure level graph showing a result obtained through measurement performed in an experiment environment of FIG. 25.

A sound output characteristic may be measured by a sound analysis apparatus. The sound analysis apparatus may include a sound card configured to transmit or receive a sound to or from a control PC, an amplifier configured to amplify a signal generated from the sound card and to transfer the amplified signal to a vibration device, and a microphone configured to collect a sound generated from a display panel based on driving of the vibration device. The sound collected through the microphone may be input to the control PC through the sound card, and a control program may check the input sound to analyze a sound output characteristic of the vibration device.

To measure a sound output characteristic, a configuration of the vibration device illustrated in FIG. 15 was implemented on the vibration plate 10 as shown in FIG. 25. Then, a sound pressure level output characteristic was measured with a distance d between the supporting member 30 and the vibration device 200 adjusted to 100, 300, and 1,400 μm, and was also measured with a configuration in which the supporting member 30 is not provided. Also, with a sound pressure level characteristic measured for the configuration without the supporting member 30 (illustrated by a thick solid line) set to 100%, a relative ratio was measured at a percentage of this measurement value.

As shown in FIG. 26, when a distance between the vibration device 200 and the supporting member 30 was set to 100 μm (illustrated by a thick dotted line), a sound pressure level characteristic of about 97.5% was measured. When the distance between the vibration device 200 and the supporting member 300 was set to 300 μm (illustrated by a thin solid line), a sound pressure level characteristic of about 97.8% was measured. Also, when the distance between the vibration device 200 and the supporting member 300 was set to 1,400 μm (illustrated by a thin dotted line), a sound pressure level characteristic of about 98.2% was measured.

With reference to FIG. 26, it may be seen that a sound pressure level characteristic is enhanced as the distance d between the vibration device 200 and the supporting member 300 increases. Accordingly, it may be seen that a sound pressure level characteristic can be enhanced in configurations where a thickness of the vibration device 200 is set to be relatively small, one or more of the first to the third protection members 220 to 260 are selectively removed like the example display apparatuses illustrated in FIGS. 15 to 22, or one or each of the first connection member 210 and the second connection member 250 is configured as a single adhesive layer having a high elastic modulus.

The apparatus according to example embodiments of the present disclosure may be applied to all electronic devices where a display panel is used as a sound vibration plate. For example, the apparatus according to example embodiments of the present disclosure may be applied to mobile apparatuses (e.g., phones and tablets), video phones, smart watches, watch phones, wearable apparatuses, foldable devices, rollable apparatuses, bendable apparatuses, flexible apparatuses, curved apparatuses, portable multimedia players (PMPs), personal digital assistants (PDAs), electronic organizers, desktop personal computers (PCs), laptop PCs, netbook computers, workstations, navigation apparatuses, automotive navigation apparatuses, automotive display apparatuses, televisions (TVs), wall paper display apparatuses, signage apparatuses, game machines, notebook computers, monitors, cameras, camcorders, home appliances, and so on. Also, the vibration device according to example embodiments of the present disclosure may be applied to light emitting diode lighting devices, organic light emitting lighting devices, or inorganic light emitting lighting devices. In cases where the vibration device is applied to a lighting device, the vibration device may function as both lighting and a speaker. Also, in cases where the vibration device according to example embodiments of the present disclosure is applied to a mobile device, the vibration device may function as one or more of a speaker, a receiver, and a haptic device, but embodiments of the present disclosure are not limited thereto. As another example, embodiments of the vibration device according to the present disclosure may be applied to a non-display apparatus or a vibration object instead of a display apparatus. For example, in cases where the vibration device is applied to a non-display apparatus or a vibration object instead of a display apparatus, the vibration device may be a speaker implemented along with a vehicle speaker or lighting, but embodiments of the present disclosure are not limited thereto.

A vibration device and an apparatus according to example embodiments of the present disclosure will be described below.

A vibration device according to an example embodiment of the present disclosure may comprise: a first vibration generator; and a first connection member disposed on a first surface of the first vibration generator, wherein the first vibration generator may comprise a first vibration part including a plurality of inorganic material portions having a piezoelectric characteristic and an organic material portion between the plurality of inorganic material portions.

According to some embodiments of the present disclosure, the first connection member may comprise: a first base material; and at least one first adhesive layer respectively covering at least one of an upper and a lower surface of the first base material.

According to some embodiments of the present disclosure, the first base material may comprise at least one first protrusion portion protruding from at least one of the upper surface and the lower surface of the first base material. Also, the at least one first protrusion portion may overlap with at least one of the plurality of inorganic material portions of the first vibration part.

According to some embodiments of the present disclosure, the first connection member may further comprise at least one first high modulus member provided on at least one of the upper surface and the lower surface of the first base material. Also, the at least one first high modulus member may overlap with at least one of the plurality of inorganic material portions of the first vibration part.

According to some embodiments of the present disclosure, the first connection member may further comprise at least one first high modulus filler disposed at the at least one first adhesive layer. Also, the at least one first high modulus filler may overlap with at least one of the plurality of inorganic material portions of the first vibration part.

According to some embodiments of the present disclosure, the above vibration device may further comprise a protection member on the first surface of the first vibration generator or on a second surface of the first vibration generator opposite to the first surface of the first vibration generator. Here, the first protection member may comprise: a base material; and an adhesive layer between a first surface of the base material and the first vibration generator. The adhesive layer contacts the first vibration generator.

According to some embodiments of the present disclosure, the first base material may comprise at least one first protection member protrusion portion protruding toward the first vibration generator. Also, the at least one first protection member protrusion portion may overlap with at least one of the plurality of inorganic material portions of the first vibration part.

According to some embodiments of the present disclosure, the first protection member may further comprise at least one first protection member high modulus member on the first surface of the first base material. Also, the at least one first protection member high modulus member may overlap with at least one of the plurality of inorganic material portions of the first vibration part.

According to some embodiments of the present disclosure, the first protection member may further comprise at least one first protection member high modulus filler disposed in the first adhesive layer. Also, the at least one first protection member high modulus filler may overlap with at least one of the plurality of inorganic material portions of the first vibration part.

According to some embodiments of the present disclosure, the above vibration device may further comprise: a second connection member on a second surface of the first vibration generator opposite to the first surface of the first vibration generator; and a second vibration generator on the second connection member.

According to some embodiments of the present disclosure, the second connection member may comprise: a second base material; and at least one second adhesive layer respectively covering at least one of a top surface and a bottom surface (or the lower surface) of the second base material.

According to some embodiments of the present disclosure, the second connection member base material may comprise at least one second protrusion portion protruding from at least one of the top surface and the a bottom surface (or the lower surface) of the second base material. Also, the at least one second protrusion portion may overlap with at least one of the plurality of inorganic material portions of the first vibration part.

According to some embodiments of the present disclosure, the second vibration generator may comprise a second vibration part including: a plurality of inorganic material portions having a piezoelectric characteristic; and an organic material portion between the plurality of inorganic material portions of the second vibration part. Here, the plurality of inorganic material portions of the second vibration generator may respectively overlap the plurality of inorganic material portions of the first vibration generator.

An apparatus according to an example of the present disclosure may comprise the above example vibration device and may further comprise a vibration object configured to be vibrated by the vibration device to generate sound.

According to some embodiments of the present disclosure, the vibration object is one of a display panel including a plurality of pixels for displaying an image, a screen panel on which an image is projected from a display apparatus, a lighting panel, a vibration plate, a wood panel, a plastic panel, a glass panel, a cloth panel, an interior material of a vehicle, a glass window of a vehicle, an inner ceiling of a building, a glass window of a building, an interior material of an aircraft, and a glass window of an aircraft.

According to some embodiments of the present disclosure, the above apparatus may further comprise a supporting member disposed on a rear surface of the vibration object, the vibration device being between the supporting member and the vibration object.

A vibration device according to an example embodiment of the present disclosure may comprise: a first vibration generator; a first connection member disposed on a first surface of the first vibration generator; a second connection member disposed on a second surface of the first vibration generator opposite to the first surface of the first vibration generator; and a second vibration generator on the second connection member and overlapping the first vibration generator.

According to some embodiments of the present disclosure, the first connection member may comprise: a base material; a first adhesive layer covering a first surface of the base material; and a second adhesive layer covering a second surface of the base material opposite to the first surface of the base material. Also, the second connection member may be configured as a single adhesive layer.

According to some embodiments of the present disclosure, the second adhesive layer of the first connection member may contact the first vibration generator, and the single adhesive layer of the second connection member may contact the second vibration generator.

According to some embodiments of the present disclosure, the first connection member is configured as a single adhesive layer. Also, the second connection member may comprise: a base material; a first adhesive layer covering a first surface of the base material; and a second adhesive layer covering a second surface of the base material opposite to the first surface of the base material.

According to some embodiments of the present disclosure, the single adhesive layer of the first connection member may contact the first vibration generator, and the second adhesive layer of the second connection member may contact the second vibration generator.

According to some embodiments of the present disclosure, each of the first connection member and the second connection member may be configured as a single adhesive layer.

According to some embodiments of the present disclosure, the single adhesive layer of the first connection member may contact the first vibration generator, and the single adhesive layer of the second connection member may contact the second vibration generator.

According to some embodiments of the present disclosure, each of the first connection member and the second connection member may comprise: a base material; a first adhesive layer covering a first surface of the base material; and a second adhesive layer covering a second surface of the base material opposite to the first surface of the base material.

According to some embodiments of the present disclosure, the second adhesive layer of the first connection member may contact the first vibration generator, and the second adhesive layer of the second connection member may contact the second vibration generator.

An apparatus according to an example of the present disclosure may comprise the above example vibration device and may further comprise a vibration object configured to be vibrated by the vibration device to generate sound.

According to some embodiments of the present disclosure, the vibration object is one of a display panel including a plurality of pixels for displaying an image, a screen panel on which an image is projected from a display apparatus, a lighting panel, a vibration plate, a wood panel, a plastic panel, a glass panel, a cloth panel, an interior material of a vehicle, a glass window of a vehicle, an inner ceiling of a building, a glass window of a building, an interior material of an aircraft, and a glass window of an aircraft.

According to some embodiments of the present disclosure, the above apparatus may further comprise a supporting member disposed on a rear surface of the vibration object, the vibration device being between the supporting member and the vibration object.

The above-described feature, structure, and effect of the present disclosure are included in at least one example embodiment of the present disclosure but are not limited to only one embodiment. Furthermore, the feature, structure, and effect described in at least one example embodiment of the present disclosure may be implemented through combination with or modification of other example embodiments by those skilled in the art. Therefore, contents associated with such combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

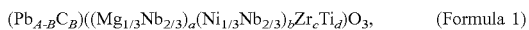

What is claimed is:

1. A vibration device, comprising:
a first vibration generator; and
a protection member at a first surface of the first vibration generator or a second surface of the first vibration generator opposite to the first surface of the first vibration generator,
wherein the first vibration generator comprises a first vibration part including:
a plurality of inorganic material portions having a piezoelectric characteristic; and
an organic material portion between the plurality of inorganic material portions,
wherein the protection member comprises:
a base material; and
an adhesive layer at a first surface of the base material,
wherein the adhesive layer contacts the first vibration generator,
wherein the base material comprises at least one protrusion portion protruding toward the first vibration generator, and
wherein the at least one protrusion portion overlaps with at least one of the plurality of inorganic material portions of the first vibration part.

2. The vibration device of claim 1, further comprising:
a first connection member at the first surface of the first vibration generator;
a second connection member at the second surface of the first vibration generator being opposite to the first surface of the first vibration generator; and
a second vibration generator at the second connection member.

3. The vibration device of claim 2, wherein the second connection member comprises:
a second base material; and
at least one second adhesive layer covering at least one of an upper surface and a lower surface of the second base material.

4. The vibration device of claim 3, wherein the second vibration generator comprises a second vibration part including:
a plurality of inorganic material portions having a piezoelectric characteristic; and
an organic material portion between the plurality of inorganic material portions of the second vibration part, and
wherein the plurality of inorganic material portions of the second vibration generator respectively overlap with the plurality of inorganic material portions of the first vibration generator.

5. The vibration device of claim 4, wherein:
the second base material comprises at least one second protrusion portion protruding from at least one of the upper surface and the lower surface of the second base material; and
the at least one second protrusion portion overlaps with at least one of the plurality of inorganic material portions of the second vibration part.

6. The vibration device of claim 4, wherein:
the second connection member further comprises at least one second high modulus member having a higher elastic modulus than the second base material and provided at at least one of the upper surface and the lower surface of the second base material; and
the at least one second high modulus member overlaps with at least one of the plurality of inorganic material portions of the second vibration part.

7. The vibration device of claim 4, wherein:
the second connection member further comprises at least one second high modulus filler having a higher elastic modulus than the second base material and disposed at the at least one second adhesive layer; and the at least one second high modulus filler overlaps with at least one of the plurality of inorganic material portions of the second vibration part.

8. The vibration device of claim 4, wherein the plurality of inorganic material portions of each of the first vibration generator and the second vibration generator are represented by Formula 1:

$$(Pb_{A-B}C_B)((Mg_{1/3}Nb_{2/3})_a(Ni_{1/3}Nb_{2/3})_bZr_cTi_d)O_3, \quad \text{(Formula 1)}$$

where:
C is one of Ca, Sr, and Ba,
a+b+c+d=1,
0.02≤B≤0.20,
0.80≤A-B≤0.98,
0.05≤a≤0.25,
0.10≤c≤0.50, and
0.10≤d≤0.50.

9. The vibration device of claim 2,
wherein the first connection member comprises:
a base material;
a first adhesive layer covering a first surface of the base material; and
a second adhesive layer covering a second surface of the base material being opposite to the first surface of the base material,
wherein the second connection member is configured as a single adhesive layer, and
wherein the first surface of the first vibration generator is located farther away from the second vibration generator than the second surface of the first vibration generator.

10. The vibration device of claim 9, wherein:
the second adhesive layer of the first connection member contacts the first vibration generator; and
the single adhesive layer of the second connection member contacts the second vibration generator.

11. The vibration device of claim 2,
wherein the first connection member is configured as a single adhesive layer,
wherein the second connection member comprises:
a base material;
a first adhesive layer covering a first surface of the base material; and
a second adhesive layer covering a second surface of the base material is opposite to the first surface of the base material, and
wherein the first surface of the first vibration generator is located farther away from the second vibration generator than the second surface of the first vibration generator.

12. The vibration device of claim 11, wherein:
the single adhesive layer of the first connection member contacts the first vibration generator; and
the second adhesive layer of the second connection member contacts the second vibration generator.

13. The vibration device of claim 2, wherein each of the first connection member and the second connection member comprises:
a base material;
a first adhesive layer covering a first surface of the base material; and
a second adhesive layer covering a second surface of the base material opposite to the first surface of the base material.

14. The vibration device of claim 13, wherein:
the second adhesive layer of the first connection member contacts the first vibration generator; and
the second adhesive layer of the second connection member contacts the second vibration generator.

15. An electronic device comprising the vibration device of claim 1, further comprising a vibration object configured to be vibrated by the vibration device to generate sound.

16. The electronic device of claim 15, wherein the vibration object is one of a display panel including a plurality of pixels configured to display an image, a screen panel on which an image is projected from a display apparatus, a lighting panel, a vibration plate, a wood panel, a plastic panel, a glass panel, a cloth panel, an interior material of a vehicle, a glass window of a vehicle, an inner ceiling of a building, a glass window of a building, an interior material of an aircraft, and a glass window of an aircraft.

17. The electronic device of claim 15, further comprising a supporting member disposed at a rear surface of the vibration object, the vibration device being between the supporting member and the vibration object.

18. A vibration device, comprising:
a first vibration generator; and
a protection member at a first surface of the first vibration generator or a second surface of the first vibration generator opposite to the first surface of the first vibration generator,
wherein the first vibration generator comprises a first vibration part including:
a plurality of inorganic material portions having a piezoelectric characteristic; and
an organic material portion between the plurality of inorganic material portions,
wherein the protection member comprises:
a base material; and
an adhesive layer at a first surface of the base material,
wherein the adhesive layer contacts the first vibration generator,
wherein the protection member comprises at least one high modulus member at the first surface of the base material, and
wherein the at least one high modulus member overlaps with at least one of the plurality of inorganic material portions of the first vibration part.

19. The vibration device of claim 18, further comprising:
a first connection member at the first surface of the first vibration generator;
a second connection member at the second surface of the first vibration generator being opposite to the first surface of the first vibration generator; and
a second vibration generator at the second connection member.

20. The vibration device of claim 19, wherein the second connection member comprises:
a second base material; and
at least one second adhesive layer covering at least one of an upper surface and a lower surface of the second base material.

21. The vibration device of claim 20, wherein the second vibration generator comprises a second vibration part including:
a plurality of inorganic material portions having a piezoelectric characteristic; and
an organic material portion between the plurality of inorganic material portions of the second vibration part, and
wherein the plurality of inorganic material portions of the second vibration generator respectively overlap with the plurality of inorganic material portions of the first vibration generator.

22. The vibration device of claim 21, wherein:
the second base material comprises at least one second protrusion portion protruding from at least one of the upper surface and the lower surface of the second base material; and
the at least one second protrusion portion overlaps with at least one of the plurality of inorganic material portions of the second vibration part.

23. The vibration device of claim 21, wherein:
the second connection member further comprises at least one second high modulus member having a higher elastic modulus than the second base material and provided at at least one of the upper surface and the lower surface of the second base material; and
the at least one second high modulus member overlaps with at least one of the plurality of inorganic material portions of the second vibration part.

24. The vibration device of claim 21, wherein:
the second connection member further comprises at least one second high modulus filler having a higher elastic modulus than the second base material and disposed at the at least one second adhesive layer; and
the at least one second high modulus filler overlaps with at least one of the plurality of inorganic material portions of the second vibration part.

25. The vibration device of claim 21, wherein the plurality of inorganic material portions of each of the first vibration generator and the second vibration generator are represented by Formula 1:

$$(Pb_{A-B}C_B)((Mg_{1/3}Nb_{2/3})_a(Ni_{1/3}Nb_{2/3})_b Zr_c Ti_d)O_3, \quad \text{(Formula 1)}$$

where:
C is one of Ca, Sr, and Ba,
a+b+c+d=1,
0.02≤B≤0.20,
0.80≤A-B≤0.98,
0.05≤a≤0.25,
0.05≤b≤0.25,
0.10≤c≤0.50, and
0.10≤d≤0.50.

26. The vibration device of claim 19,
wherein the first connection member comprises:
a base material;
a first adhesive layer covering a first surface of the base material; and
a second adhesive layer covering a second surface of the base material being opposite to the first surface of the base material,
wherein the second connection member is configured as a single adhesive layer, and
wherein the first surface of the first vibration generator is located farther away from the second vibration generator than the second surface of the first vibration generator.

27. The vibration device of claim 26, wherein:
the second adhesive layer of the first connection member contacts the first vibration generator; and
the single adhesive layer of the second connection member contacts the second vibration generator.

28. The vibration device of claim 19,
wherein the first connection member is configured as a single adhesive layer,
wherein the second connection member comprises:
a base material;
a first adhesive layer covering a first surface of the base material; and
a second adhesive layer covering a second surface of the base material is opposite to the first surface of the base material, and
wherein the first surface of the first vibration generator is located farther away from the second vibration generator than the second surface of the first vibration generator.

29. The vibration device of claim 28, wherein:
the single adhesive layer of the first connection member contacts the first vibration generator; and
the second adhesive layer of the second connection member contacts the second vibration generator.

30. The vibration device of claim 19, wherein each of the first connection member and the second connection member comprises:
a base material;
a first adhesive layer covering a first surface of the base material; and
a second adhesive layer covering a second surface of the base material opposite to the first surface of the base material.

31. The vibration device of claim 30, wherein:
the second adhesive layer of the first connection member contacts the first vibration generator; and
the second adhesive layer of the second connection member contacts the second vibration generator.

32. An electronic device comprising the vibration device of claim 18, further comprising a vibration object configured to be vibrated by the vibration device to generate sound.

33. The electronic device of claim 32, wherein the vibration object is one of a display panel including a plurality of pixels configured to display an image, a screen panel on which an image is projected from a display apparatus, a lighting panel, a vibration plate, a wood panel, a plastic panel, a glass panel, a cloth panel, an interior material of a vehicle, a glass window of a vehicle, an inner ceiling of a building, a glass window of a building, an interior material of an aircraft, and a glass window of an aircraft.

34. The electronic device of claim 32, further comprising a supporting member disposed at a rear surface of the vibration object, the vibration device being between the supporting member and the vibration object.

35. A vibration device, comprising:
a first vibration generator; and
a protection member at a first surface of the first vibration generator or a second surface of the first vibration generator opposite to the first surface of the first vibration generator,
wherein the first vibration generator comprises a first vibration part including:
a plurality of inorganic material portions having a piezoelectric characteristic; and
an organic material portion between the plurality of inorganic material portions,
wherein the protection member comprises:
a base material; and
an adhesive layer at a first surface of the base material,
wherein the adhesive layer contacts the first vibration generator,
wherein the protection member comprises at least one high modulus filler disposed at the adhesive layer, and
wherein the at least one high modulus filler overlaps with at least one of the plurality of inorganic material portions of the first vibration part.

36. The vibration device of claim 35, further comprising:
a first connection member at the first surface of the first vibration generator;

a second connection member at the second surface of the first vibration generator being opposite to the first surface of the first vibration generator; and
a second vibration generator at the second connection member.

37. The vibration device of claim 36, wherein the second connection member comprises:
a second base material; and
at least one second adhesive layer covering at least one of an upper surface and a lower surface of the second base material.

38. The vibration device of claim 37, wherein the second vibration generator comprises a second vibration part including:
a plurality of inorganic material portions having a piezoelectric characteristic; and
an organic material portion between the plurality of inorganic material portions of the second vibration part, and
wherein the plurality of inorganic material portions of the second vibration generator respectively overlap with the plurality of inorganic material portions of the first vibration generator.

39. The vibration device of claim 38, wherein:
the second base material comprises at least one second protrusion portion protruding from at least one of the upper surface and the lower surface of the second base material; and
the at least one second protrusion portion overlaps with at least one of the plurality of inorganic material portions of the second vibration part.

40. The vibration device of claim 38, wherein:
the second connection member further comprises at least one second high modulus member having a higher elastic modulus than the second base material and provided at at least one of the upper surface and the lower surface of the second base material; and
the at least one second high modulus member overlaps with at least one of the plurality of inorganic material portions of the second vibration part.

41. The vibration device of claim 38, wherein:
the second connection member further comprises at least one second high modulus filler having a higher elastic modulus than the second base material and disposed at the at least one second adhesive layer; and
the at least one second high modulus filler overlaps with at least one of the plurality of inorganic material portions of the second vibration part.

42. The vibration device of claim 38, wherein the plurality of inorganic material portions of each of the first vibration generator and the second vibration generator are represented by Formula 1:

$$(Pb_{A-B}C_B)((Mg_{1/3}Nb_{2/3})_a(Ni_{1/3}Nb_{2/3})_bZr_cTi_d)O_3, \quad \text{(Formula 1)}$$

where:
C is one of Ca, Sr, and Ba,
$a+b+c+d=1$,
$0.02 \leq B \leq 0.20$,
$0.80 \leq A-B \leq 0.98$,
$0.05 \leq a \leq 0.25$,
$0.05 \leq b \leq 0.25$,
$0.10 \leq c \leq 0.50$, and
$0.10 \leq d \leq 0.50$.

43. The vibration device of claim 36,
wherein the first connection member comprises:
a base material;
a first adhesive layer covering a first surface of the base material; and
a second adhesive layer covering a second surface of the base material being opposite to the first surface of the base material,
wherein the second connection member is configured as a single adhesive layer, and
wherein the first surface of the first vibration generator is located farther away from the second vibration generator than the second surface of the first vibration generator.

44. The vibration device of claim 43, wherein:
the second adhesive layer of the first connection member contacts the first vibration generator; and
the single adhesive layer of the second connection member contacts the second vibration generator.

45. The vibration device of claim 36,
wherein the first connection member is configured as a single adhesive layer,
wherein the second connection member comprises:
a base material;
a first adhesive layer covering a first surface of the base material; and
a second adhesive layer covering a second surface of the base material is opposite to the first surface of the base material, and
wherein the first surface of the first vibration generator is located farther away from the second vibration generator than the second surface of the first vibration generator.

46. The vibration device of claim 45, wherein:
the single adhesive layer of the first connection member contacts the first vibration generator; and
the second adhesive layer of the second connection member contacts the second vibration generator.

47. The vibration device of claim 36, wherein each of the first connection member and the second connection member comprises:
a base material;
a first adhesive layer covering a first surface of the base material; and
a second adhesive layer covering a second surface of the base material opposite to the first surface of the base material.

48. The vibration device of claim 47, wherein:
the second adhesive layer of the first connection member contacts the first vibration generator; and
the second adhesive layer of the second connection member contacts the second vibration generator.

49. An electronic device comprising the vibration device of claim 35, further comprising a vibration object configured to be vibrated by the vibration device to generate sound.

50. The electronic device of claim 49, wherein the vibration object is one of a display panel including a plurality of pixels configured to display an image, a screen panel on which an image is projected from a display apparatus, a lighting panel, a vibration plate, a wood panel, a plastic panel, a glass panel, a cloth panel, an interior material of a vehicle, a glass window of a vehicle, an inner ceiling of a building, a glass window of a building, an interior material of an aircraft, and a glass window of an aircraft.

51. The electronic device of claim 49, further comprising a supporting member disposed at a rear surface of the vibration object, the vibration device being between the supporting member and the vibration object.